(12) United States Patent
Kunitake et al.

(10) Patent No.: US 12,009,432 B2
(45) Date of Patent: Jun. 11, 2024

(54) TRANSISTOR AND DISPLAY DEVICE

(71) Applicant: Semiconductor Energy Laboratory Co., Ltd., Atsugi (JP)

(72) Inventors: Hitoshi Kunitake, Isehara (JP); Yasuhiro Jinbo, Isehara (JP); Naoki Okuno, Yamato (JP); Masahiro Takahashi, Atsugi (JP); Tomonori Nakayama, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 193 days.

(21) Appl. No.: 17/679,413

(22) Filed: Feb. 24, 2022

(65) Prior Publication Data
US 2022/0285560 A1 Sep. 8, 2022

(30) Foreign Application Priority Data

Mar. 5, 2021 (JP) ................................ 2021-035525
May 12, 2021 (JP) ................................ 2021-080946
Sep. 30, 2021 (JP) ................................ 2021-161151

(51) Int. Cl.
*H01L 29/786* (2006.01)
*G09G 3/32* (2016.01)

(52) U.S. Cl.
CPC ......... *H01L 29/78603* (2013.01); *G09G 3/32* (2013.01); *H01L 29/78681* (2013.01); *G09G 2300/0426* (2013.01)

(58) Field of Classification Search
CPC ............ G09G 3/32; G09G 2300/0426; G09G 2300/0417; G09G 3/3233;

(Continued)

(56) References Cited

U.S. PATENT DOCUMENTS 7,601,984 B2   10/2009   Sano et al.
8,551,824 B2   10/2013   Yamazaki et al.
(Continued)

FOREIGN PATENT DOCUMENTS

JP   2006-165529 A   6/2006
JP   2007-096055 A   4/2007
(Continued)

OTHER PUBLICATIONS

Ryu.B et al., "O-vacancy as the origin of negative bias illumination stress instability in amorphous In—Ga—Zn—O thin film transistors", Appl. Phys. Lett. (Applied Physics Letters), 2010, vol. 97, No. 2, pp. 022108-1-022108-3.

(Continued)

*Primary Examiner* — Muhammad N Edun
(74) *Attorney, Agent, or Firm* — Eric J. Robinson, Robinson Intellectual Property Law Office, P.C.

(57) ABSTRACT

A transistor whose characteristic degradation due to stray light is small is provided. The transistor includes a first insulator, a second insulator over the first insulator, a metal oxide over the second insulator, a first and a second conductor over the metal oxide, a third insulator over the first insulator, the second insulator, the metal oxide, the first conductor, and the second conductor, a fourth insulator over the metal oxide, a fifth insulator over the fourth insulator, and a third conductor over the fifth insulator. The third insulator has an opening to overlap with a region between the first conductor and the second conductor. The fourth insulator, the fifth insulator, and the third conductor are positioned in the opening. The metal oxide has a bandgap greater than or equal to 3.3 eV. The transistor has $V_{sh}$ higher than or equal to −0.3 V.

9 Claims, 37 Drawing Sheets

(58) Field of Classification Search
CPC ...... G09G 2300/0842; H01L 29/78603; H01L 29/7869; H01L 29/78681; H01L 29/78648; H01L 27/1207
See application file for complete search history.

(56) References Cited

U.S. PATENT DOCUMENTS

| | | | |
|---|---|---|---|
| 9,082,858 | B2 | 7/2015 | Tsubuku et al. |
| 9,224,339 | B2 | 12/2015 | Yamazaki et al. |
| 9,508,856 | B2 | 11/2016 | Tao et al. |
| 9,564,534 | B2 | 2/2017 | Tsubuku et al. |
| 10,290,656 | B2 | 5/2019 | Koezuka et al. |
| 2009/0179199 | A1 | 7/2009 | Sano et al. |
| 2010/0123130 | A1 | 5/2010 | Akimoto et al. |
| 2010/0207118 | A1 | 8/2010 | Sakata et al. |
| 2011/0136301 | A1 | 6/2011 | Yamazaki et al. |
| 2011/0204368 | A1 | 8/2011 | Tsubuku et al. |
| 2011/0284844 | A1 | 11/2011 | Endo. et al. |
| 2011/0284854 | A1 | 11/2011 | Endo. et al. |
| 2012/0052602 | A1 | 3/2012 | Hatano et al. |
| 2012/0138922 | A1* | 6/2012 | Yamazaki ............ H01L 29/045 257/43 |
| 2012/0293204 | A1 | 11/2012 | Nishijima |
| 2012/0315730 | A1 | 12/2012 | Koezuka et al. |
| 2013/0075721 | A1 | 3/2013 | Yamazaki et al. |
| 2013/0082253 | A1 | 4/2013 | Yamazaki et al. |
| 2013/0137232 | A1 | 5/2013 | Ito et al. |
| 2013/0248858 | A1 | 9/2013 | Morita et al. |
| 2013/0277672 | A1 | 10/2013 | Sano et al. |
| 2013/0341617 | A1 | 12/2013 | Tao et al. |
| 2014/0038351 | A1 | 2/2014 | Yamazaki et al. |
| 2014/0103338 | A1 | 4/2014 | Yamazaki et al. |
| 2014/0361290 | A1 | 12/2014 | Yamazaki et al. |
| 2014/0361292 | A1 | 12/2014 | Yamazaki et al. |
| 2015/0072472 | A1 | 3/2015 | Yamazaki |
| 2015/0179112 | A1 | 6/2015 | Yamazaki et al. |
| 2015/0249157 | A1 | 9/2015 | Yamazaki et al. |
| 2015/0249160 | A1 | 9/2015 | Yamazaki et al. |
| 2015/0270407 | A1 | 9/2015 | Suzuki. et al. |
| 2015/0303309 | A1 | 10/2015 | Koezuka et al. |
| 2015/0348998 | A1 | 12/2015 | Koezuka et al. |
| 2015/0355095 | A1 | 12/2015 | Hayashi et al. |
| 2016/0329392 | A1* | 11/2016 | Miyake ................ G09G 3/3233 |
| 2018/0082645 | A1 | 3/2018 | Yamazaki et al. |
| 2018/0233597 | A1 | 8/2018 | Yamamoto. et al. |
| 2018/0308871 | A1* | 10/2018 | Wu ....................... H01L 27/127 |

FOREIGN PATENT DOCUMENTS

| | | |
|---|---|---|
| JP | 2007-123861 A | 5/2007 |
| JP | 2010-165999 A | 7/2010 |
| JP | 2011-192977 A | 9/2011 |
| JP | 2011-199272 A | 10/2011 |
| JP | 2012-009836 A | 1/2012 |
| JP | 2012-032801 A | 2/2012 |
| JP | 2013-239532 A | 11/2013 |
| JP | 2014-086445 A | 5/2014 |
| WO | WO-2011/102203 | 8/2011 |
| WO | WO-2013/172238 | 11/2013 |
| WO | WO-2021/090104 | 5/2021 |

OTHER PUBLICATIONS

Cho.I et al., "Full-Swing a-IGZO Inverter With a Depletion Load Using Negative Bias Instability Under Light Illumination", IEEE Electron Device Letters, Nov. 16, 2012, vol. 33, No. 12, pp. 1726-1728.

* cited by examiner

1471

1472

1473

1474

1475

1476

1477

1478

TRANSISTOR AND DISPLAY DEVICE

BACKGROUND OF THE INVENTION

1. Field of the Invention

One embodiment of the present invention relates to a transistor, a semiconductor device, a display device, and an electronic device. Another embodiment of the present invention relates to manufacturing methods of a transistor, a semiconductor device, and a display device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like are sometimes regarded as including a semiconductor device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

2. Description of the Related Art

In recent years, higher definition display panels have been demanded. Examples of devices that require high-definition display panels include a smartphone, a tablet terminal, and a laptop computer. Furthermore, higher definition has been required for a stationary display device such as a television device or a monitor device along with an increase in resolution. A device absolutely required to have a high-definition display panel is a device for virtual reality (VR) or augmented reality (AR).

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

Although the transistors used in these display devices have mainly used a semiconductor material such as silicon, attention has been drawn to a technique in which a metal oxide exhibiting semiconductor characteristics is used for transistors instead of the semiconductor material such as silicon in recent years. For example, in Patent Documents 1 and 2, a technique is disclosed in which a transistor using zinc oxide or an In—Ga—Zn-based oxide as a semiconductor layer is used in a pixel of a display device.

REFERENCE

Patent Document

[Patent Document 1] Japanese Published Patent Application No. 2007-96055
[Patent Document 2] Japanese Published Patent Application No. 2007-123861

SUMMARY OF THE INVENTION

A transistor used in a display device or the like is required to have high reliability. For example, part of light (stray light) emitted by a light-emitting element in the display device enters the transistor in some cases. In such a case, the stray light might cause a degradation of transistor characteristics and adversely affect an image to be displayed.

An object of one embodiment of the present invention is to provide a transistor whose characteristic degradation due to stray light is small. Another object of one embodiment of the present invention is to provide a display device in which a degradation in transistor characteristics due to stray light is small. Another object of one embodiment of the present invention is to provide a display device with stable pixel operation. Another object of one embodiment of the present invention is to provide a semiconductor device with a small variation in transistor characteristics. Another object of one embodiment of the present invention is to provide a semiconductor device with favorable electrical characteristics. Another object of one embodiment of the present invention is to provide a highly reliable semiconductor device. Another object of one embodiment of the present invention is to provide a miniaturized or highly integrated semiconductor device. Another object of one embodiment of the present invention is to provide a semiconductor device with low power consumption.

Note that the description of these objects does not preclude the existence of other objects. One embodiment of the present invention does not need to achieve all these objects. Other objects will be apparent from and can be derived from the description of the specification, the drawings, the claims, and the like.

One embodiment of the present invention relates to a transistor including a metal oxide in a channel formation region. The transistor includes the following: a first insulator; a second insulator over the first insulator; a metal oxide over the second insulator; a first conductor and a second conductor over the metal oxide; a third insulator over the first insulator, the second insulator, the metal oxide, the first conductor, and the second conductor; a fourth insulator over the metal oxide; a fifth insulator over the fourth insulator; and a third conductor over the fifth insulator. In the third insulator, an opening is formed to overlap with a region between the first conductor and the second conductor. The fourth insulator, the fifth insulator, and the third conductor are positioned in the opening. The metal oxide has a bandgap greater than or equal to 3.3 eV. The transistor has $V_{sh}$ higher than or equal to −0.3 V.

In the above transistor, the metal oxide preferably contains In, Ga, and Zn, and the atomic ratio of In to Ga and Zn is preferably 2:6:5 or in its vicinity.

In the above transistor, the fifth insulator preferably contains silicon and oxygen and includes a region in which the nitrogen concentration obtained by SIMS is lower than or equal to $5\times10^{19}$ atoms/cm$^3$.

Another embodiment of the present invention relates to a display device including the transistor and a light-emitting element electrically connected to the transistor. The light-emitting element includes a lower electrode, an upper electrode, and a light-emitting layer between the lower electrode and the upper electrode. In a cross-sectional observation of the light-emitting element, the light-emitting element includes a region where a side surface of the lower electrode and a side surface of the light-emitting layer are aligned or substantially aligned with each other.

In the above display device, an insulator is preferably included between the light-emitting element and an adjacent light-emitting element and includes one or both of an inorganic material and an organic material.

Another embodiment of the present invention is a display device including a first to a fourth wiring, a light-emitting element, a first capacitor, a second capacitor, and a first to a fourth transistor. In the first transistor, one of a source and a drain is electrically connected to the first wiring, the other of the source and the drain is electrically connected to one electrode of the first capacitor, and a gate is electrically connected to the second wiring. In the second transistor, one of a source and a drain is electrically connected to an anode of the light-emitting element, the other of the source and the drain is electrically connected to the third wiring, and a gate is electrically connected to the one electrode of the first capacitor. In the third transistor, one of a source and a drain is electrically connected to the fourth wiring, and the other of the source and the drain is electrically connected to the anode of the light-emitting element. In the fourth transistor, one of a source and a drain is electrically connected to the fourth wiring, and the other of the source and the drain is electrically connected to the one electrode of the first capacitor. The other electrode of the first capacitor is electrically connected to the anode of the light-emitting element. One electrode of the second capacitor is electrically connected to the one electrode of the first capacitor, and the other electrode of the second capacitor is electrically connected to the third wiring. The first transistor includes a metal oxide in a channel formation region. The first transistor has $V_{sh}$ higher than or equal to −0.3 V.

In the above display device, the metal oxide preferably contains In, Ga, and Zn, and the atomic ratio of In to Ga and Zn is preferably 2:6:5 or in its vicinity.

According to one embodiment of the present invention, a transistor whose characteristic degradation due to stray light is small can be provided. According to one embodiment of the present invention, a display device in which a degradation in transistor characteristics due to stray light is small can be provided. According to one embodiment of the present invention, a display device with stable pixel operation can be provided. According to one embodiment of the present invention, a semiconductor device with a small variation in transistor characteristics can be provided. According to one embodiment of the present invention, a semiconductor device with favorable electrical characteristics can be provided. According to one embodiment of the present invention, a highly reliable semiconductor device can be provided. According to one embodiment of the present invention, a miniaturized or highly integrated semiconductor device can be provided. According to one embodiment of the present invention, a semiconductor device with low power consumption can be provided.

Note that the description of these effects does not preclude the existence of other effects. In one embodiment of the present invention, there is no need to achieve all the effects. Other effects will be apparent from and can be derived from the description of the specification, the drawings, the claims, and the like.

DETAILED DESCRIPTION OF THE INVENTION

Figure 1A:
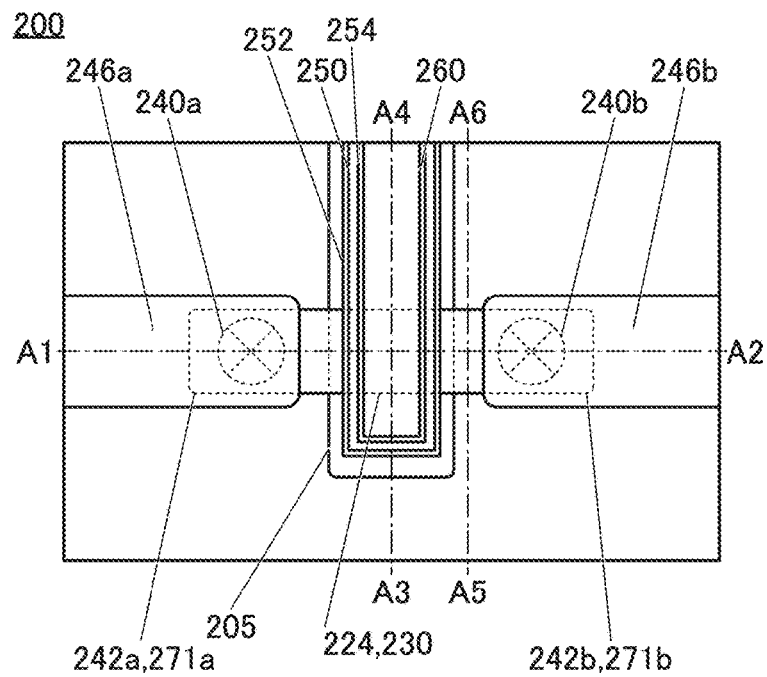
FIG. 1A is a top view of a semiconductor device of one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, sizes, layer thicknesses, or regions are sometimes exaggerated for clarity. Therefore, the scale is not limited to those illustrated in the drawings. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is used for portions having similar functions, and the portions are not denoted by specific reference numerals in some cases.

In a top view (also referred to as a plan view), a perspective view, or the like, especially, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, description can be made even when "first" is replaced with "second", "third", or the like as appropriate. In addition, the ordinal numbers in this specification and the like are not necessarily the same as those used to specify one embodiment of the present invention.

In this specification and the like, the terms for describing arrangement, such as "over", "above", "under", and "below", are used for convenience to describe a positional relation between components with reference to drawings. The positional relation between components is changed as appropriate in accordance with the direction from which each component is described. Thus, the positional relation is not limited to that described with a term used in this specification and can be explained with other terms as appropriate depending on the situation.

For example, when this specification and the like explicitly state that X and Y are connected, the case where X and Y are electrically connected, the case where X and Y are functionally connected, and the case where X and Y are directly connected are regarded as being disclosed in this specification and the like. Accordingly, without limitation to a predetermined connection relation, for example, a connection relation shown in drawings or text, another connection relation is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. The transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when transistors of opposite polarity are employed or a direction of current flow is changed in circuit operation, for example. Therefore, the terms "source" and "drain" can be interchanged in some cases in this specification and the like.

Note that a channel length refers to, for example, a distance between a source (source region or source electrode) and a drain (drain region or drain electrode) in a region where a semiconductor (or a portion where a current flows in a semiconductor when a transistor is on) and a gate electrode overlap each other or in a channel formation region in a top view of the transistor. In one transistor, channel lengths in all regions are not necessarily the same. In other words, the channel length of one transistor is not fixed to one value in some cases. Therefore, in this specification, the channel length is any one of values, the maximum values, the minimum value, or the average value in a channel formation region.

A channel width refers to, for example, the length of a channel formation region perpendicular to a channel length direction in a region where a semiconductor (or a portion where a current flows in a semiconductor when a transistor is on) and a gate electrode overlap with each other or in the channel formation region in a top view of the transistor. In one transistor, channel widths in all regions are not necessarily the same. In other words, the channel width of one transistor is not fixed to one value in some cases. Therefore, in this specification, the channel width is any one of values, the maximum value, the minimum value, or the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor having a gate electrode covering the side surface of a semiconductor, the effective channel width is larger than the apparent channel width, and its influence cannot be ignored in some cases. As another example, in a miniaturized transistor having a gate electrode covering the side surface of a semiconductor, the proportion of a channel formation region formed on the side surface of the semiconductor is sometimes increased. In that case, the effective channel width is larger than the apparent channel width.

In such cases, an effective channel width is sometimes difficult to estimate by measuring. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width. Note that the values of a channel length, a channel width, an effective channel width, an apparent channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % is regarded as an impurity. When a semiconductor contains an impurity, an increase in density of defect states or a reduction in crystallinity of the semiconductor may occur, for example. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor. Specific examples include hydrogen, lithium, sodium, silicon, boron, phosphorus, carbon, and nitrogen. Note that water also serves as an impurity in some cases. Entry of an impurity may cause oxygen vacancies ($V_O$) in an oxide semiconductor, for example.

In this specification and the like, silicon oxynitride contains more oxygen than nitrogen. Silicon nitride oxide contains more nitrogen than oxygen.

In this specification and the like, the term "insulator" can be replaced with an insulating film or an insulating layer. The term "conductor" can be replaced with a conductive film or a conductive layer. The term "semiconductor" can be replaced with a semiconductor film or a semiconductor layer.

In this specification and the like, the term "parallel" indicates that the angle formed between two straight lines is greater than or equal to $-10°$ and less than or equal to $10°$. Thus, the case where the angle is greater than or equal to $-5°$ and less than or equal to $5°$ is also included. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$. Thus, the case where the angle is greater than or equal to $85°$ and less than or equal to $95°$ is also included. In addition, the term "substantially perpendicular" indicates that the angle formed between two straight lines is greater than or equal to $60°$ and less than or equal to $120°$.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is referred to as an oxide semiconductor in some cases. That is, an OS transistor is a transistor including a metal oxide or an oxide semiconductor.

In this specification and the like, the term "normally off" means that the drain current per micrometer of channel width that flows through a transistor when no potential or a ground potential is supplied to its gate is lower than or equal to $1\times10^{-20}$ A at room temperature, lower than or equal to $1\times10^{18}$ A at $85°$ C., or lower than or equal to $1\times10^{-16}$ A at $125°$ C.

In this specification, in the case where the maximum value and the minimum value are specified, a structure in which the maximum value and the minimum value are freely combined is disclosed.

In this specification and the like, a device formed using a metal mask or a fine metal mask (FMM) may be referred to as a device having a metal mask (MM) structure. In this specification and the like, a device formed without using a metal mask or an FMM may be referred to as an element having a metal maskless (MML) structure.

In this specification and the like, a structure in which light-emitting layers are separately formed or patterned to make light-emitting devices for emission colors (e.g., blue (B), green (G), and red (R)) is called a side by side (SBS) structure in some cases. In this specification and the like, a light-emitting device capable of emitting white light is called a white light-emitting device in some cases. Note that a white light-emitting device can be a full-color-display light-emitting device by being combined with a coloring layer (e.g., a color filter).

The light-emitting devices can be roughly classified into a single structure and a tandem structure. It is preferable that a device having a single structure include one light-emitting unit between a pair of electrodes and the light-emitting unit include one or more light-emitting layers. To obtain white light emission, two or more light-emitting layers may be selected such that emission colors of the light-emitting layers are complementary colors. Thus, the emission colors of the first light-emitting layer and the second light-emitting layer are made complementary, so that the whole light-emitting device can emit white light, for example. This can be applied to a light-emitting device including three or more light-emitting layers.

It is preferable that a device having a tandem structure include two or more light-emitting units between a pair of electrodes and each light-emitting unit include one or more light-emitting layers. To obtain white light emission, white light may be obtained by combining light emitted from light-emitting layers of a plurality of light-emitting units. Note that the structure that can provide white light emission is similar to that of the single structure. In the device having a tandem structure, an intermediate layer such as a charge-generation layer is preferably provided between the plurality of light-emitting units.

When the above-described white light-emitting device (including a single structure or a tandem structure) and a light-emitting device having an SBS structure are compared, the light-emitting device having an SBS structure can have lower power consumption than the white light-emitting device. In the case where power consumption is required to be low, the light-emitting device having an SBS structure is preferably used. In contrast, the white light-emitting device is preferable in that the manufacturing cost is low and the manufacturing yield is high because a process for manufacturing the white light-emitting device is easier than that for the light-emitting device having an SBS structure.

Embodiment 1

In this embodiment, an example of a semiconductor device including a transistor 200 of one embodiment of the present invention and a manufacturing method thereof will be described with reference to FIG. 1A to FIG. 21C.

Structure Example of Semiconductor Device

Figure 1C:
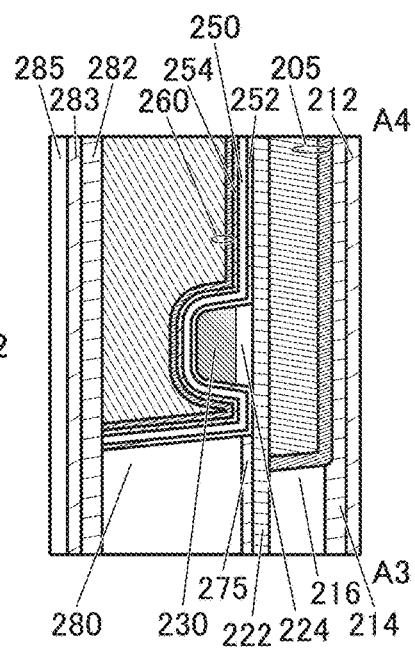
FIGS. 1B to 1D are each a cross-sectional view of the semiconductor device of one embodiment of the present invention.
Figure 1B:
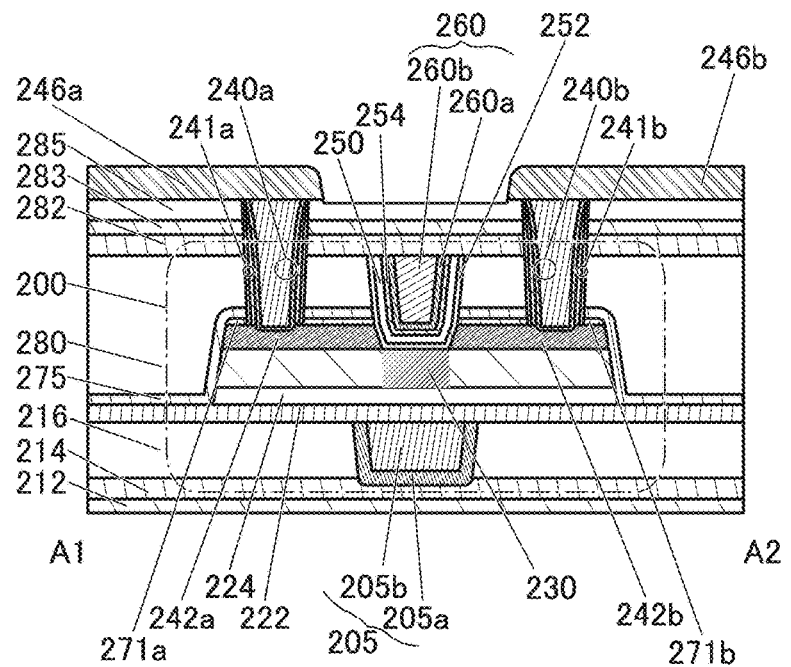
Figure 1D:
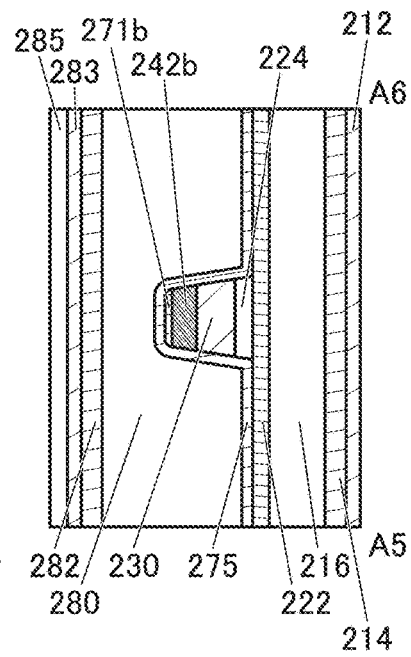

A structure of a semiconductor device including the transistor 200 is described with reference to FIGS. 1A to 1D. FIGS. 1A to 1D are a top view and cross-sectional views of the semiconductor device including the transistor 200. FIG. 1A is the top view of the semiconductor device. FIGS. 1B to 1D are the cross-sectional views of the semiconductor device. FIG. 1B is a cross-sectional view taken along the dashed-dotted line A1-A2 in FIG. 1A, which corresponds to a cross-sectional view in the channel length direction of the transistor 200. FIG. 1C is a cross-sectional view taken along the dashed-dotted line A3-A4 in FIG. 1A, which is a cross-sectional view of the transistor 200 in the channel width direction. FIG. 1D is a cross-sectional view taken along the dashed-dotted line A5-A6 in FIG. 1A. Note that for simplification, some components are not illustrated in the top view in FIG. 1A.

The semiconductor device of one embodiment of the present invention includes, an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, and an insulator 285 over the insulator 283. The insulators 212, 214, 280, 282, 283, and 285 each function as an interlayer film. The semiconductor device also includes a conductor 240a and a conductor 240b that are electrically connected to the transistor 200 and function as a plug. An insulator 241a is provided in contact with a side surface of the conductor 240a, and an insulator 241b is provided in contact with a side surface of the insulator 240b. A conductor 246a that is electrically connected to the conductor 240a and functions as a wiring is provided over the insulator 285 and the conductor 240a, and a conductor 246b that is electrically connected to the conductor 240b and functions as a wiring is provided over the insulator 285 and the conductor 240b.

Note that the conductor 240a and the conductor 240b are sometimes collectively referred to as a conductor 240 in the following description. The insulator 241a and the insulator 241b are collectively referred to as an insulator 241 in some cases. The conductor 246a and the conductor 246b are collectively referred to as a conductor 246 in some cases.

The insulator 241a is provided in contact with an inner wall of an opening formed in the insulators 280, 282, 283, and 285, and the conductor 240a is provided in contact with the side surface of the insulator 241a. The insulator 241b is provided in contact with an inner wall of an opening formed in the insulators 280, 282, 283, and 285, and the conductor 240b is provided in contact with the side surface of the insulator 241b. Each of the insulator 241a and the insulator 241b has a structure in which a first insulator is provided in contact with the inner wall of the opening and a second insulator is provided on the inner side of the first insulator. The conductor 240a (conductor 240b) has a structure in which a first conductor is provided in contact with the side surface of the insulator 241a (insulator 241b) and a second conductor is provided on the inner side of the first conductor. The top surface of the conductor 240a (conductor 240b) can be substantially level with the top surface of the insulator 285 in a region overlapping with the conductor 246a (conductor 246b).

Note that in the semiconductor device of one embodiment of the present invention, the insulator 241a (the insulator 241b) has the structure in which a first insulator and a second insulator are stacked; however, the present invention is not limited to this structure. For example, the insulator 241a (insulator 241b) may have a single-layer structure or a stacked-layer structure of three or more layers. In addition, in the transistor 200, the conductor 240a (conductor 240b) has the structure in which a first conductor and a second conductor are stacked; however, the present invention is not limited to this structure. For example, the conductor 240a (conductor 240b) may have a single-layer structure or a stacked-layer structure of three or more layers. In the case where a component has a stacked-layer structure, layers may be distinguished by ordinal numbers corresponding to the formation order.

As illustrated in FIGS. 1A to 1D, the transistor 200 includes an insulator 216 over the insulator 214, a conductor 205 (a conductor 205a and a conductor 205b) provided to be embedded in the insulator 216, an insulator 222 over the insulator 216 and the conductor 205, an insulator 224 over the insulator 222, an oxide 230 over the insulator 224, a conductor 242a over the oxide 230, an insulator 271a over the conductor 242a, a conductor 242b over the oxide 230, an insulator 271b over the conductor 242b, an insulator 252 over the oxide 230, an insulator 250 over the insulator 252, an insulator 254 over the insulator 250, a conductor 260 (a conductor 260a and a conductor 260b) over the insulator 254 and overlapping with part of the oxide 230, and an insulator 275 over the insulator 222, the insulator 224, the oxide 230, the conductor 242a, the conductor 242b, the insulator 271a, and insulator 271b. Here, as illustrated in FIGS. 1B and 1C, the insulator 252 is in contact with the top surface of the insulator 222, the side surface of the insulator 224, the top surface and the side surface of the oxide 230, the side surfaces of the conductors 242a and 242b, the side surfaces of the insulator 271a and the insulator 271b, the side surfaces of the insulators 275 and 280, and the bottom surface of the insulator 250. The top surface of the conductor 260 is positioned so as to be substantially aligned with the uppermost portions of the insulators 254, 250, and 252 and the top surface of the insulator 280. In addition, the insulator 282 is in contact with at least parts of the top surfaces of the conductor 260, the insulators 252, 250, 254, and 280.

Note that in this specification and the like, the expression "substantially level with" indicates a structure having the same level from a reference surface (e.g., a flat surface such as a substrate surface) in a cross-sectional view. For example, in a manufacturing process of the semiconductor device, planarization treatment (typically, CMP treatment) is performed, whereby the surface(s) of a single layer or a plurality of layers are exposed in some cases. In this case, the surfaces on which the CMP treatment is performed is at the same level as a reference surface. In addition, the expression "substantially level with" includes the case of leveling with each other. However, a plurality of layers may be on the different levels, in some cases, depending on a treatment apparatus, a treatment method, or a material of the treated surfaces, used for CMP treatment. This case is also included in the scope of "substantially level with" in this specification and the like. For example, in a structure where two layers (here, given as a first layer and a second layer) have different two levels with respect to the reference surface, the difference in the top-surface level between the first and second layers is less than or equal to 20 nm, in which case the structure is regarded to have the surfaces substantially leveling with each other.

Hereinafter, the conductor 242a and the conductor 242b are collectively referred to as a conductor 242 in some cases. The insulator 271a and the insulator 271b are collectively referred to as an insulator 271 in some cases.

An opening reaching the oxide 230 is provided in the insulators 280 and 275. The insulators 252, 250, and 254 and the conductor 260 are positioned in the opening. The conductor 260 and the insulators 252, 250, 254 are provided between the conductor 242a and the conductor 242b and between the insulator 271a and the insulator 271b in the channel length direction of the transistor 200. The insulator 254 includes a region in contact with the side surface of the conductor 260 and a region in contact with the bottom surface of the conductor 260.

Note that the transistor 200 includes a single-layer oxide 230; however, one embodiment of the present invention is not limited to this structure. For example, the oxide 230 may have a stacked-layer structure of two or more layers.

The conductor 260 functions as a first gate (also referred to as a top gate) electrode and the conductor 205 functions as a second gate (also referred to as a back gate) electrode. The insulators 252, 250 and 254 function as a first gate insulator, and the insulators 222 and 224 function as a second gate insulator. Note that the gate insulator is also referred to as a gate insulating layer or a gate insulating film in some cases. The conductor 242a functions as one of a source electrode and a drain electrode, and the conductor 242b functions as the other of the source electrode and the drain electrode. A region of the oxide 230 that overlaps with the conductor 260 at least partly functions as a channel formation region.

In the transistor 200, a metal oxide functioning as a semiconductor (hereinafter such a metal oxide is also referred to as an oxide semiconductor) is preferably used for the oxide 230 including a channel formation region.

In the case where the transistor 200 is used in a pixel circuit of a display device, part of light (stray light) emitted by a light-emitting element in the display device might enter the transistor 200. In that case, the stray light sometimes causes a degradation in transistor characteristics and adversely affects pixel operation.

The degradation of the transistor characteristics due to light is estimated as follows. First, when a metal oxide functioning as a semiconductor of a transistor is irradiated with light, electrons (carriers) in the valence band or a deep level of the metal oxide is excited into the conduction band of the metal oxide. Here, the deep level of the metal oxide is presumed to be attributed to oxygen vacancies in the metal oxide. Next, holes are generated in the valence band or the deep level of the metal oxide by electron excitation into the conduction band of the metal oxide. When a negative bias is applied between the gate and the source, holes are accumulated at the interface between the metal oxide and the gate insulator and in the vicinity thereof. At this time, when a defect state exists at the interface and in the vicinity thereof, holes are trapped by the defect state. Thus, the threshold voltage or the shift voltage ($V_{sh}$) is shifted in the negative direction. Consequently, the transistor has normally-on characteristics and adversely affects the pixel operation.

The stray-light-induced degradation amount of transistor characteristics can be evaluated using the amount of change in the threshold voltage or the shift voltage ($V_{sh}$) measured in a negative bias temperature illumination stress (NBTIS) test of the transistor. The shift voltage ($V_{sh}$) is defined as $V_g$ at which, in a drain current ($I_d$)-gate voltage ($V_g$) curve of a transistor, the tangent at a point where the slope of the curve is the steepest intersects the straight line of Id=1 pA. The degradation that the threshold voltage or Vas of the transistor varies in the NBTIS test is referred to as negative-bias stress temperature photodegradation.

Accordingly, it is preferable to reduce the influence of stray light on the transistor 200 used in the pixel circuit of the display device. For example, it is preferable to reduce the stray-light-induced degradation of transistor characteristics for the transistor 200 used in the pixel circuit of the display device. Specifically, the transistor 200 used in the pixel circuit of the display device preferably has high resistance to the NBTIS test (reduces negative-bias stress temperature photodegradation).

The metal oxide functioning as a semiconductor of the transistor 200 preferably has a bandgap greater than or equal to 3.1 eV, further preferably greater than or equal to 3.3 eV. The energy of light having a wavelength greater than or equal to 400 nm is less than or equal to 3.1 eV. In other words, even when light having a wavelength greater than or equal to 400 nm enters the metal oxide, electrons in the valence band are less likely to be excited into the conduction band. Thus, when a metal oxide having a wider bandgap is used in a channel formation region of the transistor, the resistance to the NBTIS test can be increased. That is, with use of a metal oxide having a wider bandgap in a channel formation region of the transistor, influence of stray light can be reduced even when a light-blocking layer or the like is not provided, so that degradation of the transistor characteristics can be suppressed.

The bandgap of the metal oxide can be evaluated optically using one or a plurality of a spectrophotometer, spectroscopic ellipsometry, a photoluminescence method, X-ray photoelectron spectroscopy (XPS), electron spectroscopy for chemical analysis (ESCA), an X-ray absorption fine structure (XAFS), and the like.

For example, as the oxide 230, a metal oxide such as an In-M-Zn oxide containing indium, an element M, and zinc is used; the element M is one or more selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, cobalt, and the like. Specifically, the element M is preferably one or more kinds selected from gallium, aluminum, gallium, yttrium, and tin. Gallium is further preferable.

Specifically, it is preferable for the oxide 230 to use a metal oxide film with an atomic ratio where In:M:Zn=2:6:5 or a composition in the neighborhood thereof, an atomic ratio where In:M:Zn=1:3:4 or a composition in the neighborhood thereof, an atomic ratio where In:M:Zn=1:1:1 or a composition in the neighborhood thereof, an atomic ratio where In:M:Zn=1:4:5 or a composition in the neighborhood thereof. Note that the neighborhood of the atomic ratio includes ±30% of an intended atomic ratio. When the metal oxide is deposited by a sputtering method, the above atomic ratio is not limited to the atomic ratio of the deposited metal oxide and may be the atomic ratio of a sputtering target used for depositing the metal oxide.

For example, in the case of describing an atomic ratio of In to M and Zn that is 2:6:5 or a composition in the neighborhood thereof, the case is included in which with the atomic proportion of In being 2, the atomic proportion of M is greater than or equal to 4 and less than or equal to 8 and the atomic proportion of Zn is greater than or equal to 3 and less than or equal to 7.5. In the case of describing an atomic ratio of In and M to Zn that is 1:1:1 or a composition in the neighborhood thereof, the case is included in which with the atomic proportion of In being 1, the atomic proportion of M is greater than 0.1 and less than or equal to 2 and the atomic proportion of Zn is greater than 0.1 and less than or equal to 2.

Note that the composition of the metal oxide can be evaluated by an inductively coupled plasma-mass spectrometry (ICP-MS), XPS, scanning electron microscopy (SEM)-energy dispersive X-ray spectroscopy (EDX), secondary ion mass spectrometry (SIMS), or the like.

In particular, a metal oxide deposited by sputtering using an oxide target whose atomic ratio (In:M:Zn) is 1:3:4 has a bandgap that is approximately 3.4 eV, which can be favorably used as the oxide 230. Note that the metal oxide deposited by sputtering using an oxide target whose atomic ratio (In:M:Zn) is 1:3:4 has an atomic ratio where In:M:Zn=2:6:5 or a composition in the neighborhood thereof. That is, the metal oxide with an atomic ratio where In:M:Zn=2:6:5 or a composition in the neighborhood thereof has a bandgap that is approximately 3.4 eV.

A gallium atom has a stronger strength of bonding with an oxygen atom than an indium atom has. Thus, the metal oxide in which an atomic ratio of gallium to main metal elements is higher than or equal to an atomic ratio of indium to the main metal elements is used as the oxide 230, whereby oxygen vacancies in the oxide 230 can be reduced in some cases.

Furthermore, there is a case where due to the negative bias, holes generated in the metal oxide by light irradiation are trapped by defect states existing at an interface between the metal oxide and a gate insulator or in the gate insulator, so that the threshold voltage or $V_{sh}$ varies. Thus, it is preferable to reduce the density of defect states in the gate insulator to prevent the negative-bias stress temperature photodegradation.

When silicon oxide or silicon oxynitride is used as the gate insulator, the defect states (levels) relating to the negative-bias stress temperature photodegradation include a defect state attributed to oxygen, a defect state attributed to nitrogen, and the like. As nitrogen to which the defect state is attributed, a nitrogen atom bonded to two silicon atoms can be given, for example. The nitrogen atom has a dangling bond. As oxygen to which the defect state is attributed, an oxygen atom bonded to one silicon atom can be given, for example. The oxygen atom has a dangling bond. Due to these dangling bonds, holes might be trapped, and the threshold voltage or $V_{sh}$ varies in some cases. In the following description, a nitrogen atom bonded to two silicon atoms is denoted by No in some cases. In addition, an oxygen atom bonded to one silicon atom is denoted by a non-bridging oxygen hole center (NBOHC) in some cases.

In order to reduce the defect state attributed to nitrogen, the amount of nitrogen atoms having dangling bonds in the gate insulator is preferably reduced. The quantification of nitrogen atoms having dangling bonds in the gate insulator is difficult in some cases. Therefore, the amount of nitrogen atoms having dangling bonds in the gate insulator is preferably evaluated with the nitrogen concentration in the gate insulator, for example. In a gate insulator with a small amount of nitrogen atoms, the amount of nitrogen atoms having dangling bonds is presumed to be small. Specifically, the nitrogen concentration in the gate insulator, which is measured by SIMS, is preferably lower than $2 \times 10^{20}$ atoms/cm$^3$, further preferably lower than or equal to $1 \times 10^{20}$ atoms/cm$^3$, still further preferably lower than or equal to $5 \times 10^{19}$ atoms/cm$^3$.

Note that it is difficult to detect a nitrogen atom as a single ion ($N^+$ or $N^-$) in SIMS. Therefore, a nitrogen atom in the gate insulator is preferably detected as a cluster ion of SiN.

In the case where the gate insulator has a stacked-layer structure of two or more layers, the nitrogen concentration of the layer containing silicon oxide or silicon oxynitride is preferably reduced. In the transistor 200 included in the semiconductor device in FIGS. 1A to 1D, part of each of the insulators 222, 224, 252, 250, and 254 functions as a gate insulator. Thus, silicon oxide or silicon oxynitride with a low nitrogen concentration is preferably used in one or more of the insulators 222, 224, 252, 250, and 254. In particular, a silicon oxide or silicon oxynitride with a low nitrogen concentration is preferably used as the insulator 250.

Silicon oxide or silicon oxynitride with a low nitrogen concentration can be deposited by a sputtering method, a chemical vapor deposition (CVD) method, an atomic layer deposition (ALD) method, or the like. For example, an insulating film to be the insulator 250 is deposited on bottom and side surfaces of an opening formed in the insulator 280 and the like to have favorable coverage. Therefore, in the case where silicon oxide or silicon oxynitride is used as the insulator 250, an insulating film to be the insulator 250 is preferably deposited by a CVD method or an ALD method. In particular, an ALD method enables film formation to have excellent step coverage and excellent thickness uniformity and thus is suitable for depositing an insulating film to be the insulator 250.

As the defect level relating to the negative-bias stress temperature photodegradation, a level attributed to a defect formed by diffusion of atoms in the gate insulator into the metal oxide, a level attributed to a defect formed by diffusion of atoms in the metal oxide into the gate insulator, or the like can be given. For example, as the defect generated by diffusion of atoms in the metal oxide into the gate insulator, a defect in which silicon atoms in the silicon oxide or silicon oxynitride are replaced with metal atoms in the metal oxide can be given. When the metal oxide is an In—Ga—Zn oxide, a defect in which a silicon atom is replaced with an indium atom, a gallium atom, or a zinc atom can be given as the defect. In this specification, a defect in which a silicon atom is replaced with an indium atom is referred to as $In_{Si}$, a defect in which a silicon atom is replaced with a gallium atom is referred to as $Ga_{Si}$, and a defect in which a silicon atom is replaced with a zin atom is referred to as $Zn_{Si}$.

The crystallinity of the metal oxide is preferably high in order to prevent formation of defects such as $In_{Si}$, $Ga_{Si}$, and $Zn_{Si}$. When the crystallinity of the metal oxide is high, a metal element contained in the metal oxide can be prevented from diffusing into the gate insulator. Furthermore, diffusion of an atom (e.g., silicon atom) contained in the gate insulator to the metal oxide can be suppressed.

In the above manner, the influence of stray light on the transistor 200 can be reduced even when a light-blocking layer or the like is not provided, and accordingly the degradation of transistor characteristics can be inhibited. As a result, a transistor whose characteristic degradation due to stray light is small can be provided. Furthermore, with use of such a transistor, a display device in which deterioration in transistor characteristics due to stray light is small can be provided. Furthermore, a display device with stable pixel operation can be provided.

<Defect in Gate Insulator>

Here, a defect in agate insulator is described using calculation. In this section, the gate insulator is silicon oxide, and the metal oxide is an In—Ga—Zn oxide. As a defect that may be a cause of negative-bias stress temperature photodegradation in this case, a defect such as NBOHC, $In_{Si}$, $Ga_{Si}$, or $Zn_{Si}$ can be given.

<<Calculation Model>>

First, a silicon oxide model in an amorphous state (denoted by a-SiO$_2$ model) as a reference is prepared. The a-SiO$_2$ model consists of 20 silicon atoms and 40 oxygen atoms.

A calculation model including one NBOHC is made in the following manner: one silicon atom in the a-SiO$_2$ model is removed to form four NBOHCs and then one hydrogen atom is bonded to each of three out of the four NBOHCs. A calculation model including one $In_{Si}$ is made by replacing one silicon atom in the a-SiO$_2$ model with an In atom. A calculation model including one $Ga_{Si}$ is made similarly by replacing one silicon atom in the a-SiO$_2$ model with a Ga atom. A calculation model including one $Zn_{Si}$ is made similarly by replacing one silicon atom in the a-SiO$_2$ model with a Zn atom.

<<Defect Formation Energy>>

The feasibility of formation of defects in the gate insulator is described below with use of results of first-principles calculation. Specifically, each of formation energies of $In_{Si}$, $Ga_{Si}$, $Zn_{Si}$, and NBOHC is calculated by the first-principles calculation, and the feasibility of defect formation in the gate insulator is evaluated.

Here, formation energy of each defect ($In_{Si}$, $Ga_{Si}$, $Zn_{Si}$, and NBOHC) is described. In this specification, formation energy of a defect is calculated using the following formulae. A defect whose formation energy is lower can be regarded as being formed more easily.

$$\Delta E(X_{Si}) = E(X_{Si}) - \{E(\text{no defect}) - \mu_{Si} + \mu_X\}$$

$$\Delta E(\text{NBOHC}) = E(\text{NBOHC}) - \{E(\text{no defect}) - \mu_{Si} + 3\mu_H\} \quad \text{[Formula 1]}$$

In the above formulae, $\Delta E(X_{Si})$ represents a formation energy of $X_{Si}$, and an atom X is an In atom, a Ga atom, or a Zn atom. $\Delta E(\text{NBOHC})$ represents a formation energy of NBOHC. $E(X_{Si})$ represents a total energy of the calculation model including one $X_{Si}$, and $E(\text{NBOHC})$ represents a total energy of the calculation model including one NBOHC. $E(\text{no defect})$ represents a total energy of the calculation model (a-SiO$_2$ model) without a defect. $\mu_{Si}$ represents a chemical potential of a silicon atom, $\mu_X$ represents a chemical potential of an atom X, and $\mu_H$ represents a chemical potential of a hydrogen potential.

The chemical potential of a silicon atom ($\mu_{Si}$), the chemical potential of an atom X ($\mu_X$), and the chemical potential of a hydrogen atom ($\mu_H$) are calculated using the following formulae.

$$\mu_O = \frac{E(O_2)}{2} \quad \text{[Formula 2]}$$

$$\mu_{Si} = E(SiO_2) - E(O_2)$$

$$\mu_X = \frac{E(X_a O_b)}{a} - E(O_2) \times \frac{b}{2a}$$

$$\mu_H = \frac{E(H_2O)}{2} - \frac{E(O_2)}{4}$$

In the above formulae, $\mu_O$ represents a chemical potential of an oxygen atom. $E(O_2)$ represents a total energy of an oxygen molecule ($O_2$), $E(SiO_2)$ represents a total energy of silicon oxide, $E(X_a O_b)$ represents a total energy of a metal oxide ($X_a O_b$), and $E(H_2O)$ represents a total energy of a water molecule ($H_2O$). In the case where the atom X is an In atom or a Ga atom, a is 2, and b is 3. In the case where the atom X is a Zn atom, a is 1, and b is 2.

The above is the description of the formation energy of a defect.

<<Feasibility of Defect Formation>>

First, the atom relaxation calculation is performed on the calculation model with one defect (any one of $In_{Si}$, $Ga_{Si}$, $Zn_{Si}$, and NBOHC). Calculation conditions are as follows.

In the first-principles calculation, software VASP (Vienna Ab-initio Simulation Package) was used. For the exchange-correlation potential, Perdew-Burke-Ernzerhof (PBE) type generalized gradient approximation (GGA) was used, and for the ion potential, a projector augmented wave (PAW) method was used. The cut-off energy was 800 eV, and the grid of only r-point was used for the k-point. Note that the charge state of the whole model was neutral.

With the above formulae, the formation energy of each defect was calculated. Table 1 shows the formation energies of the defects.

TABLE 1

| Defect | Formation energy [eV] |
| --- | --- |
| $In_{Si}$ | 3.96 |
| $Ga_{Si}$ | 3.54 |
| $Zn_{Si}$ | 4.86 |
| NBOHC | 2.99 |

Table 1 shows that the formation energy of NBOHC is the lowest and suggests that NBOHC is easily formed. Among $In_{Si}$, $Ga_{Si}$, and $Zn_{Si}$, the formation energy of $Zn_{Si}$ is higher than the formation energies of $In_{Si}$ and $Ga_{Si}$. Thus, $Zn_{Si}$ is estimated to be less likely to be formed than $In_{Si}$ and $Ga_{Si}$.

<<Graph of Density of States>>

Figure 2A:
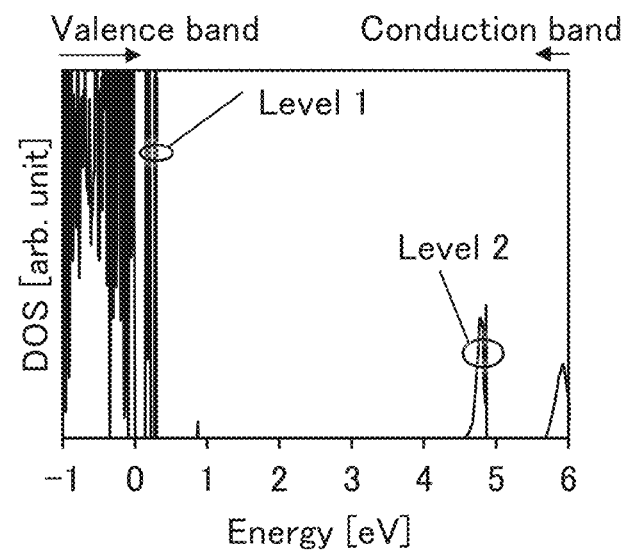
FIGS. 2A and 2B are each a graph showing density of states obtained by calculation.

FIG. 2A shows the density of states of the calculation model including one $In_{Si}$ on which the atom relaxation calculation was performed. In FIG. 2A, the horizontal axis represents energy [eV], and the vertical axis represents the density of states (DOS) [arbitrary unit (arb. unit)]. Note that in FIG. 2A, the valence band maximum was adjusted to be at 0 eV on the horizontal axis.

According to FIG. 2A, a deep defect level (a level 1 in FIG. 2A) exists above the valence band maximum. This suggests that the defect level is to be a level trapping holes. Furthermore, a level (a level 2 in FIG. 2A) exists in the vicinity of the conduction band minimum. The level corresponds to an s-orbital of an In atom, which suggests that the level is to be a level trapping electrons.

Figure 2B:
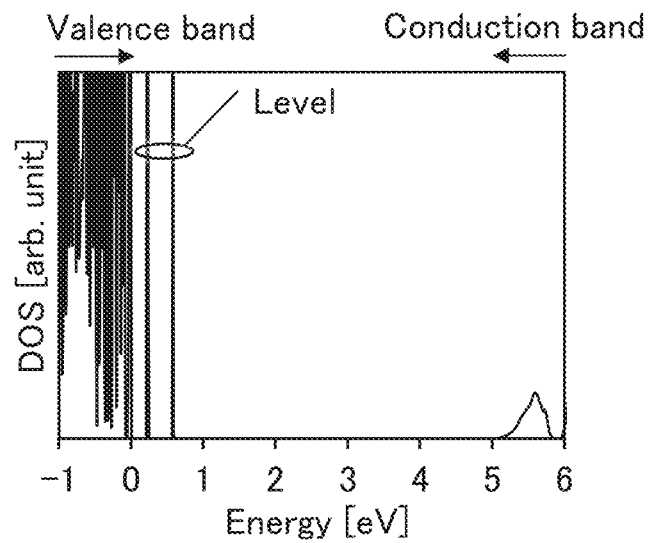

FIG. 2B shows a density of states of the calculation model including one $Ga_{Si}$ on which the atom relaxation calculation was performed. In FIG. 2B, the horizontal axis represents energy [eV], and the vertical axis represents the density of states (DOS) [arbitrary unit (arb. unit)]. Note that in FIG. 2B, the valence band maximum was adjusted to be at 0 eV on the horizontal axis.

According to FIG. 2B, a defect level (a level in FIG. 2B) exists in the upper portion of the valence band maximum. This suggests that the defect level is to be a level trapping holes.

<<Transition Level of Defect>>

A level involving transition to a different charge state, which is also called a transition level, exists in an energy gap, depending on the kind of defect. This causes capture or release of carriers depending on the depth of the level and the position of the Fermi level. Thus, this section describes calculation of the transition level of a defect with first-principles calculation.

Figure 3A:
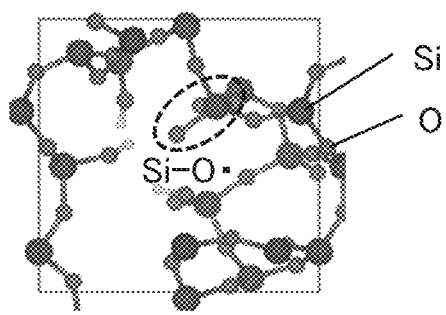
FIGS. 3A to 3D each show a calculation model shown in Embodiment 1.
Figure 3B:
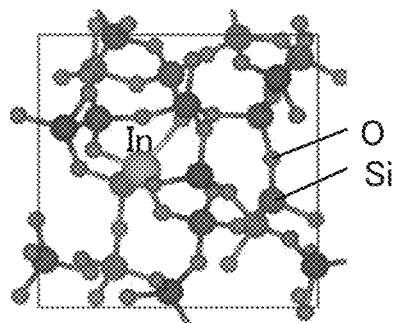
Figure 3C:
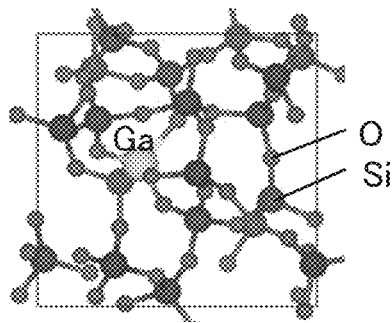
Figure 3D:
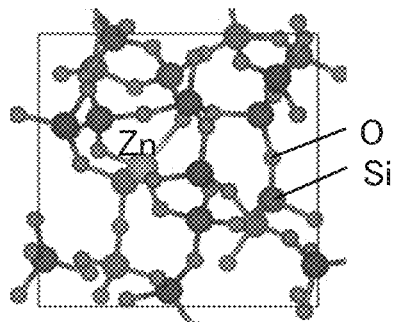

The transition levels of defects that can be formed in the gate insulator were calculated. Such defects are specifically NBOHC, $In_{Si}$, $Ga_{Si}$, and $Zn_{Si}$. Thus, in the calculation of the transition level, a calculation model including one NBOHC, a calculation model including one $In_{Si}$, a calculation model including one $Ga_{Si}$, and a calculation model including one $Zn_{Si}$ are used. FIGS. 3A to 3D show the calculation models used for the transition level calculation. FIG. 3A is the calculation model including one NBOHC, FIG. 3B is the calculation model including one $In_{Si}$, FIG. 3C is the calculation model including one $Ga_{Si}$, and FIG. 3D is the calculation model including one $Zn_{Si}$. Note that $In_{Si}$, $Ga_{Si}$, and $Zn_{Si}$ are the defects formed by replacing one Si atom in the gate insulator with an In atom, a Ga atom, and a Zn atom, respectively, that is, with atoms different from the Si. That is, $In_{Si}$, $Ga_{Si}$, and $Zn_{Si}$ can be referred to as substitutional defects.

The transition level of the defect is calculated from the formation energy of the defect having charges. The formation energy $E_{form}$ (defect, q) of a defect having a charge q is calculated with the following formula.

$$E_{form}(\text{defect}, q) = E(\text{defect}, q) - \left\{ E(\text{no defect}) + \sum_{X1} n_{X1}\mu_{X1} \right\} + q(\varepsilon_{VBM} + E_F + \Delta V) \quad \text{[Formula 3]}$$

Here, E(defect, q) is an energy of a calculation model including a defect having a charge q, and E(no defect) is an energy of a calculation model (a-$SiO_2$ model) without a defect. X1 represents an atom having a change in the number of atoms due to defect generation, and $n_{X1}$ represents the number of atoms X1 increased or decreased. In the case where the number of atoms X1 is increased, the value of $n_{X1}$ is positive; in the case where the number of atoms X1 is decreased, the value of $n_{X1}$ is negative. $\mu_{X1}$ represents a chemical potential of the atom X1. $\varepsilon_{VBM}$ represents an energy of the valence band maximum, and $E_F$ represents an energy of a Fermi level when the energy at the valence band maximum is regarded as a reference. In other words, the Fermi level, $E_F$=0 V, is located on the valence band maximum. Note that the energy at the Fermi level is denoted by a Fermi energy in some cases below.

In addition, $\Delta V$ represents an electrostatic energy correction, which is represented by the following formula. A finite-sized calculation model is used in calculation of the transition level of the defect; the electrostatic potential due to charge does not converge even at a portion far from the defect. Thus, the electrostatic potential V(q, r) at the atomic position r in the calculation model including the defect of the charge q and the electrostatic potential V(0, r) at the atomic position r in the calculation model without a neutrally charged defect are calculated, and an average value of the difference between V(q, r) and V(0, r) at the position far from the defect (r=far) is regarded as $\Delta V$.

$$\Delta V = [V(q,r) - V(0,r)]_{r=far} \quad \text{[Formula 4]}$$

The transition level $\varepsilon(q/q')$ of the defect is calculated with the following formula.

$$\varepsilon(q/q') = \frac{E_{form}(\text{defect}, q) - E_{form}(\text{defect}, q')}{q' - q} \quad \text{[Formula 5]}$$

The value of $\varepsilon(q/q')$ obtained from the above formula represents the transition level of the defect when the valence band maximum is set to 0.0 eV. In other words, the value obtained by subtracting the transition level of the defect from the energy gap represents a transition level of the defect when the conduction band minimum is regarded as a reference. In the case where the Fermi level is located on the valence band side beyond $\varepsilon(q/q')$, the defect is in the charge state q, which means stable. In the case where the Fermi level is located on the conduction band side beyond $\varepsilon(q/q')$, the defect is in the charge state q', which means stable.

In the first-principles calculation, VASP was used. The Heyd-Scuseria-Ernzerhof (HSE) hybrid functional (HSE06) was used as a hybrid functional, the Perdew-Burke-Ernzerhof (PBE) generalized gradient approximation (GGA) was used for an exchange-correlation potential, and a projector augmented-wave (PAW) method was used for the ion potential. The cut-off energy was 800 eV, and the k-point grid points was 3×3×3. In addition, the screening parameter of the HSE functional was 2 $nm^{-1}$, and the fraction of the Hartree-Fock exchange term was 0.25.

Figure 4:
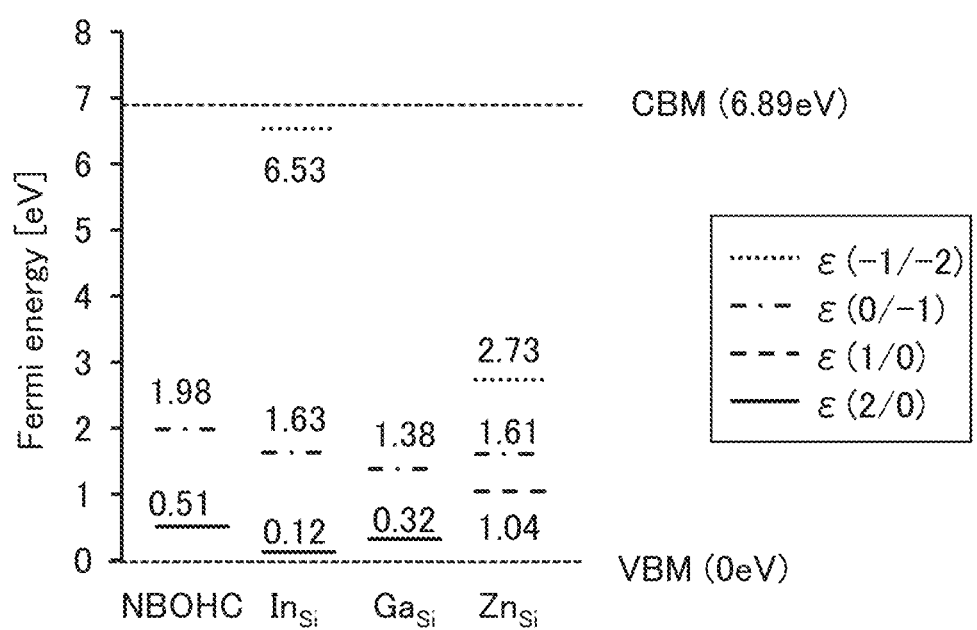
FIG. 4 is a graph showing transition levels.

FIG. 4 shows the transition levels of defects calculated. In FIG. 4, the vertical axis represents the Fermi energy [eV]. FIG. 4 shows the transition levels of NBOHC, $In_{Si}$, $Ga_{Si}$, and $Zn_{Si}$ in this order from left to right. In FIG. 4, the position where the Fermi energy is 0 eV represents the valence band maximum (VBM), and the position where the Fermi energy is 6.89 eV represents the conduction band minimum (CBM). The transition level $\varepsilon(2/0)$ is denoted by a solid line, the transition level $\varepsilon(1/0)$ is denoted by a dashed line, the transition level $\varepsilon(0/-1)$ is denoted by a dashed-dotted line, and the transition level $\varepsilon(-1/-2)$ is denoted by a dotted line. Note that FIG. 4 shows values of the transition levels of the defects.

According to FIG. 4, the transition level $\varepsilon(2/0)$ of NBOHC exists at a position of 0.51 eV from the valence band maximum; the transition level $\varepsilon(2/0)$ of $In_{Si}$ exists at a position of 0.12 eV from the valence band maximum; and the transition level $\varepsilon(2/0)$ of $Ga_{Si}$ exists at a position of 0.32 eV from the valence band maximum. Being located around the valence band maximum, the transition levels $\varepsilon(2/0)$ of NBOHC, $In_{Si}$, and $Ga_{Si}$ are each presumed as a hole trap level. In other words, the hole trap levels derived from $In_{Si}$ and $Ga_{Si}$ are located on the valence band side more than the hole trap level derived from NBOHC. Therefore, $In_{Si}$ and $Ga_{Si}$ generated in the gate insulator are estimated to have hole trap properties.

In contrast, the transition level $\varepsilon(1/0)$ of $Zn_{Si}$ exists at a position of 1.04 eV from the valence band maximum. Being located around the valence band maximum, the transition level $\varepsilon(1/0)$ of $Zn_{Si}$ is presumed as a hole trap level. In other words, since the hole trap level derived from $Zn_{Si}$ is located closer to the conduction band than the hole trap levels derived from NBOHC, $In_{Si}$, and $Ga_{Si}$, $Zn_{Si}$ is presumed to have lower hole trap properties than NBOHC, $In_{Si}$, and $Ga_{Si}$.

From the above, it is presumed that, in the case of using an In—Ga—Zn oxide as an oxide semiconductor, the defects ($In_{Si}$ and $Ga_{Si}$) which could be generated by diffusion of In and Ga into the gate insulator induce the formation of hole trap levels, which could be a cause of the negative-bias stress temperature photodegradation.

<<Diffusion of Metal Atom in Metal Oxide into Gate Insulator>>

In this section, diffusion of metal atoms in a metal oxide into a gate insulator is described using calculation. Note that diffusion of metal atoms in a metal oxide into a gate insulator can also be referred to as a release of metal atoms from the metal oxide. In this section, the gate insulator is silicon oxide, the metal oxide is an In—Ga—Zn oxide.

As a defect in the In—Ga—Zn oxide, oxygen vacancy ($V_O$) can be given. In addition, the metal atoms around the oxygen vacancy are presumed to be released more easily, from the metal oxide, than metal atoms located far away from the oxygen vacancy. In other words, it is assumed that the metal atom diffused from the metal oxide into the gate insulator is a metal atom in the vicinity of the oxygen vacancy. Thus, the energy of releasing the metal atom around $V_O$ is calculated by first-principles calculation.

Here, a calculation model used for first-principles calculation is described. First, a model of an In—Ga—Zn oxide having a single crystal structure is prepared. Hereinafter, the In—Ga—Zn oxide model having a single crystal structure is denoted by a sc-IGZO model. The compositions of the sc-IGZO model is In:Ga:Zn:O=1:1:1:4 [atomic ratio]. The sc-IGZO model is composed of 112 atoms.

Figure 5:
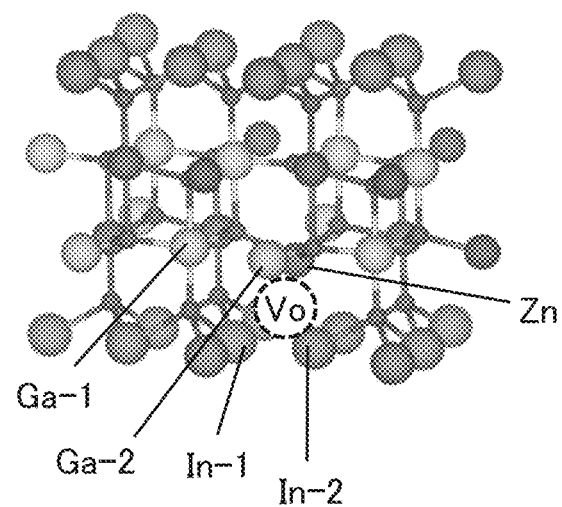
FIG. 5 shows a calculation model shown in Embodiment 1.

Next, one oxygen atom is removed from the sc-IGZO model. The removed oxygen atom is an oxygen atom bonded to indium and zinc. The sc-IGZO model from which the oxygen atom has been removed has oxygen vacancy. In the following description, the model is referred to as a sc-IGZO model having oxygen vacancy in some cases. FIG. 5 shows the sc-IGZO model having oxygen vacancy. In FIG. 5, $V_O$ represents oxygen vacancy, In-1 represents one of indium atoms adjacent to $V_O$ shown in FIG. 5, In-2 represents another of the indium atoms adjacent to $V_O$ shown in FIG. 5, Zn represents a zinc atom adjacent to $V_O$ shown in FIG. 5, Ga-1 represents one of gallium atoms adjacent to Zn shown in FIG. 5, and Ga-2 represents another of the gallium atoms adjacent to Zn shown in FIG. 5.

Next, from the sc-IGZO model having oxygen vacancy, the In-1, the In-2, the Ga-1, the Ga-2, or the Zn shown in FIG. 5 is separately removed. Specifically, a sc-IGZO model having oxygen vacancy, from which the In-1 is removed, is prepared; a sc-IGZO model having oxygen vacancy, from which the In-2 is removed, is prepared; a sc-IGZO model having oxygen vacancy, from which the Ga-1 is removed, is prepared; a sc-IGZO model having oxygen vacancy, from which the Ga-2 is removed, is prepared; and a sc-IGZO model having oxygen vacancy, from which the Zn is removed, is prepared.

With the above five calculation models, an energy of releasing a metal atom X2 (the In-1, the In-2, the Ga-1, the Ga-2, or the Zn) was calculated. The energy of releasing the metal atom X2, $\Delta E(V_{O, X2})$, was calculated with the following formula. As the value of the energy of releasing the metal atom X2, $\Delta E(V_{O, X2})$, is smaller, the metal atom X2 is more easily released.

$$\Delta E(V_{O,X2})=E(V_{O,X2})-\{E(V_O)-\mu_{X2}\} \quad \text{[Formula 6]}$$

In the above formula, $\Delta E(V_{O, X2})$ represents an energy of releasing the metal atom X2, $E(V_{O, X2})$ represents a total energy of the sc-IGZO model having oxygen vacancy, from which the metal atom X2 is removed, $E(V_O)$ represents a total energy of the sc-IGZO model having oxygen vacancy, and $\mu_{X2}$ represents a chemical potential of the metal atom X2.

Table 2 shows calculation results of the energy of releasing the metal atom X2.

TABLE 2

| Metal atom X2 | Release energy [eV] |
| --- | --- |
| In-1 | −0.04 |
| In-2 | 0.07 |
| Ga-1 | 1.29 |
| Ga-2 | 1.41 |
| Zn | −1.25 |

According to Table 2, the zinc atom adjacent to $V_O$ (the Zn shown in FIG. 5) is presumed to be released easily. The energy of releasing the In-1 is a negative value, and the energy of releasing the In-2 is low. On the basis of the results, the indium atoms adjacent to $V_O$ are also presumed to be released easily. In contrast, the energy of releasing the Ga-1 is 1.29 eV and lower than that of releasing the Ga-2. From these results, in the metal atoms around $V_O$, the zinc atom and the indium atom are presumed to be released more easily than the gallium atom. In other words, the results suggest that, in the case of using an In—Ga—Zn oxide as a metal oxide, metal atoms easily diffusing into a gate insulator are zinc and indium atoms.

As described above, in an In—Ga—Zn oxide, zinc and indium atoms are implied as metal atoms easily diffusing into a gate insulator. $Zn_{Si}$ and $In_{Si}$ are examples of substitutional defects that could be generated when zinc and indium atoms diffuse into the gate insulator. Thus, the formation energies of $Zn_{Si}$ and $In_{Si}$ are calculated. For the calculation method of the $Zn_{Si}$ and $In_{Si}$ formation energies, the description in <<Defect formation energy>> can be referred to. In addition, for the conditions of calculating the formation energies of $Zn_{Si}$ and $In_{Si}$, the description in <<Transition level of defect>> can be referred to.

Table 3 shows the formation energies of $Zn_{Si}$ and $In_{Si}$. Here, metal atoms contained in the metal oxide, which diffuse into the gate insulator, are called diffusing atomic species. When the diffusing atomic species is an In atom, the defect formed by diffusion of the In atom is $In_{Si}$. When the diffusing atomic species is a Zn atom, the defect formed by diffusion of the Zn atom is $Zn_{Si}$.

TABLE 3

| Diffusing atomic species (Defect formed after diffusion) | Formation energy [eV] |
|---|---|
| In (In$_{Si}$) | 1.83 |
| Zn (Zn$_{Si}$) | 5.48 |

According to Tables 2 and 3, it is conceivable that although the zinc atom is easily released from the metal oxide, the substitutional defect Zn$_{Si}$ is less likely to be formed. On the other hand, in the case of the indium atom, although a release from the metal oxide is not easily caused as compared to that of the zinc atom, the substitutional defect In$_{Si}$ is easily formed as compared to the case of the zinc atom. On the basis of the results, it is conceivable that the indium atom easily diffuses in to the gate insulator.

The above is the description of the defects in the gate insulator.

Details of a structure of the semiconductor device illustrated in FIGS. 1A to 1D are described below.

The oxide 230 preferably exhibits crystallinity. In particular, as the oxide 230, a c-axis-aligned crystalline oxide semiconductor (CAAC-OS) is preferably used.

The CAAC-OS is a metal oxide having a dense structure with high crystallinity and a low amount of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. As the density of the CAAC-OS is increased in such a manner, diffusion of impurities or oxygen in the CAAC-OS can be further reduced.

When an oxide having crystallinity, such as CAAC-OS, is used as the oxide 230, oxygen extraction from the oxide 230 by source or drain electrodes can be inhibited. In this case, extraction of oxygen from the oxide 230 can be inhibited even when heat treatment is performed; hence, the transistor 200 is stable against high temperatures in the manufacturing process (i.e., thermal budget).

By contrast, in the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

Figure 6A:
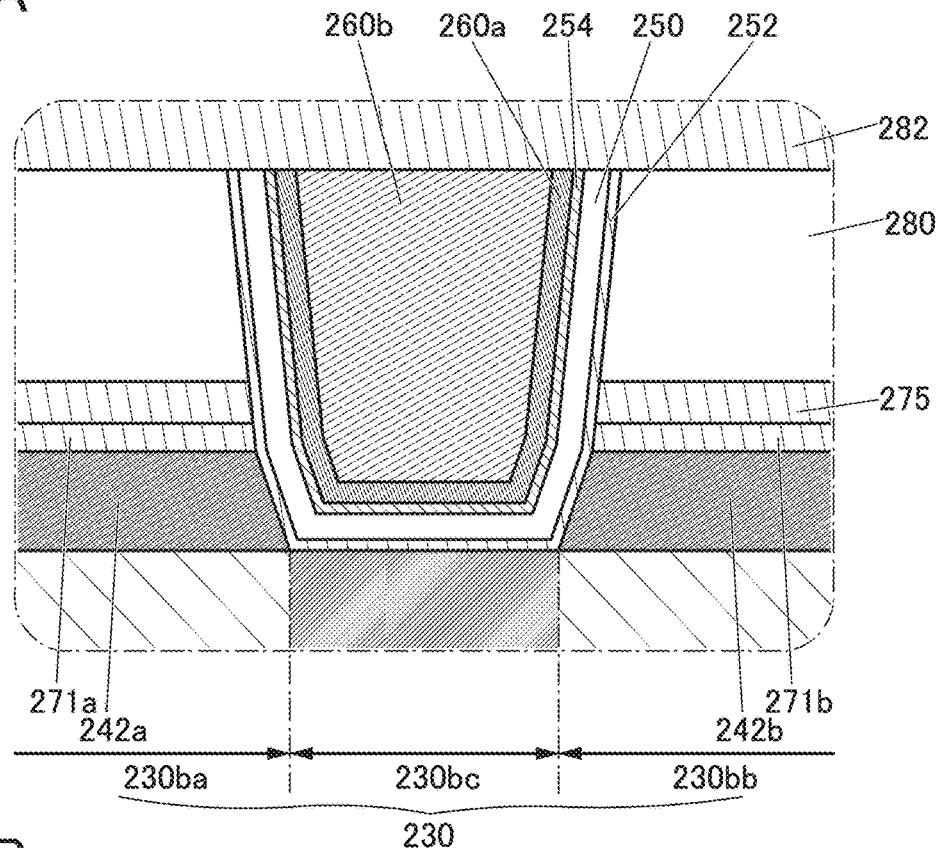
FIGS. 6A and 6B are each a cross-sectional view of a semiconductor device of one embodiment of the present invention.

FIG. 6A is an enlarged view of the vicinity of the channel formation region in FIG. 1B. As illustrated in FIG. 6A, the oxide 230 includes a region 230*bc* functioning as the channel formation region of the transistor 200 and a region 230*ba* and a region 230*bb* that are provided to sandwich the region 230*bc* and function as a source region and a drain region. At least part of the region 230*bc* overlaps with the conductor 260. In other words, the region 230*bc* is provided between the conductor 242*a* and the conductor 242*b*. The region 230*ba* is provided to overlap with the conductor 242*a*, and the region 230*bb* is provided to overlap with the conductor 242*b*.

The region 230*bc* functioning as the channel formation region has a smaller amount of oxygen vacancies or a lower impurity concentration than the regions 230*ba* and 230*bb*, i.e., is a high-resistance region with a low carrier concentration. Thus, the region 230*bc* can be regarded as being i-type (intrinsic) or substantially i-type.

The regions 230*ba* and 230*bb* functioning as the source and the drain regions have a large amount of oxygen vacancies or a high concentration of impurities such as hydrogen, nitrogen, and a metal element, i.e., are low-resistance regions with a high carrier concentration. In other words, the region 230*ba* and the region 230*bb* are each a n-type region having a higher carrier concentration and a lower resistance than the region 230*bc*.

The carrier concentration in the region 230*bc* functioning as the channel formation region is preferably lower than or equal to $1 \times 10^{18}$ cm$^{-3}$, further preferably lower than $1 \times 10^7$ cm$^{-3}$, still further preferably lower than $1 \times 10^{16}$ cm$^{-3}$, yet further preferably lower than $1 \times 10^3$ cm$^{-3}$, and yet still further preferably lower than $1 \times 10^{12}$ cm$^{-3}$. Note that the lower limit of the carrier concentration in the region 230*bc* functioning as the channel formation region is not particularly limited and can be, for example, $1 \times 10^{-9}$ cm$^{-3}$.

A region having a carrier concentration lower than or equal to that of the region 230*ba* (230*bb*) and higher than or equal to that of the region 230*bc* may be formed between the region 230*bc* and the region 230*ba* (230*bb*). That is, the region functions as a junction region between the region 230*bc* and the region 230*ba* (230*bb*). The hydrogen concentration in the junction region is sometimes lower than or equal to that in the region 230*ba* (230*bb*) and higher than or equal to that in the region 230*bc*. The amount of oxygen vacancies in the junction region is sometimes smaller than or equal to that in the region 230*ba* (230*bb*) and larger than or equal to that in the region 230*bc*.

In the oxide 230, the boundaries between the regions are difficult to clearly observe in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

If impurities and oxygen vacancies exist in a channel formation region of an oxide semiconductor, a transistor including the oxide semiconductor might have variable electrical characteristics and poor reliability. In some cases, a defect that is an oxygen vacancy into which hydrogen enters (hereinafter also referred to as V$_O$H in some cases) generates an electron serving as a carrier. Therefore, when the channel formation region in the oxide semiconductor includes oxygen vacancies, the transistor tends to have normally-on characteristics (the channel is generated even when no voltage is applied to the gate electrode and current flows through the transistor). Thus, impurities, oxygen vacancies, and V$_O$H are preferably reduced as much as possible in the channel formation region in the oxide semiconductor. In other words, the channel formation region in the oxide semiconductor is an i-type (intrinsic) or substantially i-type region with a low carrier concentration.

In contrast, when an insulator containing oxygen that is released by heating (hereinafter, also referred to as excess oxygen) is provided in the vicinity of the oxide semiconductor and heat treatment is performed, oxygen can be supplied from the insulator to the oxide semiconductor so as to reduce oxygen vacancies and V$_O$H. Note that too much oxygen supplied to the source region or the drain region might cause a decrease in the on-state current or the field-effect mobility of the transistor 200. Furthermore, a variation in the amount of oxygen supplied to the source region or the drain region on the substrate plane leads to variable characteristics of the semiconductor device including the transistor.

Hence, the region 230bc functioning as the channel formation region in the oxide semiconductor is preferably an i-type or substantially i-type region with a low carrier concentration, whereas the regions 230ba and 230bb functioning as the source and drain regions are preferably n-type regions with a high carrier concentration. That is, it is preferable that in the oxide semiconductor, oxygen vacancies and $V_O H$ in the region 230bc be reduced and supply of too much oxygen to the regions 230ba and 230bb be prevented.

Thus, in this embodiment, microwave treatment is performed in an atmosphere containing oxygen in a state where the conductor 242a and the conductor 242b are provided over the oxide 230 so that oxygen vacancies and $V_O H$ in the region 230bc are reduced. Here, the microwave treatment refers to, for example, treatment using an apparatus including a power source that generates high-density plasma with use of a microwave. Note that in this specification and the like, a microwave refers to an electromagnetic wave having a frequency from 300 MHz to 300 GHz, inclusive in some cases.

The microwave treatment in an oxygen-containing atmosphere converts an oxygen gas into plasma using a microwave or a high-frequency wave such as RF and activates the oxygen plasma. At this time, the region 230bc can be irradiated with the microwave or the high-frequency wave such as RF. By the effect of the plasma, the microwave, or the like, $V_O H$ in the region 230bc can be divided into oxygen vacancy ($V_O$) and hydrogen (H); the hydrogen can be removed from the region 230bc and the oxygen vacancy $V_O$ can be filled with oxygen. That is, the reaction "$V_O H \rightarrow H + V_O$" occurs in the region 230bc, so that the hydrogen concentration in the region 230bc can be reduced. As a result, oxygen vacancies and $V_O H$ in the region 230bc can be reduced to lower the carrier concentration.

In the microwave treatment in an oxygen-containing atmosphere, the effect of the microwave, the high-frequency wave such as RF, the oxygen plasma, and the like is blocked by the conductor 242a and the conductor 242b and does not reach the regions 230ba and 230bb. In addition, the effect of the oxygen plasma can be reduced by the insulator 271, the insulator 275, and the insulator 280 that are provided to cover the oxide 230 and the conductor 242. Hence, a reduction in $V_O H$ and supply of too much oxygen due to the microwave treatment do not occur in the regions 230ba and 230bb, preventing a decrease in carrier concentration therein.

Oxygen supplied into the region 230bc has a variety of forms such as an oxygen atom, an oxygen molecule, an oxygen ion, and an oxygen radical (also referred to as O radical which is an atom, a molecule or an ion having an unpaired electron). The oxygen supplied to the region 230bc preferably has one or more of the above forms. An oxygen radical is particularly preferable.

The microwave treatment is preferably performed in an oxygen-containing atmosphere after the formation of an insulating film to be the insulator 252 and/or after the formation of an insulating film to be the insulator 250. The microwave treatment is performed in an oxygen-containing atmosphere through the insulator 252 and/or the insulator 250, whereby oxygen can be supplied efficiently into the region 230bc. In addition, the insulator 252 is provided to be in contact with the side surface of the conductor 242 and the surface of the region 230bc, whereby an excess amount of oxygen is prevented from being supplied to the region 230bc, and the side surface of the conductor 242 can be prevented from being oxidized. Furthermore, the side surface of the conductor 242 can be prevented from being oxidized when an insulating film to be the insulator 250 is formed.

In the above manner, the amount of oxygen vacancies and $V_O H$ can be selectively removed from the region 230bc in the oxide semiconductor, whereby the region 230bc can be an i-type or substantially i-type region. Furthermore, supply of an excess amount of oxygen to the region 230ba and the region 230bb functioning as the source and drain regions can be inhibited and the n-type regions on which the microwave treatment is performed can be maintained. As a result, a variation in the electrical characteristics of the transistor 200 can be inhibited, and thus variation in the electrical characteristics of the transistors 200 in the substrate plane can be inhibited.

As illustrated in FIG. 1C, a curved surface may be provided between the side and top surfaces of the oxide 230 in a cross-sectional view in the channel width direction of the transistor 200. In other words, the end portion of the side surface and the end portion of the top surface may be curved (rounded).

The radius of curvature of the curved surface is preferably greater than 0 nm and less than the thickness of the oxide 230 in a region overlapping with the conductor 242, or less than half of the length of a region of the top surface of the oxide 230 that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230 with the insulator 252, the insulator 250, the insulator 254, and the conductor 260.

As illustrated in FIG. 1C or the like, the insulator 252 formed using aluminum oxide or the like is provided in contact with the top and side surfaces of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In—Zn oxide. When the proportion of indium atoms in the vicinity of the surface of the oxide 230 is increased in the above manner, the field-effect mobility of the transistor 200 can be improved.

At least one of the insulators 212, 214, 271, 275, 282, 283, and 285 preferably functions as a barrier insulating film that inhibits diffusion of impurities such as water or hydrogen from the substrate side or from above the transistor 200 into the transistor 200. Thus, at least one of the insulators 212, 214, 271, 275, 282, 283, and 285 is preferably formed using an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms, that is, an insulating material through which the impurities are less likely to pass. Alternatively, it is preferable to use an insulating material having a function of inhibiting diffusion of oxygen (e.g., at least one of oxygen atoms, oxygen molecules, and the like), that is, an insulating material through which the oxygen is less likely to pass.

Note that in this specification, a barrier insulating film refers to an insulating film having a barrier property. A barrier property in this specification means a function of inhibiting diffusion of a particular substance (also referred to as a function of less easily transmitting the substance). Alternatively, a barrier property in this specification means a function of capturing or fixing (also referred to as gettering) a particular substance.

An insulator having a function of inhibiting diffusion of oxygen and impurities such as hydrogen and water is preferably used for the insulators 212, 214, 271, 275, 282, 283, and 285, and examples of the insulator includes aluminum oxide, magnesium oxide, hafnium oxide, gallium oxide, indium gallium zinc oxide, silicon nitride, and silicon nitride oxide. For example, silicon nitride, which has a high hydrogen barrier property, is preferably used for the insulators 212, 275, and 283. For example, aluminum oxide or magnesium oxide, which has a function of capturing or fixing more hydrogen, is preferably used for the insulators 214, 271, 282, and 285. Accordingly, impurities such as water and hydrogen can be inhibited from diffusing from the substrate side to the transistor 200 side through the insulators 212 and 214. Furthermore, impurities such as water or hydrogen can be inhibited from diffusing to the transistor 200 side from an interlayer insulating film and the like positioned outside the insulator 285. In addition, oxygen contained in the insulator 224 and the like can be inhibited from diffusing to the substrate side through the insulators 212 and 214. Oxygen contained in the insulator 280 and the like can be inhibited from diffusing to the components over the transistor 200 through the insulator 282 and the like. In this manner, the transistor 200 is preferably surrounded by the insulators 212, 214, 271, 275, 282, 283, and 285, which have a function of inhibiting diffusion of oxygen and impurities such as water or hydrogen.

Here, an oxide having an amorphous structure is preferably used as the insulators 212, 214, 271, 275, 282, 283, and 285. For example, a metal oxide such as AlOx (x is a given number greater than 0) or MgOy (y is a given number greater than 0) is preferably used. In such a metal oxide having an amorphous structure, an oxygen atom has a dangling bond and a property of capturing or fixing hydrogen by the dangling bond. When such a metal oxide having an amorphous structure is used as the component of the transistor 200 or provided in the vicinity of the transistor 200, hydrogen contained in the transistor 200 or hydrogen in the vicinity of the transistor 200 can be captured or fixed. In particular, hydrogen contained in the channel formation region of the transistor 200 is preferably captured or fixed. The metal oxide having an amorphous structure is used as the component of the transistor 200 or provided in the vicinity of the transistor 200, whereby the transistor 200 and the semiconductor device with favorable characteristics and high reliability can be manufactured.

Although the insulators 212, 214, 271, 275, 282, 283, and 285 preferably have an amorphous structure, they may include a region having a polycrystalline structure. Alternatively, the insulators 212, 214, 271, 275, 282, 283, and 285 may have a multilayer structure in which a layer having an amorphous structure and a layer having a polycrystalline structure are stacked. For example, a stacked-layer structure in which a layer with a polycrystalline structure is formed over a layer with an amorphous structure may be employed.

The insulators 212, 214, 271, 275, 282, 283, and 285 can be formed by a sputtering method, for example. Since a sputtering method does not need to use a molecule including hydrogen in a deposition gas, the hydrogen concentrations of the insulators 212, 214, 271, 275, 282, 283, and 285 can be reduced. Note that the deposition method is not limited to a sputtering method, and a CVD method, a molecular beam epitaxy (MBE) method, a pulsed laser deposition (PLD) method, an ALD method, or the like may be used as appropriate.

The resistivity of the insulators 212, 275, and 283 is preferably low in some cases. For example, the insulators 212, 275, and 283 with a resistivity approximately $1\times10^{13}$ Ωcm can sometimes relieve charge buildup of the conductor 205, 242, 260, or 246 in the treatment using plasma or the like in the manufacturing process of a semiconductor device. The resistivity of the insulators 212, 275, and 283 is preferably higher than or equal to $1\times10^{10}$ Ωcm and lower than or equal to $1\times10^{15}$ Ωcm.

The dielectric constants of the insulators 216, 280, and 285 are preferably lower than that of the insulator 214. When a material with a low dielectric constant is used for an interlayer film, the parasitic capacitance generated between wirings can be reduced. For example, for the insulators 216, 280, and 285, silicon oxide, silicon oxynitride, silicon oxide to which fluorine is added, silicon oxide to which carbon is added, silicon oxide to which carbon and nitrogen are added, porous silicon oxide, or the like is used as appropriate.

The conductor 205 is provided to overlap with the oxide 230 and the conductor 260. Here, the conductor 205 is preferably provided to fill an opening formed in the insulator 216. Part of the conductor 205 is embedded in the insulator 214 in some cases.

The conductor 205 includes a conductor 205a and a conductor 205b. The conductor 205a is provided in contact with a bottom surface and a side wall of the opening. The conductor 205b is provided so as to be embedded in a recessed portion formed in the conductor 205a. Here, the top surface of the conductor 205b is substantially level with the top surfaces of the conductor 205a and the insulator 216.

Here, the conductor 205a is preferably formed using a conductive material which has a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 205a is preferably formed using a conductive material having a function of inhibiting diffusion of oxygen (e.g., at least one of oxygen atoms and oxygen molecules).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When a conductive material having a function of inhibiting oxygen diffusion is used for the conductor 205a, a reduction in conductivity of the conductor 205b due to oxidation of the conductor 205b can be inhibited. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride may be used for the conductor 205a.

A conductive material containing tungsten, copper, or aluminum as its main component is preferably used for the conductor 205b. For example, tungsten may be used for the conductor 205b.

The conductor 205 functions as a second gate electrode in some cases. In that case, by changing a potential applied to the conductor 205 independently of a potential applied to the conductor 260, the threshold voltage ($V_{th}$) of the transistor 200 can be controlled. In particular, by applying a negative potential to the conductor 205, $V_{th}$ of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. The insulator 216 with a reduced thickness contains a smaller absolute amount of impurities such as hydrogen, inhibiting the diffusion of the impurity into the oxide 230.

As illustrated in FIG. 1A, the size of the conductor 205 is preferably larger than the size of a region of the oxide 230 that does not overlap with the conductors 242a and 242b. As illustrated in FIG. 1C, it is particularly preferable that the conductor 205 extend beyond the end portion of the oxide 230 in the channel width direction. That is, the conductor 205 and the conductor 260 preferably overlap with each other with the insulator positioned therebetween, in a region beyond the side surface of the oxide 230 in the channel width direction. With this structure, the channel formation region in the oxide 230 can be electrically surrounded by electric fields of the conductor 260 functioning as a first gate electrode and electric fields of the conductor 205 functioning as a second gate electrode. In this specification, such a transistor structure in which the channel formation region is electrically surrounded by the electric fields of the first gate electrode and the second gate electrode is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 200 has normally-off characteristics and the above S-channel structure, the channel formation region can be electrically surrounded. Thus, the transistor 200 can be regarded as having a gate all around (GAA) structure or a lateral gate all around (LGAA) structure. When the transistor 200 has any of an S-channel structure, a GAA structure, and an LGAA structure, the channel formation region formed at the interface between the oxide 230 and the gate insulator or in the vicinity thereof can correspond to the whole of bulk in the oxide 230. Consequently, the density of current flowing in the transistor can be improved, so that the on-state current or the field-effect mobility of the transistor can be increased.

As illustrated in FIG. 1C, the conductor 205 is extended to have a function of a wiring. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the conductors 205a and 205b are stacked as the conductor 205 in the transistor 200, the present invention is not limited thereto. For example, the conductor 205 may have a single-layer structure or a stacked-layer structure of three or more layers.

The insulators 222 and 224 function as a gate insulator.

The insulator 222 preferably has a function of inhibiting diffusion of hydrogen (e.g., at least one of hydrogen atoms, hydrogen molecules, and the like). Moreover, the insulator 222 preferably has a function of inhibiting diffusion of oxygen (e.g., at least one of oxygen atoms, oxygen molecules, and the like). For example, the insulator 222 preferably has a function of inhibiting diffusion of much hydrogen and/or oxygen compared to the insulator 224.

As the insulator 222, an insulator containing an oxide of aluminum and/or an oxide of hafnium, which are insulating materials, is preferably used. As the insulator, aluminum oxide, hafnium oxide, an oxide containing aluminum and hafnium (hafnium aluminate), or the like is preferably used. The insulator 222 formed of such a material functions as a layer that inhibits release of oxygen from the oxide 230 to the substrate side or diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 or the metal oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. The insulator 222 may have a stacked-layer structure including silicon oxide, silicon oxynitride, or silicon nitride over any of these insulators.

The insulator 222 may be formed to have a single-layer structure or a stacked-layer structure using an insulator containing what is called a high-k material such as aluminum oxide, hafnium oxide, hafnium aluminate, tantalum oxide, or zirconium oxide. As miniaturization and high integration of transistors progress, a problem such as leakage current may arise because of a thinner gate insulator. When a high-k material is used for the insulator functioning as a gate insulator, a gate potential at the time of operation of the transistor can be reduced while the physical thickness is maintained. Alternatively, the insulator 222 can be formed using a substance with high dielectric constant, in some cases, such as lead zirconate titanate (PZT), strontium titanate ($SrTiO_3$), or $(Ba,Sr)TiO_3$ (BST).

Silicon oxide, silicon oxynitride, or the like can be used as appropriate for the insulator 224 in contact with the oxide 230.

In a manufacturing process of the transistor 200, the heat treatment is preferably performed with the surface of the oxide 230 exposed. The heat treatment may be performed at a temperature higher than or equal to 100° C. and lower than or equal to 600° C., preferably higher than or equal to 350° C. and lower than or equal to 550° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230 to reduce oxygen vacancies. The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 230 can promote a reaction in which oxygen vacancies in the oxide 230 are filled with supplied oxygen, i.e., a reaction of $V_O+O \rightarrow null$. Furthermore, the supplied oxygen reacts with hydrogen remaining in the oxide 230, so that the hydrogen can be removed as $H_2O$ (dehydration). This can inhibit recombination of hydrogen remaining in the oxide 230 with oxygen vacancies and formation of $V_OH$.

Note that the insulators 222 and 224 may each have a stacked-layer structure of two or more layers. In those cases, without limitation to a stacked-layer structure formed of the same material, a stacked-layer structure formed of different materials may be employed. The insulator 224 may be formed into an island shape overlapping with the oxide 230. In that case, the insulator 275 is in contact with the side surface of the insulator 224 and the top surface of the insulator 222.

The conductor 242a and the conductor 242b are provided in contact with the top surface of the oxide 230. The conductor 242a and the conductor 242b function as the source electrode and the drain electrode of the transistor 200.

For the conductor 242, a nitride containing tantalum, a nitride containing titanium, a nitride containing molybdenum, a nitride containing tungsten, a nitride containing tantalum and aluminum, or a nitride containing titanium and aluminum is preferably used, for example. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or a material that maintains the conductivity even when absorbing oxygen.

Note that hydrogen contained in the oxide 230 or the like diffuses into the conductor 242a or 242b in some cases. In particular, when a nitride containing tantalum is used for the conductors 242a and 242b, hydrogen contained in the oxide 230 or the like is likely to diffuse into the conductor 242a or 242b, and the diffused hydrogen is bonded to nitrogen contained in the conductor 242a or 242b in some cases. That is, hydrogen contained in the oxide 230 or the like is sometimes absorbed by the conductor 242a or 242b.

No curved surface is preferably formed between the side surface and the top surface of the conductor 242. Without the curved surface, the conductor 242 can have a large cross-sectional area in the channel width direction as illustrated in FIG. 1D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least an insulating film functioning as a barrier against oxygen. Thus, the insulator 271 preferably has a function of inhibiting oxygen diffusion. For example, the insulator 271 preferably has a function of inhibiting oxygen diffusion more than the insulator 280. For example, a nitride containing silicon such as silicon nitride may be used for the insulator 271. The insulator 271 preferably has a function of capturing impurities such as hydrogen. In that case, for the insulator 271, a metal oxide with an amorphous structure, for example, an insulator such as aluminum oxide or magnesium oxide may be used. It is particularly preferable to use aluminum oxide having an amorphous structure or amorphous aluminum oxide as the insulator 271 because hydrogen can be sufficiently trapped or fixed in some cases. Accordingly, the transistor 200 and the semiconductor device with favorable characteristics and high reliability can be fabricated.

The insulator 275 is provided to cover the insulator 224, the oxide 230, the conductor 242, and the insulator 271. The insulator 275 preferably has a function of capturing and fixing hydrogen. In that case, the insulator 275 preferably includes an insulator such as silicon nitride or a metal oxide having an amorphous structure (e.g., aluminum oxide or magnesium oxide). Alternatively, for example, a stacked-layer film of aluminum oxide and silicon nitride over the aluminum oxide may be used as the insulator 275.

When the above insulators 271 and 275 are provided, the conductor 242 can be surrounded by the insulators having a barrier property against oxygen. That is, oxygen contained in the insulators 224 and 280 can be prevented from diffusing into the conductor 242. As a result, the conductor 242 can be inhibited from being directly oxidized by oxygen contained in the insulators 224 and 280, so that an increase in resistivity and a reduction in on-state current can be inhibited.

The insulator 252 functions as part of a gate insulator. As the insulator 252, an insulating film functioning as a barrier against oxygen is preferably used. Any of the above-described insulators that can be used for the insulator 282 may be used as the insulator 252. As the insulator 252, an insulator containing an oxide of one or both of aluminum and hafnium is preferably used. For the insulator, aluminum oxide, hafnium oxide, an oxide containing aluminum and hafnium (hafnium aluminate), an oxide containing a hafnium and silicon (hafnium silicate), or the like can be used. In this embodiment, aluminum oxide is used as the insulator 252. In this case, the insulator 252 serves as an insulator containing at least oxygen and aluminum.

As illustrated in FIG. 1C, the insulator 252 is provided in contact with the top and side surfaces of the oxide 230, the side surface of the insulator 224, and the top surface of the insulator 222. In other words, a region where the oxide 230 and the insulator 224 overlap with the conductor 260 is covered with the insulator 252 in a cross section in the channel width direction. With this structure, a release of oxygen in the oxide 230 by the heat treatment or the like can be blocked by the insulator 252 having a barrier property against oxygen. Thus, formation of oxygen vacancies in the oxide 230 can be inhibited. Thus, the amount of oxygen vacancies and $V_OH$ formed in the region 230bc can be reduced. Accordingly, electrical characteristics and reliability of the transistor 200 can be improved.

By contrast, even when the excess amount of oxygen is included in the insulator 280, the insulator 250, or the like, supply of the oxygen to the oxide 230 can be inhibited. Thus, the regions 230ba and 230bb are prevented from being excessively oxidized by supply of the oxygen through the region 230bc; a reduction in on-state current or field-effect mobility of the transistor 200 can be inhibited.

As illustrated in FIG. 1B, the insulator 252 is provided in contact with the side surfaces of the conductor 242 and the insulators 271, 275, and 280. This inhibits formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280, and the like, together with the insulators 254 and 250 and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 252 preferably includes a region having the above-described thickness. The thickness of the insulator 252 is preferably smaller than that of the insulator 250. In that case, at least part of the insulator 252 preferably includes a region having a thickness smaller than that of the insulator 250.

To form the insulator 252 having a small thickness as the above, an ALD method is preferably used for deposition. As the ALD method, a thermal ALD method, in which a precursor and a reactant react with each other only by a thermal energy, a plasma-enhanced ALD (PEALD) method, in which a reactant excited by plasma is used, and the like can be used. The use of plasma is sometimes preferable because deposition at a lower temperature is possible in a PEALD method.

In the ALD method, one atomic layer can be deposited at a time by using self-controllability of atoms. Hence, the ALD method has various advantages such as deposition of an extremely thin film, deposition on a component with a high aspect ratio, deposition of a film with a small number of defects such as pinholes, deposition with excellent coverage, and low-temperature deposition. Therefore, the insulator 252 can be formed on the side surface of the opening formed in the insulator 280 and the like to have a small thickness as the above and to have favorable coverage.

Note that a precursor used in the ALD method sometimes contains impurities such as carbon. Thus, a film formed by the ALD method may contain impurities such as carbon in a larger amount than a film formed by another deposition method. Note that impurities can be quantified by SIMS or XPS.

Note that in the case where the insulator 252 includes a region having the above-described thickness, the defect level relating to the negative-bias stress temperature photodegradation is not limited to the defect level at the interface between the oxide 230 and the insulator 252 but presumably includes the defect level at the interface between the insulator 252 and the insulator 250 or the defect level in the insulator 250.

The insulator 250 functions as part of a gate insulator. The insulator 250 is preferably located in contact with at least part of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. In this case, the insulator 250 includes at least oxygen and silicon.

As in the insulator 224, the concentration of impurities such as water or hydrogen in the insulator 250 is preferably reduced.

The thickness of the insulator 250 is preferably greater than or equal to 0.5 nm and less than or equal to 20 nm, further preferably greater than or equal to 1.0 nm and less than or equal to 15.0 nm. In that case, at least part of the insulator 250 preferably has the thickness described above.

Although FIG. 1B or the like shows a single-layer structure of the insulator 250, the present invention is not limited to this structure, and a stacked-layer structure of two or more layers may be employed. For example, as illustrated in FIG. 6B, the insulator 250 may have a stacked-layer structure including two layers of an insulator 250a and an insulator 250b over the insulator 250a.

Figure 6B:
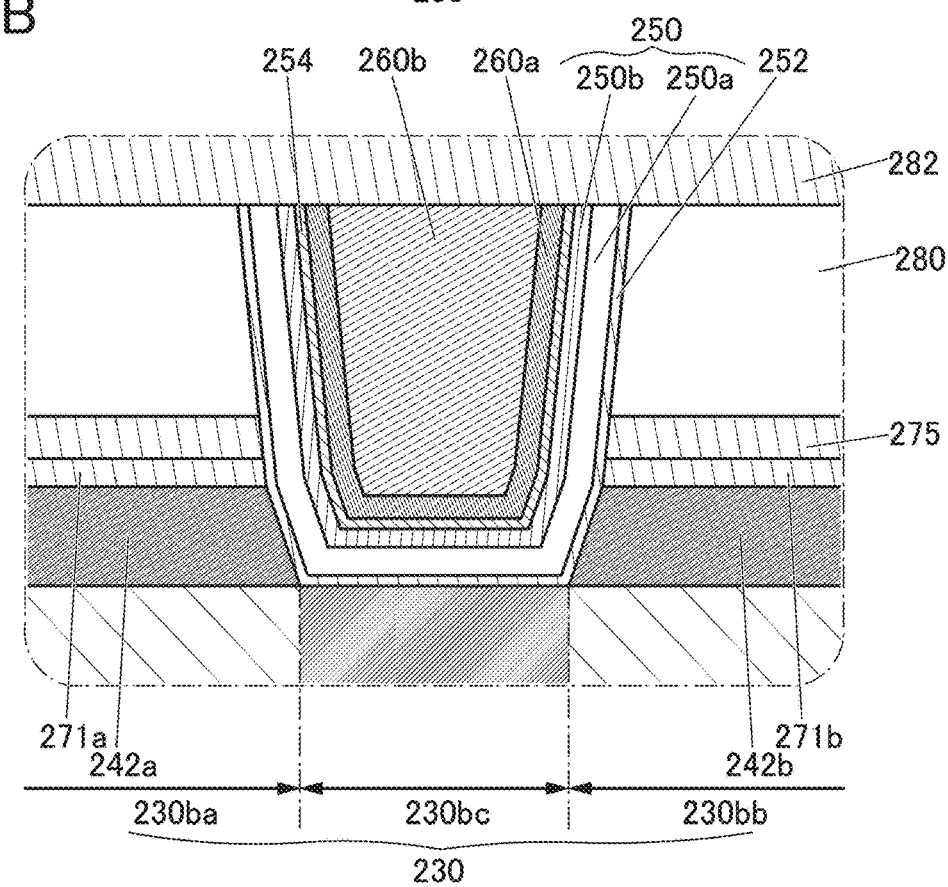
Figure 7A:
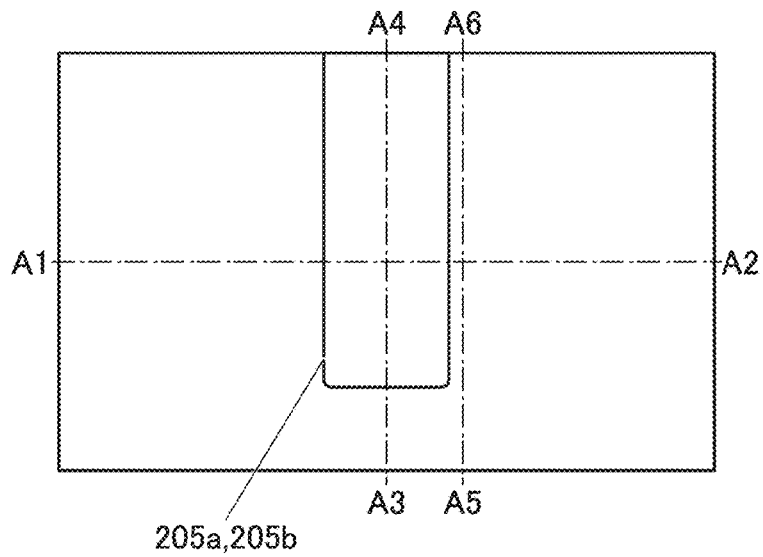
FIG. 7A is a top view illustrating a method for manufacturing a semiconductor device of one embodiment of the present invention.
Figure 7C:
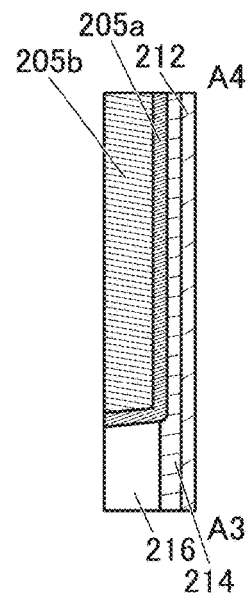
FIGS. 7B to 7D are cross-sectional views illustrating the method for manufacturing a semiconductor device of one embodiment of the present invention.
Figure 7B:
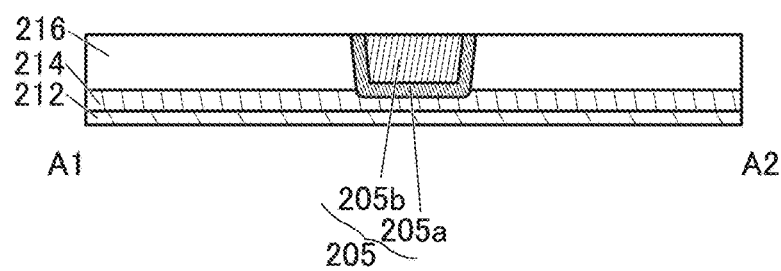
Figure 7D:
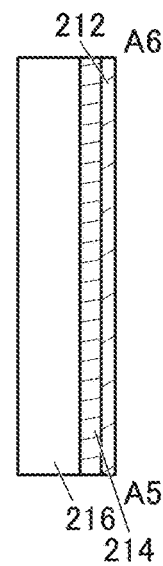
Figure 8A:
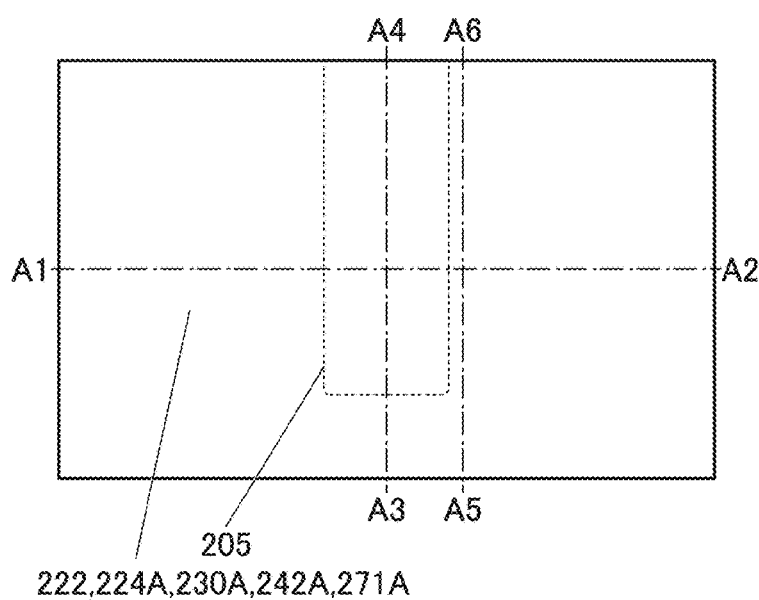
FIG. 8A is a top view illustrating the method for manufacturing a semiconductor device of one embodiment of the present invention.
Figure 8C:
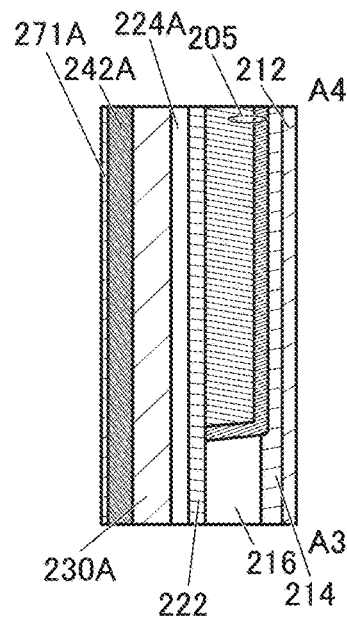
FIGS. 8B to 8D are cross-sectional views illustrating the method for manufacturing a semiconductor device of one embodiment of the present invention.
Figure 8B:
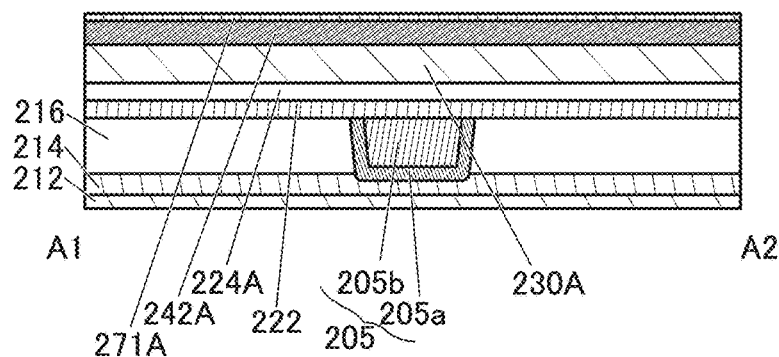
Figure 8D:
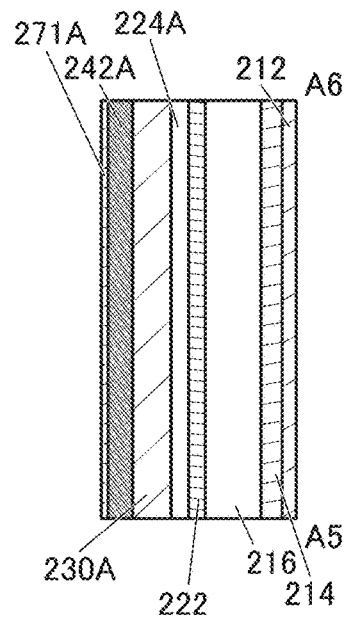

When the insulator 250 has a stacked-layer structure including two layers as illustrated in FIG. 6B, the insulator 250a that is a lower layer is preferably formed using an insulator through which oxygen is easily transmitted, and the insulator 250b that is an upper layer is preferably formed using an insulator having a function of inhibiting diffusion of oxygen. Owing to this structure, diffusion of oxygen contained in the insulator 250a into the conductor 260 can be inhibited. That is, a reduction in the amount of oxygen supplied to the oxide 230 can be inhibited. Moreover, oxidation of the conductor 260 due to oxygen contained in the insulator 250a can be inhibited. For example, the insulator 250a is preferably formed using the above-described material that can be used for the insulator 250, and the insulator 250b is preferably formed using an insulator containing one or both of aluminum oxide and hafnium oxide. For the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b serves as an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250b preferably includes a region having the above-described thickness.

In the case where silicon oxide, silicon oxynitride, or the like is used for the insulator 250a, the insulator 250b may be formed using an insulating material that is a high-k material having a high relative dielectric constant. The gate insulator having a stacked-layer structure of the insulator 250a and the insulator 250b can be thermally stable and can have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced. Therefore, the breakdown voltage of the insulator 250 can be increased.

The insulator 254 functions as part of a gate insulator. As the insulator 254, an insulating film having a barrier property against hydrogen is preferably used. This can prevent diffusion of impurities such as hydrogen contained in the conductor 260 into the insulator 250 and the oxide 230. Any of the above-described insulators that can be used as the insulator 283 is used as the insulator 254. For example, silicon nitride deposited by a PEALD method may be used as the insulator 254. In this case, the insulator 254 serves as an insulator containing at least nitrogen and silicon.

Furthermore, the insulator 254 may have a barrier property against oxygen. In this case, oxygen contained in the insulator 250 can be inhibited from diffusing into the conductor 260.

Furthermore, the insulator 254 needs to be provided in an opening formed in the insulators 252 and 250, the conductor 260, the insulator 280, and the like. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In that case, at least part of the insulator 254 preferably includes a region having the above-described thickness. The thickness of the insulator 254 is preferably smaller than that of the insulator 250. In that case, at least part of the insulator 254 preferably includes a region having the above-described thickness.

The conductor 260 functions as a first gate electrode of the transistor 200. The conductor 260 preferably includes a conductor 260a and a conductor 260b over the conductor 260a. For example, the conductor 260a is preferably positioned so as to cover the bottom and side surfaces of the conductor 260b. Moreover, as illustrated in FIG. 1B and FIG. 1C, the top surface of the conductor 260 is substantially level with the uppermost portions of the insulators 252, 250, and 254. Although FIGS. 1B and 1C show that the conductor 260 has a two-layer structure of the conductor 260a and the conductor 260b, the conductor 260 may have a single-layer structure or a stacked-layer structure of three or more layers.

The conductor 260a is preferably formed using a conductive material having a function of inhibiting diffusion of impurities such as hydrogen atoms, hydrogen molecules, water molecules, nitrogen atoms, nitrogen molecules, nitrogen oxide molecules, and copper atoms. Alternatively, the conductor 260a is preferably formed using a conductive material having a function of inhibiting diffusion of oxygen (e.g., at least one of oxygen atoms and oxygen molecules).

When the conductor 260a has a function of inhibiting diffusion of oxygen, the conductivity of the conductor 260b can be prevented from being lowered because of oxidization of the conductor 260b due to oxygen in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of titanium or titanium nitride and the above conductive material.

In the transistor 200, the conductor 260 is formed in a self-aligned manner so as to fill an opening formed in the insulator 280 and the like. In this manner, the conductor 260 can surely be provided in a region between the conductor 242a and the conductor 242b without alignment.

In the channel width direction of the transistor 200 as illustrated in FIG. 1C, with the level of the bottom surface of the insulator 222 as a reference, the level of a region of the bottom surface of the conductor 260 that does not overlap with the oxide 230 is preferably substantially same level or lower than the level of the bottom surface of the oxide 230. When the conductor 260 functioning as the gate electrode covers the side and top surfaces of the channel formation region of the oxide 230 with the insulator 250 and the like therebetween, the electric field of the conductor 260 is likely to affect the entire channel formation region of the oxide 230. Hence, the transistor 200 can have a higher on-state current and higher frequency characteristics. With the level of the bottom surface of the insulator 222 as a reference, a distance between the bottom surface of the conductor 260 and the bottom surfaces of the oxide 230 in a region where the conductor 260 does not overlap with the oxide 230 is greater than or equal to 0 nm and less than or equal to 100 nm, preferably greater than or equal to 3 nm and less than or equal to 50 nm, and further preferably greater than or equal to 5 nm and less than or equal 30 to 20 nm.

The insulator 280 is provided over the insulator 275, and the opening is formed in the region where the insulators 252, 250, and 254 and the conductor 260 are provided. In addition, the top surface of the insulator 280 may be planarized.

The insulator 280 functioning as the interlayer film preferably has a low dielectric constant. When a material with a low dielectric constant is used for an interlayer film, the parasitic capacitance generated between wirings can be reduced. The insulator 280 is preferably formed using a material similar to that used for the insulator 216, for example. Silicon oxide and silicon oxynitride are particularly preferable because of their thermal stability. Silicon oxide, silicon oxynitride, and porous silicon oxide are particularly preferable because a region containing oxygen that is released by heating can be easily formed in these materials.

The concentration of impurities such as water or hydrogen in the insulator 280 is preferably reduced. For example, an oxide containing silicon such as silicon oxide or silicon oxynitride can be used for the insulator 280 as appropriate.

The insulator 282 preferably functions as a barrier insulating film that inhibits impurities such as water or hydrogen from diffusing into the insulator 280 from the above and also has a function of capturing impurities such as hydrogen. The insulator 282 also preferably functions as a barrier insulating film that inhibits oxygen transmission. As the insulator 282, for example, an insulator such as a metal oxide having an amorphous structure or aluminum oxide can be used. In this case, the insulator 282 serves as an insulator containing at least oxygen and aluminum. The insulator 282, which has a function of capturing impurities such as hydrogen, is provided in contact with the insulator 280 in a region sandwiched between the insulator 212 and the insulator 283, whereby impurities such as hydrogen contained in the insulator 280 and the like can be captured and the amount of hydrogen in the region can be kept constant. It is particularly preferable to use aluminum oxide having an amorphous structure as the insulator 282 because hydrogen can be captured or fixed more effectively in some cases. Accordingly, the transistor 200 and the semiconductor device with favorable characteristics and high reliability can be fabricated.

The insulator 283 functions as a barrier insulating film that inhibits impurities such as water or hydrogen from diffusing into the insulator 280 from the above. The insulator 283 is provided over the insulator 282. The insulator 283 is preferably formed using a nitride containing silicon such as silicon nitride or silicon nitride oxide. For example, silicon nitride deposited by a sputtering method may be used for the insulator 283. When the insulator 283 is formed by a sputtering method, a high-density silicon nitride film can be obtained. To obtain the insulator 283, silicon nitride deposited by a PEALD method or a CVD method may be stacked over silicon nitride deposited by a sputtering method.

The conductor 240 is preferably formed using a conductive material containing tungsten, copper, or aluminum as its main component. The conductors 240a and 240b may have a stacked-layer structure.

In the case where the conductor 240 has a stacked-layer structure, a conductive material having a function of inhibiting transmission of impurities such as water or hydrogen is preferably used as a first conductor located in the vicinity of the insulators 285, 283, 282, 280, 275, and 271. For example, tantalum, tantalum nitride, titanium, titanium nitride, ruthenium, or ruthenium oxide is preferably used. The conductive material having a function of inhibiting transmission of impurities such as water or hydrogen can be used as a single layer or stacked layers. Furthermore, impurities such as water and hydrogen contained in the components above the insulator 283 can be prevented from entering the oxide 230 through the conductor 240.

The insulator 241 can be formed using the insulator that can be used as the insulator 275 or the like. For the insulator 241, for example, an insulator such as silicon nitride, aluminum oxide, or silicon nitride oxide can be used. Since the insulator 241a (241b) is provided in contact with the insulators 283, 282, and 271, impurities such as water or hydrogen contained in the insulator 280 and the like can be prevented from entering the oxide 230 through the conductor 240a (240b). Silicon nitride is particularly preferable because of its high blocking property against hydrogen. Moreover, oxygen contained in the insulator 280 can be inhibited from being absorbed into the conductor 240.

When the insulator 241a and the insulator 241b each have a stacked-layer structure illustrated in FIG. 1B, a first insulator in contact with an inner wall of the opening formed in the insulator 280 and the like and a second insulator on the inner side of the first insulator are preferably formed using a combination of an insulating film functioning as a barrier against oxygen and an insulating film functioning as a barrier against hydrogen.

For example, aluminum oxide deposited by an ALD method and silicon nitride deposited by a PEALD method may be used respectively as the first insulator and the second insulator. With this structure, oxidation of the conductor 240 can be inhibited, and hydrogen can be prevented from entering the conductor 240.

The conductors 246a and 246b functioning as a wiring may be provided in contact with the top surfaces of the conductors 240a and 240b. The conductor 246 is preferably formed using a conductive material containing tungsten, copper, or aluminum as its main component. The conductors 246a and 246b may have a stacked-layer structure, for example, a stacked-layer structure of titanium or titanium nitride and the above conductive material. Note that the conductor may be formed to be embedded in an opening in an insulator.

With the above structure, a semiconductor device with a small variation in transistor characteristics can be provided. A highly reliable semiconductor device can be provided. In addition, a semiconductor device having favorable electrical characteristics can be provided.

<Material for Semiconductor Device>

Materials that can be used for the semiconductor device are described below.

<<Substrate>>

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Another example includes a semiconductor substrate in which an insulator region is provided in the above semiconductor substrate, such as a silicon on insulator (SOI) substrate. Examples of the conductor substrate include a graphite substrate, a metal substrate, an alloy substrate, and a conductive resin substrate. Other examples include a substrate containing a nitride of a metal, a substrate containing an oxide of a metal, an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided over the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

A transistor including a metal oxide can have stable electrical characteristics when surrounded by an insulator having a function of inhibiting transmission of oxygen and impurities such as hydrogen. The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

The insulator functioning as a gate insulator preferably includes a region containing oxygen that is released by heating. For example, silicon oxide or silicon oxynitride that includes a region containing oxygen that is released by heating is provided in contact with the oxide 230 to compensate for the oxygen vacancies in the oxide 230.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even when absorbing oxygen. Alternatively, a semiconductor having high electric conductivity, typified by polycrystalline silicon containing an impurity element such as phosphorus, or silicide such as nickel silicide may be used.

Conductive layers formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Further alternatively, a stacked-layer structure combining a material containing the above metal element, a conductive material containing oxygen, and a conductive material containing nitrogen may be employed.

When an oxide is used for the channel formation region of the transistor, the conductor functioning as the gate electrode preferably has a stacked-layer structure combining a material containing any of the above metal elements and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With use of such a material, hydrogen contained in the metal oxide where the channel is formed can be captured in some cases. Hydrogen entered from a surrounding insulator or the like can also be captured in some cases.

<<Metal Oxide>>

As the oxide 230, a metal oxide functioning as a semiconductor (oxide semiconductor) is preferably used. A metal oxide that can be used for the oxide 230 according to the present invention is described below.

The metal oxide functioning as a semiconductor preferably has a bandgap of 2 eV or more, further preferably 2.5 eV or more. The use of such a metal oxide having a wide bandgap can reduce the off-state current of the transistor.

A metal oxide preferably contains at least indium or zinc. In particular, indium and zinc are preferably contained. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is In-M-Zn oxide, which contains indium, an element M, and zinc is considered. The element M is aluminum, gallium, yttrium, or tin. Other examples that can be used as the element M include boron, titanium, iron, nickel, germanium, zirconium, molybdenum, lanthanum, cerium, neodymium, hafnium, tantalum, tungsten, magnesium, and cobalt. Note that two or more of the above elements can be used in combination as the element M in some cases.

Note that in this specification and the like, a metal oxide containing nitrogen is also referred to as a metal oxide in some cases. In addition, a metal oxide containing nitrogen may be referred to as a metal oxynitride.

<Classification of Crystal Structure>

Amorphous (including a completely amorphous structure), c-axis-aligned crystalline (CAAC), nanocrystalline (nc), cloud-aligned composite (CAC), single-crystal, polycrystalline structures, and the like can be given as examples of a crystal structure of an oxide semiconductor.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the peak of the XRD spectrum of the quartz glass substrate has a bilaterally symmetrical shape. On the other hand, the peak of the XRD spectrum of the In—Ga—Zn oxide film having a crystal structure has a bilaterally asymmetrical shape. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film formed at room temperature. Thus, it is presumed that the In—Ga—Zn oxide film formed at room temperature is in an intermediate state, which is neither a crystal nor polycrystal state nor an amorphous state, and it cannot be concluded that the In—Ga—Zn oxide film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In—Ga—Zn oxide, the CAAC-OS tends to have a layered crystal structure (also referred to as a stacked-layer structure) in which a layer containing indium (In) and oxygen (hereinafter, an In layer) and a layer containing gallium (Ga), zinc (Zn), and oxygen (hereinafter, an (Ga,Zn) layer) are stacked. Indium and gallium can be replaced with each other. Therefore, indium may be contained in the (Ga,Zn) layer. In addition, the gallium may be contained in the In layer. Note that zinc may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm: thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas during deposition is preferably as low as possible. For example, the flow-rate proportion of an oxygen gas in the total deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (s) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, the CAC-OS has a conducting function in part of the material and has an insulating function in another part of the material; as a whole, the CAC-OS has a function of a semiconductor. Separation of the conducting function and the insulating function can maximize each function. Thus, when the CAC-OS is used for a transistor, high on-state current (Ion), high field-effect mobility (p), and excellent switching operation can be achieved.

A transistor including a CAC-OS is highly reliable. Thus, the CAC-OS is suitably used in a variety of semiconductor devices typified by a display device.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

Note that a plurality of crystal structures are included in an oxide semiconductor in some cases. For example, in the case where the oxide semiconductor contains a larger amount of gallium than that of indium, a layered crystal structure and a spinel crystal structure are included in the oxide semiconductor in some cases. The oxide semiconductor in this case includes a CAAC-OS, an nc-OS, a CAAC-OS including a crystal region with a spinel crystal structure, an nc-OS including a crystal region with a layered crystal structure and a crystal region with a spinel crystal structure, and the like.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon. Note that an impurity in an oxide semiconductor refers to, for example, elements other than the main components of the oxide semiconductor. For example, an element with a concentration lower than 0.1 atomic % is regarded as an impurity.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor, which is measured by SIMS, is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the concentration of hydrogen in the oxide semiconductor, which is measured by SIMS, is controlled to be lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

<Method for Manufacturing Semiconductor Device>

Next, a method for manufacturing a semiconductor device of one embodiment of the present invention, which is illustrated in FIGS. 1A to 1D, will be described with reference to FIGS. 7A to 15D.

Note that FIG. 7A, FIG. 8A, FIG. 9A, FIG. 10A, FIG. 11A, FIG. 12A, FIG. 13A, FIG. 14A, FIG. 15A are each a top view. FIG. 7B, FIG. 8B, FIG. 9B, FIG. 10B, FIG. 11B, FIG. 12B, FIG. 13B, FIG. 14B, and FIG. 15B are cross-sectional views taken along the dashed-dotted lines A1-A2 in FIG. 7A, FIG. 8A, FIG. 9A, FIG. 10A, FIG. 11A, FIG. 12A, FIG. 13A, FIG. 14A, and FIG. 15A, which correspond to cross-sectional views in the channel length direction of the transistor 200. FIG. 7C, FIG. 8C, FIG. 9C, FIG. 10C, FIG. 11C, FIG. 12C, FIG. 13C, FIG. 14C, and FIG. 15C are cross-sectional views taken along dashed-dotted lines A3-A4 in FIG. 7A, FIG. 8A, FIG. 9A, FIG. 10A, FIG. 11A, FIG. 12A, FIG. 13A, FIG. 14A, and FIG. 15, which correspond to cross-sectional views in the channel width direction of the transistor 200. FIG. 7D, FIG. 8D, FIG. 9D, FIG. 10D, FIG. 11D, FIG. 12D, FIG. 13D, FIG. 14D, and FIG. 15D are cross-sectional views taken along dashed-dotted lines A5-A6 in FIG. 7A, FIG. 8A, FIG. 9A, FIG. 10A, FIG. 11A, FIG. 12A, FIG. 13A, FIG. 14A, and FIG. 15, which correspond to cross-sectional views in the channel width direction of the transistor 200. For simplification, some components are not illustrated in the top views in FIG. 7A, FIG. 8A, FIG. 9A, FIG. 10A, FIG. 11A, FIG. 12A, FIG. 13A, FIG. 14A, and FIG. 15A.

In the following steps, an insulating material for forming an insulator, a conductive material for forming a conductor, and a semiconductor material for forming a semiconductor can be deposited by a sputtering method, a CVD method, an MBE method, a PLD method, an ALD method, or the like.

Examples of the sputtering method include an RF sputtering method in which a high-frequency power source is used for a sputtering power supply, a DC sputtering method in which a DC power source is used, and a pulsed DC sputtering method in which a voltage is applied while being changed in a pulsed manner. The RF sputtering method is mainly used in the case where an insulating film is formed, and the DC sputtering method is mainly used in the case where a metal conductive film is formed. The pulsed DC sputtering method is mainly used in the case where a compound such as an oxide, a nitride, or a carbide is deposited by a reactive sputtering method.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

A high-quality film can be obtained at a relatively low temperature through a PECVD method. A thermal CVD method does not use plasma and thus causes less plasma damage to an object. For example, a wiring, an electrode, an element (e.g., a transistor or a capacitor), or the like included in a semiconductor device may be charged up by receiving charge from plasma. In that case, accumulated charge may break the wiring, electrode, element, or the like included in the semiconductor device. A thermal CVD method, which does not use plasma, does not cause such plasma damage, and thus can increase the yield of the semiconductor device. A thermal CVD method yields a film with few defects because of no plasma damage during film formation.

As the ALD method, a thermal ALD method, in which a precursor and a reactant react with each other only by a thermal energy, a plasma-enhanced ALD (PEALD) method, in which a reactant excited by plasma is used, and the like can be used.

Methods of CVD and ALD differ from a sputtering method by which particles ejected from a target or the like are deposited. Thus, a CVD method and an ALD method can provide good step coverage, almost regardless of the shape of an object. In particular, an ALD method allows excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another film formation method with a high deposition rate, such as a CVD method.

By a CVD method, a film with a certain composition can be formed by adjusting the flow rate ratio of the source gases. For example, a CVD method enables a film with a gradually-changed composition to be formed by changing the flow rate ratio of the source gases during film formation. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Hence, the productivity of the semiconductor device can be improved in some cases.

An ALD method, with which a plurality of different kinds of precursors are introduced at a time, enables formation of a film with desired composition. In the case where a plurality of different kinds of precursors are introduced, the cycle number of precursor deposition is controlled, whereby a film with desired composition can be formed.

First, a substrate (not illustrated) is prepared, and the insulator 212 is formed over the substrate (see FIGS. 7A to 7D). The insulator 212 is preferably formed by a sputtering method. Since a molecule containing hydrogen is not used as a deposition gas in the sputtering method, the concentration of hydrogen in the insulator 212 can be reduced. Note that the insulator 212 can be formed by a CVD method, an MBE method, a PLD method, an ALD method, or the like as well as the sputtering method.

In this embodiment, as the insulator 212, silicon nitride is deposited by a pulsed DC sputtering method using a silicon target in an atmosphere containing a nitrogen gas. The use of the pulsed DC sputtering can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water or hydrogen are less likely to pass, such as silicon nitride, can inhibit diffusion of impurities such as water or hydrogen contained in a layer under the insulator 212. Even when a metal that is easily diffused, such as copper, is used for a conductor (not illustrated) under the insulator 212, the metal can be inhibited from diffusing into a layer over the insulator 212 through the insulator 212 when an insulator through which copper is less likely to pass, such as silicon nitride, is used as the insulator 212.

Next, the insulator 214 is formed over the insulator 212 (see FIG. 7A to FIG. 7D). The insulator 214 is preferably formed by a sputtering method. Since a molecule containing hydrogen is not used as a deposition gas in the sputtering method, the concentration of hydrogen in the insulator 214 can be reduced. Note that the insulator 214 can be formed by a CVD method, an MBE method, a PLD method, an ALD method, or the like as well as the sputtering method.

In this embodiment, as the insulator 214, aluminum oxide is deposited by a pulsed DC sputtering method using an aluminum target in an atmosphere containing an oxygen gas. The use of the pulsed DC sputtering can achieve more uniform film thickness and improve the sputtering rate and film quality. A radio frequency (RF) power may be applied to the substrate. The amount of oxygen implanted into layers under the insulator 214 can be controlled depending on the amount of the RF power applied to the substrate. The RF power is higher than or equal to 0 W/cm$^2$ and lower than or equal to 1.86 W/cm$^2$. In other words, an appropriate amount of oxygen for the transistor characteristics can be implanted by changing the amount of RF power used for the formation of the insulator 214. Accordingly, an appropriate amount of oxygen for improving the reliability of the transistor can be implanted. The RF frequency is preferably 10 MHz or higher. The typical frequency is 13.56 MHz. The higher the RF frequency is, the less damage to the substrate can be.

A metal oxide having an amorphous structure and an excellent function of capturing or fixing hydrogen, such as aluminum oxide, is preferably used for the insulator 214. Thus, the insulator 214 captures or fixes hydrogen contained in the insulator 216 and the like and prevents the hydrogen from diffusing to the oxide 230. It is particularly preferable to use aluminum oxide having an amorphous structure or amorphous aluminum oxide as the insulator 214 because hydrogen can be effectively trapped or fixed in some cases.

Accordingly, the transistor 200 and the semiconductor device with favorable characteristics and high reliability can be fabricated.

Next, the insulator 216 is formed over the insulator 214. The insulator 216 is preferably formed by a sputtering method. Since a molecule containing hydrogen is not used as a deposition gas in the sputtering method, the concentration of hydrogen in the insulator 216 can be reduced. Note that the insulator 216 can be formed by a CVD method, an MBE method, a PLD method, an ALD method, or the like as well as the sputtering method.

In this embodiment, as the insulator 216, silicon oxide is deposited by a pulsed DC sputtering method using a silicon target in an atmosphere containing an oxygen gas. The use of the pulsed DC sputtering can achieve more uniform film thickness and improve the sputtering rate and film quality.

The insulators 212, 214, and 216 are preferably formed successively without exposure to the air. For example, a multi-chamber film formation apparatus is used. As a result, the amount of hydrogen in the formed insulators 212, 214, and 216 can be reduced, and furthermore, entry of hydrogen in the films between film formation steps can be inhibited.

Then, an opening reaching the insulator 214 is formed in the insulator 216. Examples of the opening include a groove and a slit. A region where the opening is formed may be referred to as an opening portion. Wet etching can be used for the formation of the opening; however, dry etching is preferable for microfabrication. The insulator 214 is preferably an insulator that functions as an etching stopper film when a groove is formed by etching of the insulator 216. For example, in the case where silicon oxide or silicon oxynitride is used as the insulator 216 in which the groove is to be formed, the insulator 214 is preferably silicon nitride, aluminum oxide, or hafnium oxide.

As a dry etching apparatus, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, different high-frequency voltages may be applied to one of the parallel plate electrodes. Further alternatively, high-frequency voltages with the same frequency may be applied to the parallel plate electrodes. Still further alternatively, high-frequency voltages with different frequencies may be applied to the parallel plate electrodes. A dry etching apparatus including a high-density plasma source can be used. As the dry etching apparatus including a high-density plasma source, an inductively coupled plasma (ICP) etching apparatus can be used, for example.

After the formation of the opening, a conductive film to be the conductor 205a is formed. The conductive film preferably contains a conductor that has a function of inhibiting transmission of oxygen. For example, tantalum nitride, tungsten nitride, or titanium nitride can be used. Alternatively, a stacked-layer film of the conductor that has a function of inhibiting transmission of oxygen and tantalum, tungsten, titanium, molybdenum, aluminum, copper, or a molybdenum-tungsten alloy can be used. The conductive film can be formed by a sputtering method, a CVD method, an MBE method, a PLD method, an ALD method, or the like.

In this embodiment, a titanium nitride film is deposited as the conductive film to be the conductor 205a. When such a metal nitride is used for the layer under the conductor 205b described later, oxidation of the conductor 205b by the insulator 216 or the like can be inhibited. Furthermore, even when a metal that is easily diffused, such as copper, is used as the conductor 205b, the metal can be prevented from diffusing from the conductor 205a.

Next, a conductive film to be the conductor 205b is formed. The conductive film can be formed using tantalum, tungsten, titanium, molybdenum, aluminum, copper, a molybdenum-tungsten alloy, or the like. The conductive film can be formed by a plating method, a sputtering method, a CVD method, an MBE method, a PLD method, an ALD method, or the like. In this embodiment, a tungsten film is deposited as the conductive film.

Next, the conductive film to be the conductor 205a and the conductive film to be the conductor 205b are partly removed by CMP treatment to expose the insulator 216 (see FIGS. 7A to 7D). As a result, the conductors 205a and 205b remain only in the opening portion. Note that the insulator 216 is partly removed by the CMP treatment in some cases.

Next, the insulator 222 is formed over the insulator 216 and the conductor 205 (see FIG. 8A to FIG. 8D). The insulator 222 is preferably formed using an insulator containing an oxide of one or both of aluminum and hafnium. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and accordingly oxygen vacancies are less likely to be generated in the oxide 230.

The insulator 222 can be formed by a sputtering method, a CVD method, an MBE method, a PLD method, an ALD method, or the like. In this embodiment, hafnium oxide is formed as the insulator 222 by an ALD method.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in an atmosphere of mixing a nitrogen gas and an oxygen gas, the proportion of the oxygen gas may be approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the insulator 222 and the like as much as possible.

In this embodiment, as the heat treatment, after the formation of the insulator 222, heat treatment at 400° C. for one hour is performed with a flow rate ratio of a nitrogen gas to an oxygen gas that is 4:1. By the heat treatment, impurities such as water or hydrogen included in the insulator 222 can be removed, for example. In the case where an oxide containing hafnium is used as the insulator 222, the heat treatment makes part of the insulator 222 have crystallinity in some cases. The heat treatment can also be performed after the formation of the insulator 224, or the like.

Next, an insulating film 224A is formed over the insulator 222 (FIGS. 8A to 8D). The insulating film 224A can be formed by a sputtering method, a CVD method, an MBE method, a PLD method, an ALD method, or the like. In this embodiment, a silicon oxide film is formed as the insulating film 224A by a sputtering method. Since a molecule containing hydrogen is not used as a deposition gas in the sputtering method, the concentration of hydrogen in the insulating film 224A can be reduced. The hydrogen concentration in the insulating film 224A is preferably reduced because the insulating film 224A is in contact with the oxide 230 in a later step.

Next, an oxide film 230A is formed over the insulating film 224A (see FIG. 8A to FIG. 8D). The oxide film 230A can be formed by a sputtering method, a CVD method, an MBE method, a PLD method, an ALD method, or the like.

For example, in the case where the oxide film 230A is formed by a sputtering method, oxygen or a mixed gas of oxygen and a noble gas is used as a sputtering gas. An increase in the proportion of oxygen in the sputtering gas can increase the amount of excess oxygen contained in the oxide film to be formed. Moreover, when the oxide films are formed by a sputtering method, a target of the In-M-Zn oxide can be used, for example.

When the oxide film 230A is formed by a sputtering method and the proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability. However, one embodiment of the present invention is not limited thereto. When the oxide film 230A is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is being heated, the crystallinity of the oxide film can be improved.

In particular, in the formation of the oxide film 230A, part of oxygen contained in the sputtering gas is supplied to the insulator 224 in some cases. Therefore, the proportion of oxygen in the sputtering gas may be preferably 70% or higher, further preferably 80% or higher, and still further preferably 100%.

Alternatively, it is preferable to employ an ALD method, for example, for formation of the oxide film 230A, in which case a film with a uniform thickness can be formed in a groove or an opening having a large aspect ratio. Employing a PEALD method is preferable because the oxide film 230A can be formed at a lower temperature than the case of employing a thermal ALD method.

In this embodiment, the oxide film 230A is formed by a sputtering method using an oxide target with an atomic ratio of In:Ga:Zn=1:3:4. Note that the oxide film 230A is formed by appropriate conditions of the film formation and the atomic ratio to have characteristics required for the oxide 230.

Note that the insulating film 224A and the oxide film 230A are preferably deposited by a sputtering method without exposure to the air. For example, a multi-chamber film formation apparatus is used. In this manner, hydrogen can be prevented from entering the insulating film 224A and the oxide film 230A during each of film formation steps.

Next, heat treatment is preferably performed. The heat treatment is performed at a temperature higher than or equal to 250° C. and lower than or equal to 650° C., preferably higher than or equal to 400° C. and lower than or equal to 600° C. so that the oxide film 230A does not become polycrystal. The heat treatment is performed in a nitrogen gas atmosphere, an inert gas atmosphere, or an atmosphere containing an oxidizing gas at 10 ppm or more, 1% or more, or 10% or more. For example, in the case where the heat treatment is performed in an atmosphere of mixing a nitrogen gas and an oxygen gas, the proportion of the oxygen gas may be approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the oxide film 230A and the like as much as possible.

In this embodiment, heat treatment at 400° C. for two hours is performed with a flow rate ratio of a nitrogen gas to an oxygen gas that is 4:1. With the heat treatment using the above-described oxygen gas, impurities such as carbon, hydrogen, and water in the oxide film 230A can be reduced. Impurities in the film are reduced in the above manner, whereby the crystallinity of the oxide film 230A can be improved and a dense structure can be obtained. Accordingly, the crystal region in the oxide film 230A can be increased, and in-plane variation in the oxide film 230A can be reduced. Thus, in-plane variation in electrical characteristics of the transistor 200 can be reduced.

Furthermore, the heat treatment using the above-described oxygen gas enables reductions in the density of tail states around the valence band or the density of deep-level states in the oxide film 230A. As a result, the bandgap of the oxide film 230A can be made wider than that before the heat treatment is performed. Alternatively, the number of electrons excited into the conduction band of the oxide film 230A can be reduced. Consequently, degradation in transistor characteristics due to stray light can be reduced.

Next, a conductive film 242A is formed over the oxide film 230A (see FIG. 8A to FIG. 8D). The conductive film 242A can be formed by a sputtering method, a CVD method, an MBE method, a PLD method, an ALD method, or the like. For example, a tantalum nitride film may be deposited as the conductive film 242A by a sputtering method. Note that heat treatment may be performed before the formation of the conductive film 242A. The heat treatment may be performed under a reduced pressure, and the conductive film 242A may be successively formed without exposure to the air. By such treatment, moisture and hydrogen adsorbed on the surface of the oxide film 230A can be removed, and the moisture concentration and the hydrogen concentration in the oxide film 230A can be reduced. The temperature of the heat treatment is preferably higher than or equal to 100° C. and lower than or equal to 400° C. In this embodiment, the temperature of the heat treatment is 200° C.

Next, an insulating film 271A is formed over the conductive film 242A (see FIG. 8A to FIG. 8D). The insulating film 271A can be formed by a sputtering method, a CVD method, an MBE method, a PLD method, an ALD method, or the like. The insulating film 271A is preferably an insulating film having a function of inhibiting the passage of oxygen. For example, an aluminum oxide film or a silicon nitride film is deposited as the insulating film 271A by a sputtering method.

Note that the conductive film 242A and the insulating film 271A are preferably deposited by a sputtering method without exposure to the air. For example, a multi-chamber film formation apparatus is used. As a result, the amount of hydrogen in the formed conductive film 242A and insulating film 271A can be reduced, and furthermore, entry of hydrogen in the films between film formation steps can be inhibited. In the case where a hard mask is provided over the insulating film 271A, a film to be the hard mask is preferably successively deposited without exposure to the air.

Next, the insulating film 224A, the oxide film 230A, the conductive film 242A, and the insulating film 271A are processed into island shapes by a lithography method, so that the insulator 224, the oxide 230, a conductive layer 242B, and an insulating layer 271B are formed (see FIGS. 9A to 9D). The insulator 224, the oxide 230, the conductive layer 242B, and the insulating layer 271B are formed to overlap with the conductor 205 at least partly. The processing can be performed by a dry etching method or a wet etching method. A dry etching method is suitable for microfabrication. The insulating film 224A, the oxide film 230A, the conductive film 242A, and the insulating film 271A may be processed under different conditions.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after or without removal of the resist mask. In the latter case, the resist mask sometimes disappears during the etching. The hard mask may be removed by etching after the etching of the conductive film 242A and the like. The hard mask does not need to be removed when the hard mask material does not affect the following process or can be utilized in the following process. In this embodiment, the insulating layer 271B is used as a hard mask.

Figure 9A:
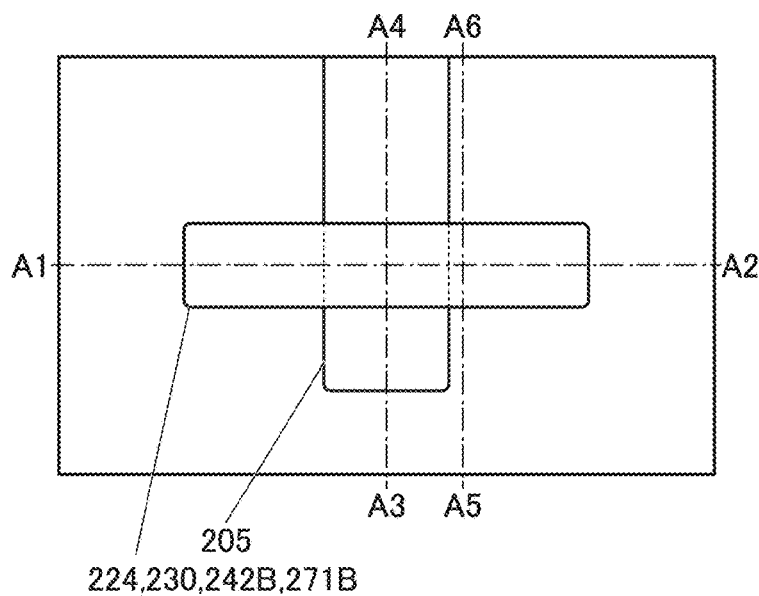
FIG. 9A is a top view illustrating the method for manufacturing a semiconductor device of one embodiment of the present invention.
Figure 9C:
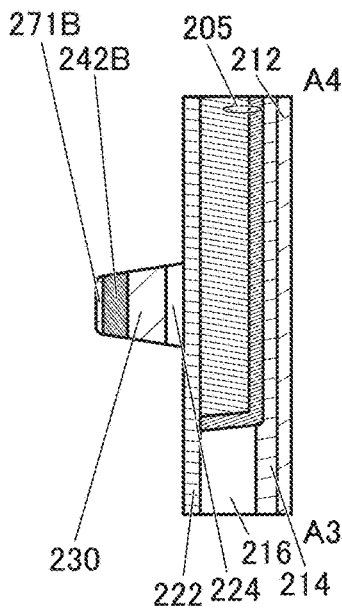
FIGS. 9B to 9D are cross-sectional views illustrating the method for manufacturing a semiconductor device of one embodiment of the present invention.
Figure 9B:
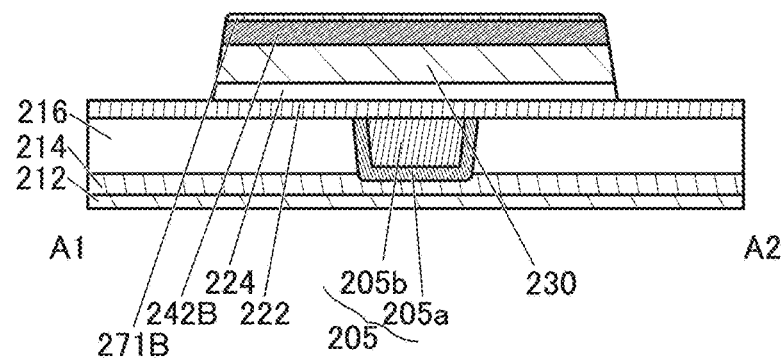
Figure 9D:
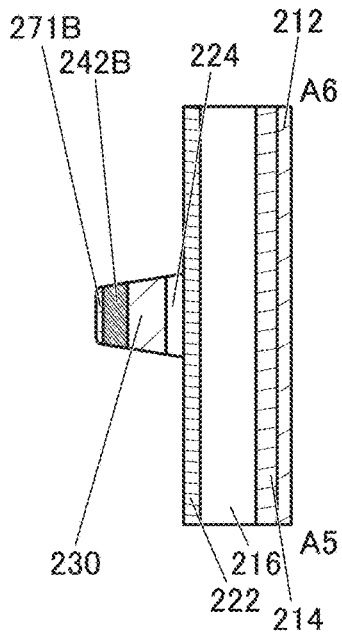
Figure 10A:
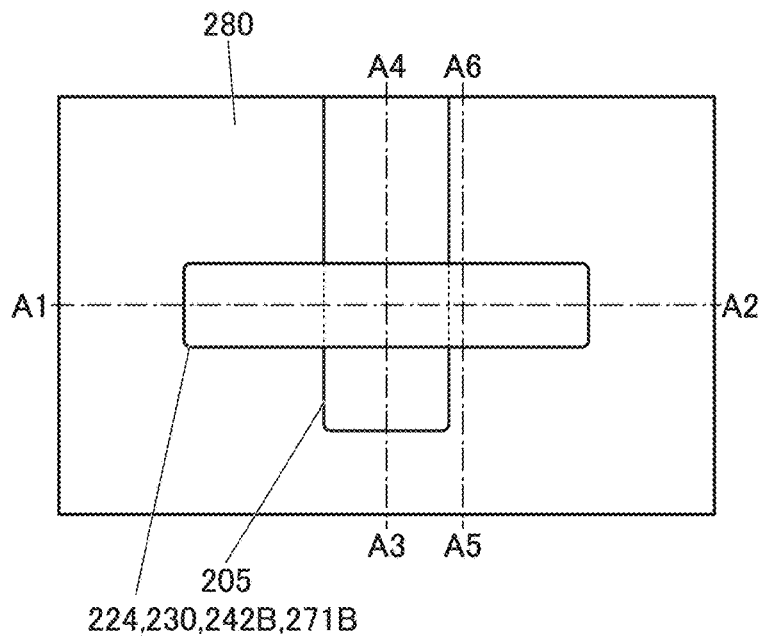
FIG. 10A is a top view illustrating the method for manufacturing a semiconductor device of one embodiment of the present invention.
Figure 10C:
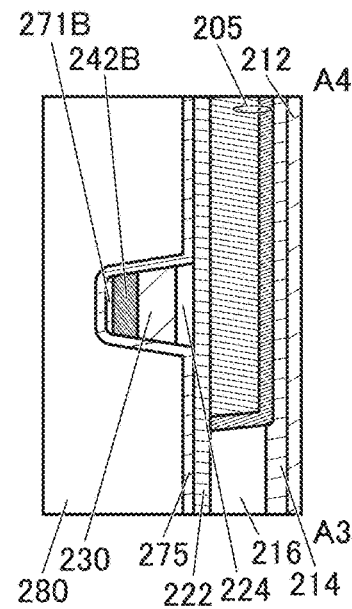
FIGS. 10B to 10D are cross-sectional views illustrating the method for manufacturing a semiconductor device of one embodiment of the present invention.
Figure 10B:
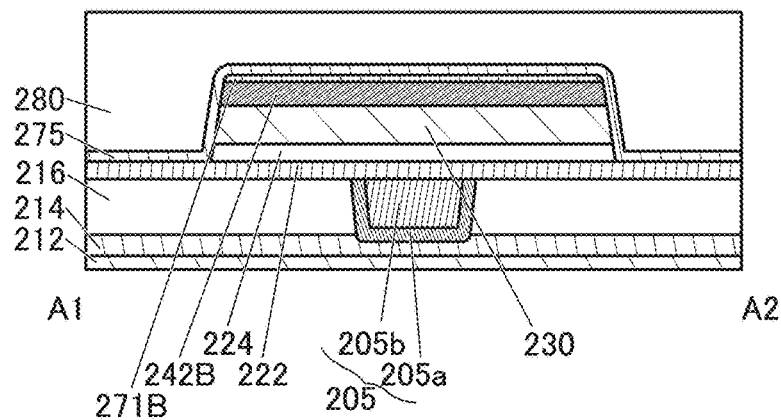
Figure 10D:
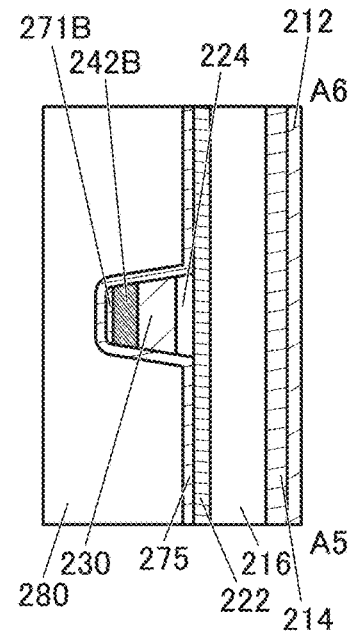

Here, the insulating layer 271B functions as a mask for the conductive layer 242B; thus, as illustrated in FIGS. 9B to 9D, the conductive layer 242B does not have a curved surface between the side surface and the top surface. Thus, end portions at the intersection of the side surface and the top surface of the conductor 242 shown in FIGS. 1B to 1D is angular. The cross-sectional area of the conductor 242 is larger in the case where an end portion at the intersection of the side surface and the top surface of the conductor 242 is angular than in the case where the end portion is rounded. Accordingly, the resistance of the conductor 242 is reduced, so that the on-state current of the transistor 200 can be increased.

Furthermore, as illustrated in FIGS. 9B to 9D, the side surfaces of the insulator 224, the oxide 230, the conductive layer 242B, and the insulating layer 271B may be formed to have tapered shapes. In this specification and the like, a tapered shape indicates a shape in which at least part of a side surface of a structure is inclined to a substrate surface. For example, the angle formed between the inclined side surface and the substrate surface (the angle is also referred to as a taper angle) is preferably less than 90°. Each of the insulator 224, the oxide 230, the conductive layer 242B, and the insulating layer 271B may be processed to have a taper angle greater than or equal to 60° and less than 90°. With such tapered shapes on the side surfaces, the coverage with the insulator 275 and the like can be improved in a later step, so that defects such as a void can be reduced.

Not being limited to the above, the insulator 224, the oxide 230, the conductive layer 242B, and the insulating layer 271B may be processed to have side surfaces that are substantially perpendicular to the top surface of the insulator 222. When the side surfaces are substantially perpendicular to the top surface of the insulator 222, a plurality of the transistors 200 can be provided with high density in a small area.

A by-product generated in the etching step is sometimes formed in a layered manner on the side surfaces of the insulator 224, the oxide 230, the conductive layer 242B, and the insulating layer 271B. In this case, the layered by-product is formed between the insulator 275 and the insulator 224, the oxide 230, the conductive layer 242B, and the insulating layer 271B. Hence, the layered by-product formed in contact with the top surface of the insulator 222 is preferably removed.

Next, the insulator 275 is formed to cover the insulator 224, the oxide 230, the conductive layer 242B, and the insulating layer 271B (see FIGS. 10A to 10D). Here, it is preferable that the insulator 275 be in close contact with the top surface of the insulator 222 and the side surface of the insulator 224. The insulator 275 can be formed by a sputtering method, a CVD method, an MBE method, a PLD method, an ALD method, or the like. The insulator 275 is preferably formed using an insulating film having a function of inhibiting transmission of oxygen. For example, as the insulator 275, aluminum oxide may be deposited by a sputtering method, and silicon nitride may be deposited thereover by a PEALD method. When the insulator 275 has such a stacked-layer structure, the function of inhibiting diffusion of impurities such as water or hydrogen and oxygen is improved in some cases.

In this manner, the oxide 230 and the conductive layer 242B can be covered with the insulator 275 and the insulating layer 271B, which have a function of inhibiting diffusion of oxygen. This structure enables inhabitation of diffusion of oxygen directly from the insulator 280 or the like into the insulator 224, the oxide 230, and the conductive layer 242B in a later step.

Next, an insulating film to be the insulator 280 is formed over the insulator 275. The insulating film can be formed by a sputtering method, a CVD method, an MBE method, a PLD method, an ALD method, or the like. For example, a silicon oxide film may be deposited as the insulating film by a sputtering method. When the insulating film is deposited by a sputtering method in an oxygen-containing atmosphere, the insulator 280 containing excess oxygen can be formed. Since a molecule containing hydrogen is not used as a deposition gas in the sputtering method, the concentration of hydrogen in the insulator 280 can be reduced. Note that heat treatment may be performed before the formation of the insulating film. The heat treatment may be performed under a reduced pressure, and the insulating film may be successively formed without exposure to the air. By such treatment, moisture and hydrogen adsorbed on the surface of the insulator 275 and the like can be removed, and the moisture concentration and the hydrogen concentration in the oxide 230 and the insulator 224 can be reduced. The heat treatment can be performed with the above-described heat treatment conditions.

Next, an insulating film to be the insulator 280 is subjected to CMP treatment, so that the insulator 280 having a flat top surface is formed (see FIGS. 10A to 10D). Note that silicon nitride may be deposited over the insulator 280 by a sputtering method, for example, and then subjected to CMP treatment until the insulator 280 is exposed.

Subsequently, the insulator 280, the insulator 275, the insulating layer 271B, and the conductive layer 242B are partly processed to form an opening reaching the oxide 230. The opening is preferably formed to overlap with the conductor 205. The formation of the opening leads to formation of the insulator 271a, the insulator 271b, the conductor 242a, and the conductor 242b (see FIG. 11A to FIG. 11D).

Figure 11A:
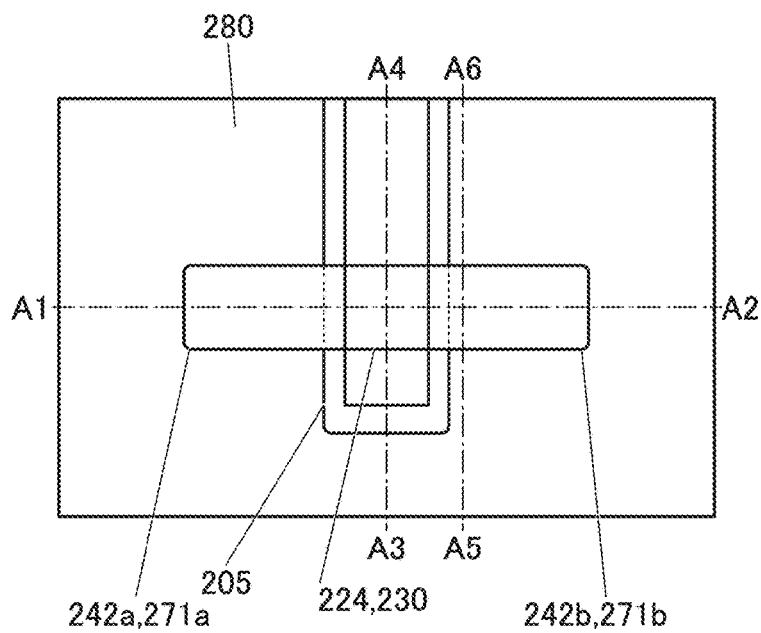
FIG. 11A is a top view illustrating the method for manufacturing a semiconductor device of one embodiment of the present invention.
Figure 11C:
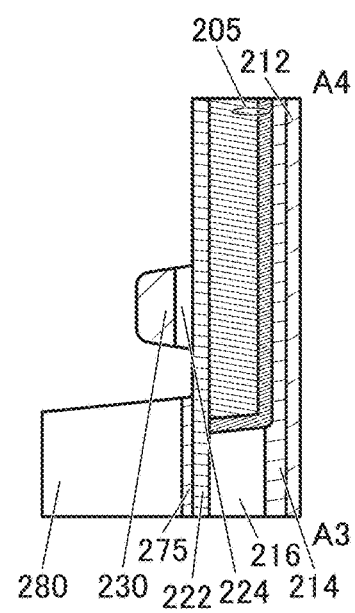
FIGS. 11B to 11D are cross-sectional views illustrating the method for manufacturing a semiconductor device of one embodiment of the present invention.
Figure 11B:
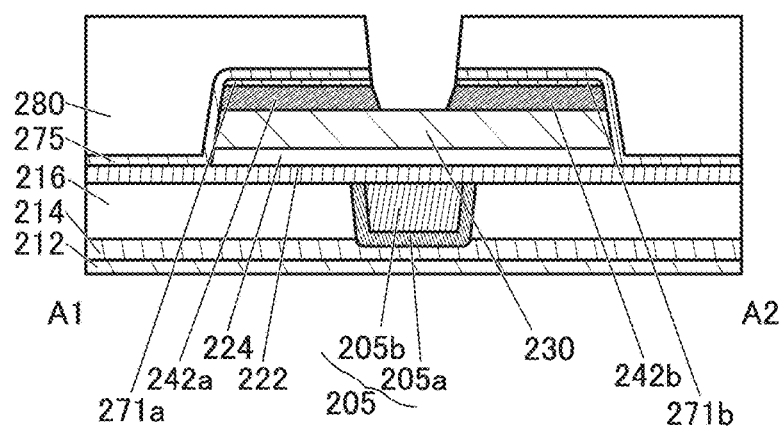
Figure 11D:
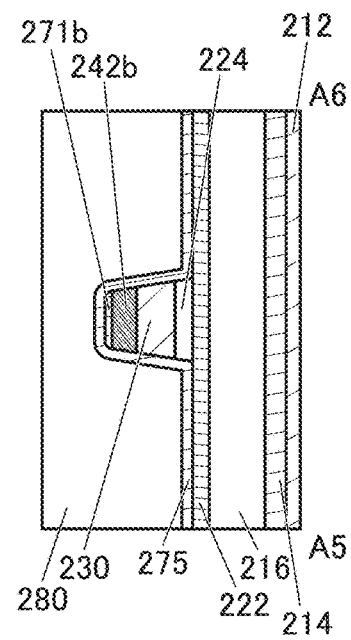

As illustrated in FIGS. 11B and 11C, the side surfaces of the insulators 280, 275, and 271 and the conductor 242 may be tapered. The taper angle of the insulator 280 is larger than that of the conductor 242 in some cases. Although not illustrated in FIGS. 11A to 11C, the upper portion of the oxide 230 is removed in some cases when the opening is formed.

The insulator 280, the insulator 275, the insulating layer 271B, and the conductive layer 242B can be partly processed by a dry etching method or a wet etching method. A dry etching method is suitable for microfabrication. The processing may be performed under different conditions. For example, part of the insulator 280 may be processed by a dry etching method, parts of the insulator 275 and the insulating layer 271B may be processed by a wet etching method, and part of the conductive layer 242B may be processed by a dry etching method.

By the processing, in some cases, impurities are attached to the top and side surfaces of the oxide 230, the side surface of the conductor 242, and the side surface of the insulator 280 and diffuse therein. A step of removing the impurities may be performed. A damaged region is formed on the surface of the oxide 230 by the dry etching in some cases. Such a damaged region may be removed. The impurities result from components contained in the insulator 280, the insulator 275, the insulating layer 271B, and the conductive layer 242B; components contained in a member of an apparatus used to form the opening; and components contained in a gas or a liquid used for etching, for example. Examples of the impurities include hafnium, aluminum, silicon, tantalum, fluorine, and chlorine.

In particular, impurities such as aluminum and silicon hinder the oxide 230 from becoming a CAAC-OS. It is thus preferable to reduce or eliminate impurity elements such as aluminum and silicon, which hinder the oxide from becoming a CAAC-OS. For example, the concentration of aluminum atoms in the oxide 230 and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %. A region of the metal oxide that is hindered from becoming CAAC-OS by the impurity such as aluminum or silicon and results in becoming a-like OS is sometimes referred to as a non-CAAC region. In the non-CAAC region, the density of the crystal structure is reduced to increase $V_OH$; thus, the transistor is likely to be normally on. Hence, the non-CAAC region in the oxide 230 is preferably scaled down or removed.

In contrast, the oxide 230 preferably has a layered CAAC structure. In particular, the CAAC structure preferably reaches a lower edge of a drain in the oxide 230. In the transistor 200, the conductor 242a or the conductor 242b, and the vicinity thereof function as the drain. That is, the oxide 230 in the vicinity of the lower edge of the conductor 242a (the conductor 242b) preferably has the CAAC structure. In this manner, the damaged region is removed and the CAAC structure is formed in the oxide 230 also in the edge portion of the drain, which significantly affects the drain breakdown voltage, so that variations in the electrical characteristics of the transistor 200 can be further inhibited. Moreover, the reliability of the transistor 200 can be improved.

In order to remove the impurities attached to the surface of the oxide 230 in the etching step, cleaning treatment is performed. As the cleaning, any of wet cleaning using a cleaning solution or the like (also referred to as wet etching treatment), plasma treatment using plasma, cleaning by heat treatment, and the like can be performed by itself or in appropriate combination. The cleaning treatment sometimes makes the groove deeper.

The wet cleaning may be performed using an aqueous solution in which ammonia water, oxalic acid, phosphoric acid, hydrofluoric acid, or the like is diluted with carbonated water or pure water; pure water; or carbonated water, for example. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water may be higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230 and the like can be reduced with this frequency.

The cleaning treatment may be performed plural times, and the cleaning solution may be changed in every cleaning treatment. For example, the first cleaning treatment may use diluted hydrofluoric acid or diluted ammonia water and the second cleaning treatment may use pure water or carbonated water.

In this embodiment, as the cleaning, wet cleaning is performed with use of diluted ammonia water. The cleaning treatment allows removing impurities that are attached onto the surfaces of the oxide 230 and the like or diffused into the oxide 230 and the like. Furthermore, the crystallinity of the oxide 230 can be improved.

After the etching or the cleaning, heat treatment may be performed. The heat treatment may be performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230 to reduce oxygen vacancies. In addition, the crystallinity of the oxide 230 can be improved by the heat treatment. The heat treatment may be performed under a reduced pressure. Alternatively, the heat treatment may be performed in such a manner that heat treatment is performed in an oxygen atmosphere, and then another heat treatment is successively performed in a nitrogen atmosphere without exposure to the air.

Figure 12A:
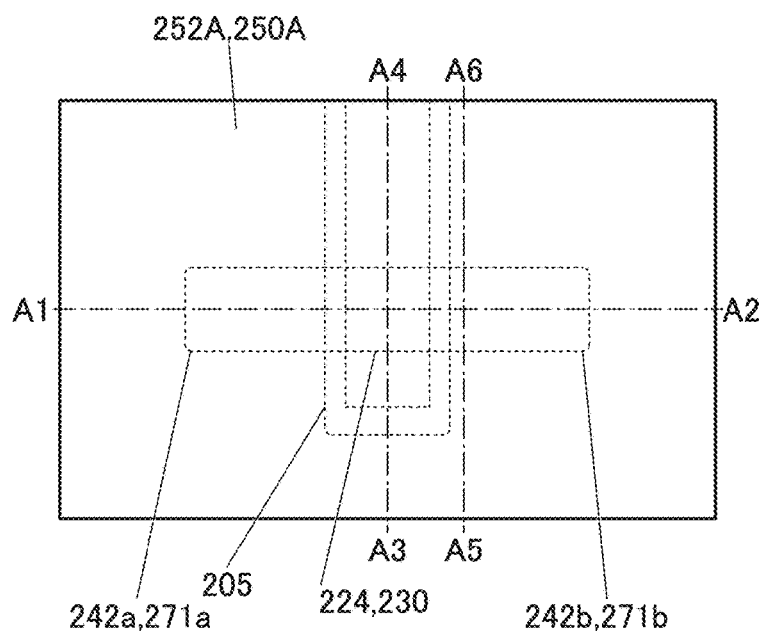
FIG. 12A is a top view illustrating the method for manufacturing a semiconductor device of one embodiment of the present invention.
Figure 12C:
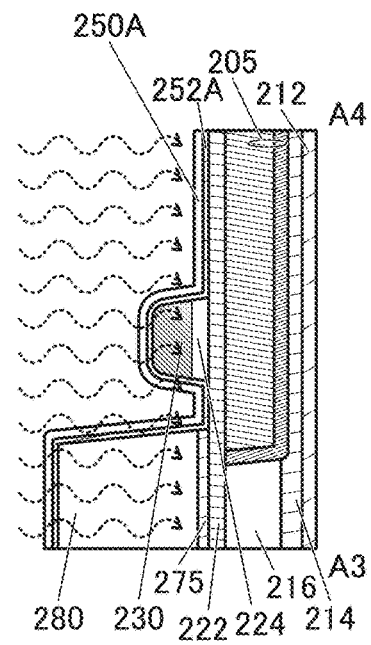
FIGS. 12B to 12D are cross-sectional views illustrating the method for manufacturing a semiconductor device of one embodiment of the present invention.
Figure 12B:
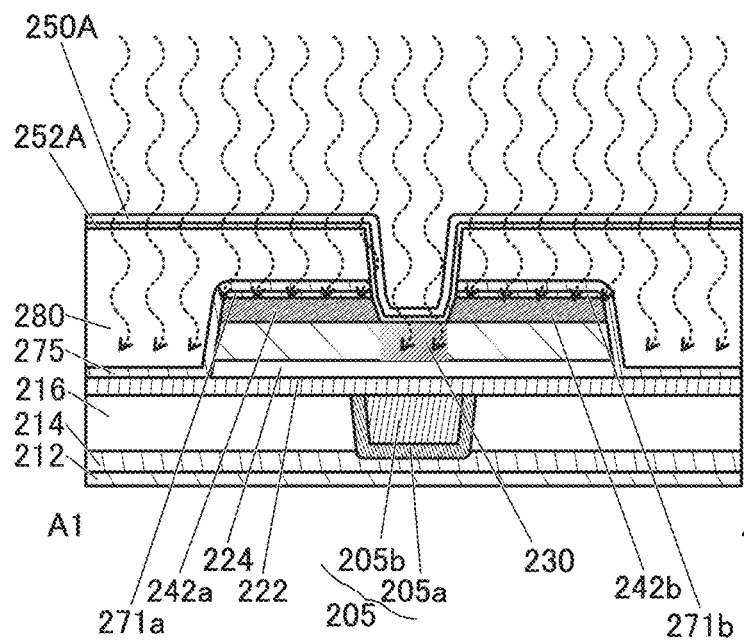

Next, an insulating film 252A is formed (see FIGS. 12A to 12D). The insulating film 252A can be formed by a sputtering method, a CVD method, an MBE method, a PLD method, an ALD method, or the like. The insulating film 252A is preferably formed by an ALD method. As described above, it is preferable to form the insulating film 252A to have a small thickness, and an unevenness of the thickness needs to be reduced. In the ALD method, a precursor and a reactant (such as oxidizer) are alternately introduced to deposit a film, and the film thickness can be adjusted by the number of repetition times of the sequence of the gas introduction; thus, accurate control of the film thickness is possible. Furthermore, as illustrated in FIG. 12B and FIG. 12C, the insulating film 252A needs to be deposited on the bottom surface and the side surface of the opening formed in the insulator 280 and the like so as to have good coverage. In particular, it is preferable that the insulating film 252A be deposited on the top and side surfaces of the oxide 230 and the side surface of the conductor 242 so as to have good coverage. One atomic layer can be deposited at a time on the bottom and side surfaces of the opening, whereby the insulating film 252A can be formed in the opening with good coverage.

When the insulating film 252A is deposited by an ALD method, ozone ($O_3$), oxygen ($O_2$), water ($H_2O$), or the like is used as the oxidizer. When an oxidizer without hydrogen, such as ($O_3$) or ($O_2$), is used, the amount of hydrogen diffusing into the oxide 230 can be reduced.

In this embodiment, an aluminum oxide film is formed as the insulating film 252A by a thermal ALD method.

Next, an insulating film 250A is formed (see FIGS. 12A to 12D). Heat treatment may be performed before the insulating film 250A is formed; it is preferable that the heat treatment be performed under a reduced pressure and the insulating film 250A be successively formed without exposure to the air. The heat treatment is preferably performed in an oxygen-containing atmosphere. By such treatment, moisture and hydrogen adsorbed on the surface of the insulating film 252A and the like can be removed, and the moisture concentration and the hydrogen concentration in the oxide 230 can be reduced. The temperature of the heat treatment is preferably higher than or equal to 100° C. and lower than or equal to 400° C.

The insulating film 250A can be formed by a sputtering method, a CVD method, a PECVD method, an MBE method, a PLD method, an ALD method, or the like. The insulating film 250A is preferably formed by a deposition method using a material in which the number of hydrogen atoms is reduced or hydrogen atoms are removed. This reduces the hydrogen concentration of the insulating film 250A. The hydrogen concentration in the insulating film 250A is preferably reduced because the insulating film 250A becomes the insulator 250 that faces the oxide 230 with the thin insulator 252 sandwiched therebetween.

The insulating film 250A is preferably formed by a CVD method or an ALD method, for example. It is particularly preferable to employ an ALD method, in which case a film with an uniform thickness can be formed in a groove or an opening having a large aspect ratio. It is also preferable to employ a PEALD method, in which case the insulating film 250A can be formed at a lower temperature than the case of employing a thermal ALD method.

When the insulating film 250A is formed by a PEALD method, a gas containing an organic such as bis(diethylamino)silane (BDEAS: $SiH_2[N(C_2H_5)_2]_2$) or tris(diethylamino)silane (3DMAS: $SiH[N(CH_3)_2]_3$) can be used as a precursor. Alternatively, the precursor may be a gas containing silicon and no hydrocarbon (also referred to as an inorganic precursor), such as $SiH_4$, $Si_2H_6$, $SiF_4$, $SiCl_4$, $SiBr_4$, $SiH_2Cl_2$, or $SiH_2I_2$. As an oxidation gas, $O_2$, $N_2O$, $CO_2$, $O_3$, $NO_2$, $H_2O$, or the like can be used. As the oxidation gas, $O_2$ or $N_2O$ is much preferable when a PEALD method is employed. Alternatively, a noble gas such as helium, neon, argon, krypton, or xenon may be added to the oxidation gas.

For example, the insulating film 250A is preferably formed by a PEALD method with use of BDEAS as a precursor and a mixed gas of $O_2$ and argon as an oxidizer. Use of an oxidation gas not containing a nitrogen atom enables the nitrogen concentration in the insulating film 250A to be reduced in some cases.

In this embodiment, the insulating film 250A is formed by a PEALD method.

Next, it is preferable to perform microwave treatment in an atmosphere containing oxygen (see FIGS. 12A to 12D).

Figure 12D:
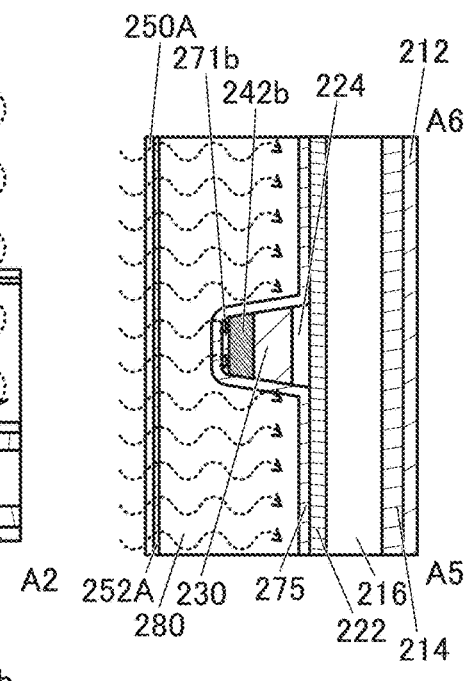
Figure 13A:
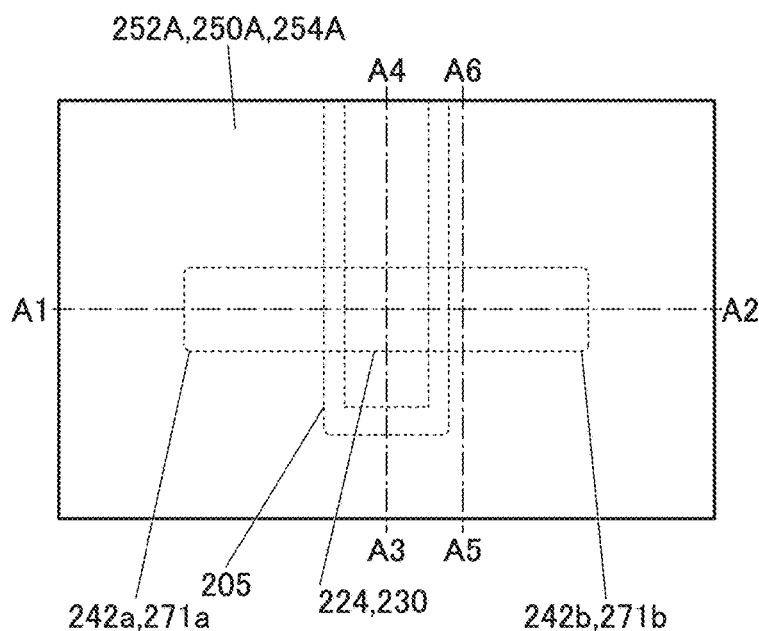
FIG. 13A is a top view illustrating the method for manufacturing a semiconductor device of one embodiment of the present invention.
Figure 13B:
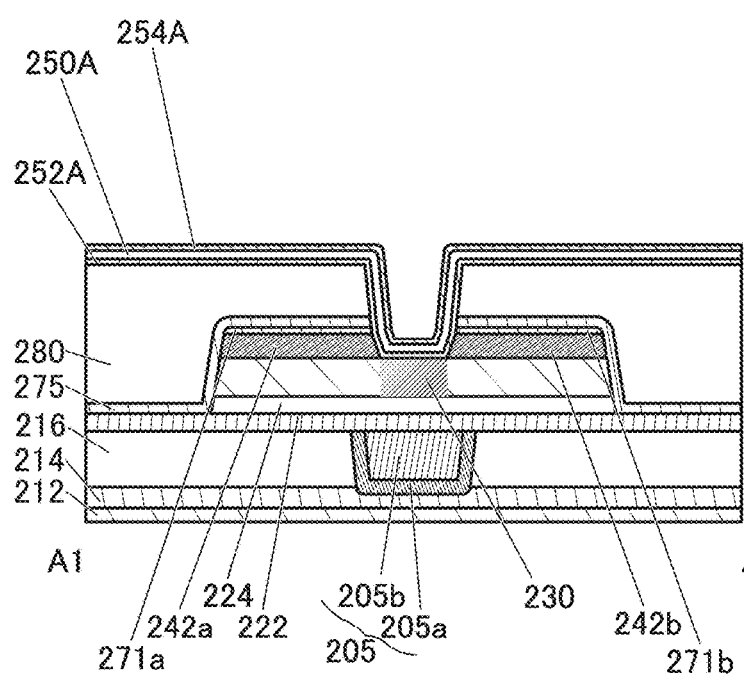
FIGS. 13B to 13D are cross-sectional views illustrating the method for manufacturing a semiconductor device of one embodiment of the present invention.
Figure 13C:
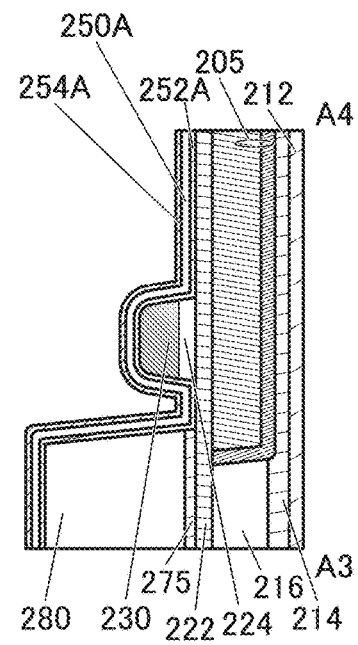
Figure 13D:
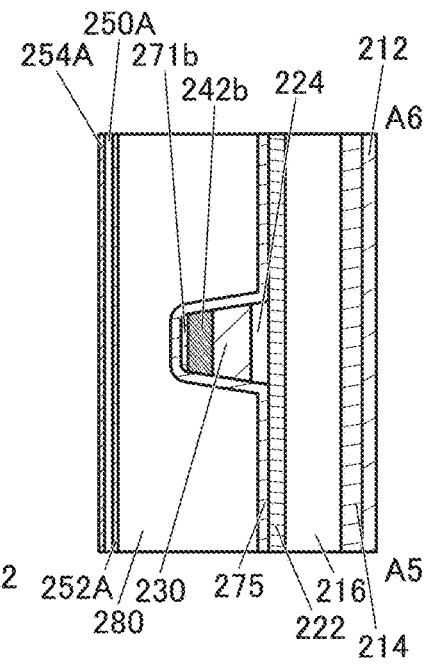
Figure 14A:
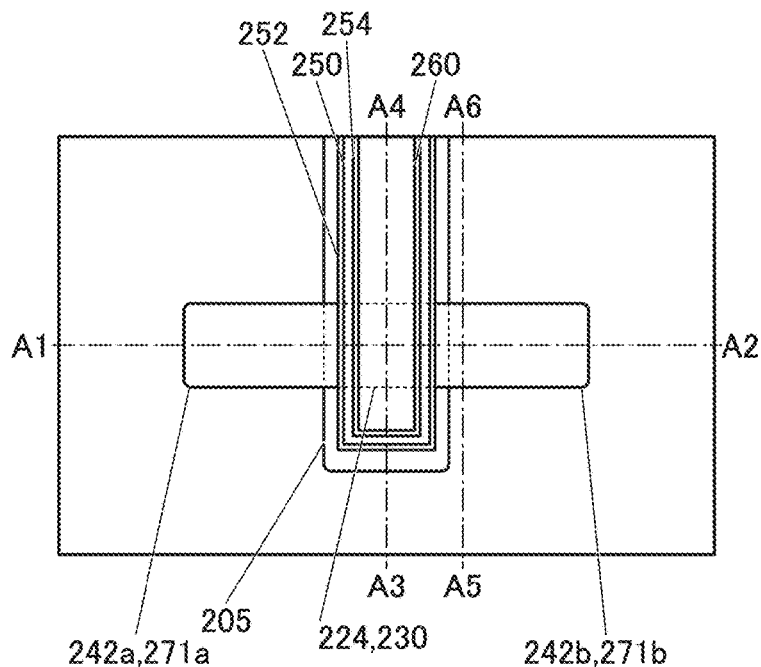
FIG. 14A is a top view illustrating the method for manufacturing a semiconductor device of one embodiment of the present invention.
Figure 14C:
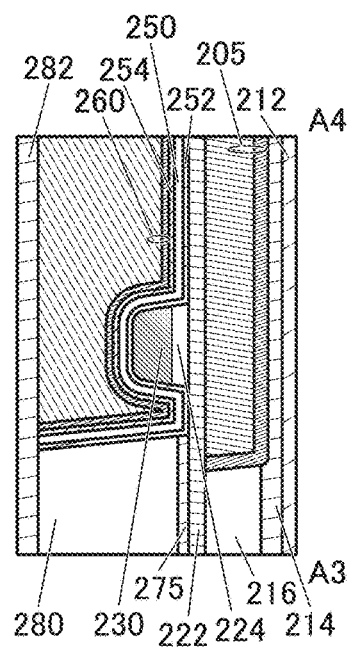
FIGS. 14B to 14D are cross-sectional views illustrating the method for manufacturing a semiconductor device of one embodiment of the present invention.
Figure 14B:
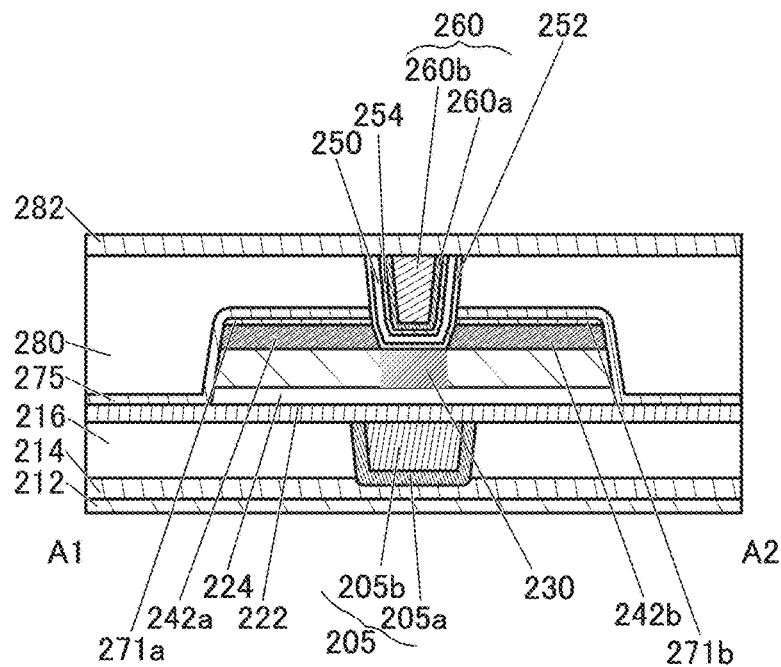
Figure 14D:
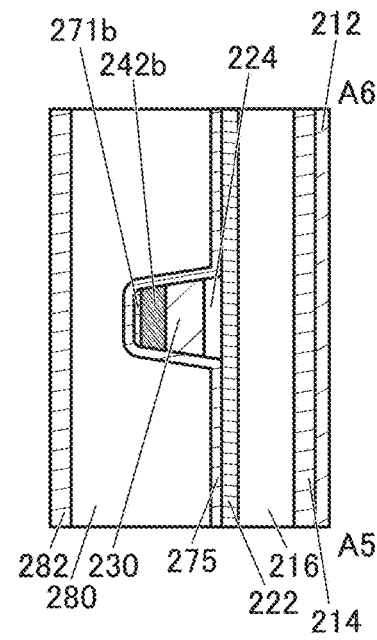

Here, dotted lines in FIG. 12B to FIG. 12D indicate microwaves, high-frequency waves such as RF, oxygen plasma, oxygen radicals, or the like. The microwave treatment is preferably performed with a microwave treatment apparatus including a power source for generating high-density plasma using microwaves, for example. Here, the frequency of the microwave treatment apparatus is set to greater than or equal to 300 MHz and less than or equal to 300 GHz, preferably greater than or equal to 2.4 GHz and less than or equal to 2.5 GHz, for example, 2.45 GHz. Oxygen radicals at a high density can be generated with high-density plasma. The electric power of the power source that applies microwaves of the microwave treatment apparatus is set to higher than or equal to 1000 W and lower than or equal to 10000 W, preferably higher than or equal to 2000 W and lower than or equal to 5000 W. A power source may be provided to the microwave treatment apparatus to apply RF to the substrate side. Furthermore, application of RF to the substrate side allows oxygen ions generated by the high-density plasma to permeate the oxide 230 efficiently.

The microwave treatment is preferably performed under reduced pressure, and the pressure may be higher than or equal to 10 Pa and lower than or equal to 1000 Pa, preferably higher than or equal to 300 Pa and lower than or equal to 700 Pa. The treatment temperature is lower than or equal to 750° C., preferably lower than or equal to 500° C., and may be approximately 400° C., for example. The oxygen plasma treatment can be followed successively by heat treatment without exposure to air. For example, the temperature may be higher than or equal to 100° C. and lower than or equal to 750° C., preferably higher than or equal to 300° C. and lower than or equal to 500° C.

Furthermore, the microwave treatment is performed using an oxygen gas and an argon gas, for example. Here, the oxygen flow rate ratio ($O_2/O_2+Ar$) is higher than 0% and lower than or equal to 100%. The oxygen flow rate ratio ($O_2/O_2+Ar$) is preferably higher than 0% and lower than or equal to 50%. The oxygen flow rate ratio ($O_2/O_2+Ar$) is further preferably higher than or equal to 10% and lower than or equal to 40%. The oxygen flow rate ratio ($O/O_2+Ar$) is still further preferably higher than or equal to 10% and lower than or equal to 30%. The carrier concentration in the region 230bc can be reduced by thus performing the microwave treatment in an atmosphere containing oxygen. In addition, the carrier concentrations in the region 230ba and the region 230bb can be prevented from being excessively reduced by preventing an excessive amount of oxygen from being introduced into the chamber in the microwave treatment.

The microwave treatment in an oxygen-containing atmosphere converts oxygen gas into plasma using a microwave or a high-frequency wave such as RF, and applies the oxygen plasma to a region of the oxide 230 that is between the conductor 242a and the conductor 242b as illustrated in FIGS. 12B to 12D. At this time, the region 230bc can be irradiated with the microwave or the high-frequency wave such as RF. In other words, the microwave, the high-frequency wave such as RF, the oxygen plasma, and the like can be applied to the region 230c illustrated in FIG. 6A. The effect of the plasma, the microwave, and the like enables $V_OH$ in the region 230bc to be cut off, and hydrogen (H) to be removed from the region 230bc. That is, the reaction "$V_OH \rightarrow H+V_O$" occurs in the region 230bc, so that the $V_OH$ in the region 230bc can be reduced. As a result, oxygen vacancies and $V_OH$ in the region 230bc can be reduced to lower the carrier concentration. In addition, oxygen radicals generated by the oxygen plasma or oxygen contained in the insulator 250 can be supplied to oxygen vacancies formed in the region 230bc, thereby further reducing oxygen vacancies and lowering the carrier concentration in the region 230bc.

By contrast, the conductor 242a and the conductor 242b are provided over the region 230ba and the region 230bb illustrated in FIG. 6A. The conductor 242 preferably functions as a blocking film preventing the effect caused by the microwave, the high-frequency wave such as RF, the oxygen plasma, or the like in the microwave treatment in an atmosphere containing oxygen. Therefore, the conductor 242 preferably has a function of blocking an electromagnetic wave greater than or equal to 300 MHz and less than or equal to 300 GHz, for example, greater than or equal to 2.4 GHz and less than or equal to 2.5 GHz.

As illustrated in FIGS. 12B to 12D, the effects of the microwave, the high-frequency wave such as RF, the oxygen plasma, and the like are blocked by the conductor 242a and the conductor 242b, and thus, are not applied to the region 230ba and the region 230bb. Hence, a reduction in $V_OH$ and supply of too much oxygen due to the microwave treatment do not occur in the region 230ba and the region 230bb, preventing a decrease in carrier concentration therein.

Furthermore, the insulator 252 having a barrier property against oxygen is provided in contact with the side surfaces of the conductor 242a and the conductor 242b. Thus, formation of oxide films on the side surfaces of the conductor 242a and the conductor 242b by the microwave treatment can be inhibited.

In the above manner, oxygen vacancies and $V_OH$ can be selectively removed from the region 230bc in the oxide semiconductor, whereby the region 230bc can be an i-type or substantially i-type region. Furthermore, supply of an excess amount of oxygen to the region 230ba and the region 230bb functioning as the source region and the drain region can be inhibited and the n-type regions before the microwave treatment can be maintained. As a result, a change in the electrical characteristics of the transistor 200 can be inhibited, and thus variation in the electrical characteristics of the transistors 200 in the substrate plane can be inhibited.

In the microwave treatment, thermal energy is directly transmitted to the oxide 230 in some cases owing to an electromagnetic interaction between the microwave and a molecule in the oxide 230. The oxide 230 might be heated by this thermal energy. Such heat treatment is sometimes referred to as microwave annealing. When microwave treatment is performed in an atmosphere containing oxygen, an effect equivalent to that of oxygen annealing might be obtained. In the case where hydrogen is contained in the oxide 230, it is probable that the thermal energy is transmitted to the hydrogen in the oxide 230 and the hydrogen activated by the energy is released from the oxide 230.

In the case where the insulator 250 has a two-layer structure as illustrated in FIG. 6B, an insulating film to be the insulator 250b is formed after the formation of the insulating film 250A. The insulating film can be formed by a sputtering method, a CVD method, an MBE method, a PLD method, an ALD method, or the like. The insulating film preferably has a function of inhibiting the diffusion of oxygen. Owing to this structure, the diffusion of oxygen contained in the insulator 250a into the conductor 260 can be inhibited. That is, a reduction in the amount of oxygen supplied to the oxide 230 can be inhibited. Moreover, oxidation of the conductor 260 due to oxygen contained in the insulator 250a can be inhibited. For example, the insulating film can be formed using a material similar to that used for the insulator 222. For example, the hafnium oxide film may be formed by a thermal ALD method as the insulating film.

The microwave treatment may be performed after the insulating film 252A is formed (before the insulating film 250A is formed) under the conditions for microwave treatment performed after the formation of the insulating film 250A. Furthermore, the microwave treatment performed after the formation of the insulating film 250A may be omitted and the microwave treatment may be performed after the formation of the insulating film 252A. In the case where the insulating film to be the insulator 250b is provided as described above, microwave treatment may be performed after the formation of the insulating film. In this case, the microwave treatment may be performed under the conditions for microwave treatment performed after the formation of the insulating film 250A. Furthermore, the microwave treatment performed after the formation of the insulating film 252A and/or the insulating film 250A may be omitted, and the microwave treatment may be performed after the formation of the insulating film to be the insulator 250b.

Heat treatment with the reduced pressure being maintained may be performed at one or a plurality of timings after the formation of the insulating film 252A, after the formation of the insulating film 250A, and after the formation of the insulating film to be the insulator 250b. Such treatment enables hydrogen in the insulating film 252A, the insulating film 250A, the insulating film to be the insulator 250b, and the oxide 230 to be removed efficiently. Some hydrogen may be gettered by the conductor 242. It is possible to repeat the step of performing heat treatment with the reduced pressure being maintained after the microwave treatment. The repetition of the heat treatment enables hydrogen in the insulating film 252A, the insulating film 250A, the insulating film to be the insulator 250b, and the oxide 230 to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230 and the like are sufficiently heated by the microwave annealing.

The microwave treatment improves the film quality of the insulating film 252A, the insulating film 250A, and the insulating film to be the insulator 250b, which can lead to inhibition of diffusion of hydrogen, water, impurities, and the like. Accordingly, hydrogen, water, impurities, and the like can be inhibited from diffusing into the oxide 230 and the like through the insulator 252 in the following step such as formation of a conductive film to be the conductor 260 or the following treatment such as heat treatment.

Next, an insulating film 254A is formed (see FIGS. 13A to 13D). The insulating film 254A can be formed by a sputtering method, a CVD method, an MBE method, a PLD method, an ALD method, or the like. The insulating film 254A is preferably formed by an ALD method, like the insulating film 252A. By an ALD method, the insulating film 254A can be formed to have small thickness and good coverage. In this embodiment, a silicon nitride film is formed as the insulating film 254A by a PEALD method.

Next, a conductive film to be the conductor 260a and a conductive film to be the conductor 260b are deposited in this order. The conductive film to be the conductor 260a and the conductive film to be the conductor 260b can be formed by a sputtering method, a CVD method, an MBE method, a PLD method, an ALD method, or the like. In this embodiment, a titanium nitride film is deposited as the conductive film to be the conductor 260a by an ALD method, and a tungsten film is deposited as the conductive film to be the conductor 260b by a CVD method.

Next, the insulating film 252A, the insulating film 250A, the insulating film 254A, the conductive film to be the conductor 260a, and the conductive film to be the conductor 260b are polished by CMP treatment until the insulator 280 is exposed, whereby the insulator 252, the insulator 250, the insulator 254, and the conductor 260 (the conductor 260a and the conductor 260b) are formed (see FIG. 14A to FIG. 14D). Thus, the insulator 252 is positioned to cover the opening reaching the oxide 230. The conductor 260 is positioned to fill the opening with the insulator 252, the insulator 250, and the insulator 254 placed therebetween.

Then, heat treatment may be performed under conditions similar to those of the above heat treatment. In this embodiment, the heat treatment is performed at 400° C. in a nitrogen atmosphere for one hour. The heat treatment can reduce the moisture concentration and the hydrogen concentration in the insulators 250 and 280. The insulator 282 can be formed successively after the heat treatment without exposure to the air.

Next, the insulator 282 is formed over the insulator 252, the insulator 250, the insulator 254, the conductor 260, and the insulator 280 (see FIG. 14A to FIG. 14D). The insulator 282 can be formed by a sputtering method, a CVD method, an MBE method, a PLD method, an ALD method, or the like. The insulator 282 is preferably formed by a sputtering method. Since a molecule containing hydrogen is not used as a deposition gas in the sputtering method, the concentration of hydrogen in the insulator 282 can be reduced.

In this embodiment, as the insulator 282, aluminum oxide is deposited by a pulsed DC sputtering method using an aluminum target in an atmosphere containing an oxygen gas. The use of the pulsed DC sputtering can achieve more uniform film thickness and improve the sputtering rate and film quality.

Forming the insulator 282 in an atmosphere containing oxygen by a sputtering method can provide oxygen to the insulator 280 during the formation. Thus, excess oxygen can be contained in the insulator 280. The formation of the insulator 282 is preferably performed while the substrate is heated.

Next, the insulator 283 is formed over the insulator 282. The insulator 283 can be formed by a sputtering method, a CVD method, an MBE method, a PLD method, an ALD method, or the like. The insulator 283 is preferably formed by a sputtering method. Since a molecule containing hydrogen is not used as a deposition gas in the sputtering method, the concentration of hydrogen in the insulator 283 can be reduced. The insulator 283 may have a multilayer structure. For example, silicon nitride may be deposited by a sputtering method and another silicon nitride may be deposited by an ALD method over the silicon nitride. Forming the insulator 283 having a high barrier property over the transistor 200 can prevent entry of moisture and hydrogen from the outside.

Next, the insulator 285 is formed over the insulator 283 (see FIGS. 15A to 15D). The insulator 285 can be formed by a sputtering method, a CVD method, an MBE method, a PLD method, an ALD method, or the like. The insulator 285 is preferably formed by a sputtering method. Since a molecule containing hydrogen is not used as a deposition gas in the sputtering method, the concentration of hydrogen in the insulator 285 can be reduced.

In this embodiment, silicon oxide is deposited as the insulator 285 by a sputtering method.

Figure 15A:
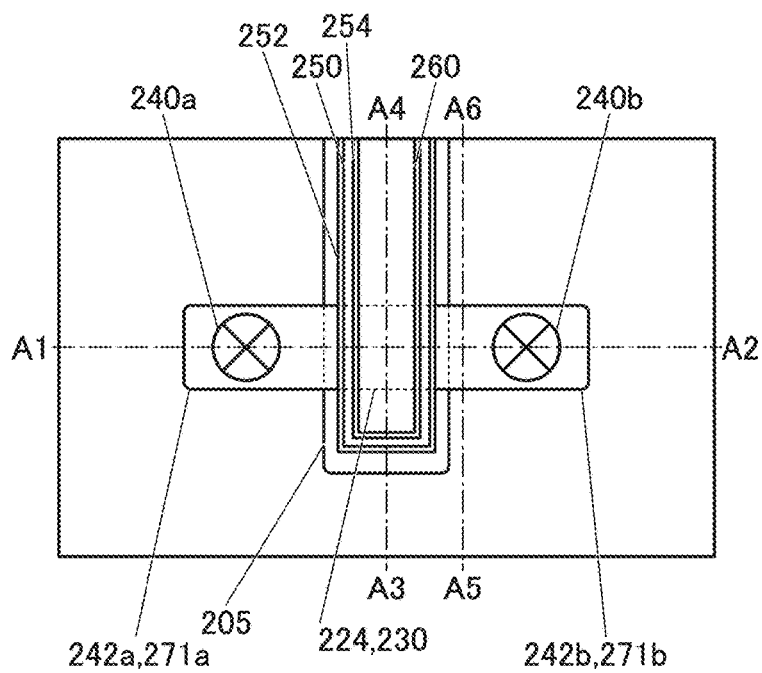
FIG. 15A is a top view illustrating the method for manufacturing a semiconductor device of one embodiment of the present invention.

Subsequently, openings reaching the conductor 242 are formed in the insulators 271, 275, 280, 282, 283, and 285 (see FIGS. 15A and 15B). The opening are formed by a lithography method. Note that the openings in the top view in FIG. 15A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Figure 15B:
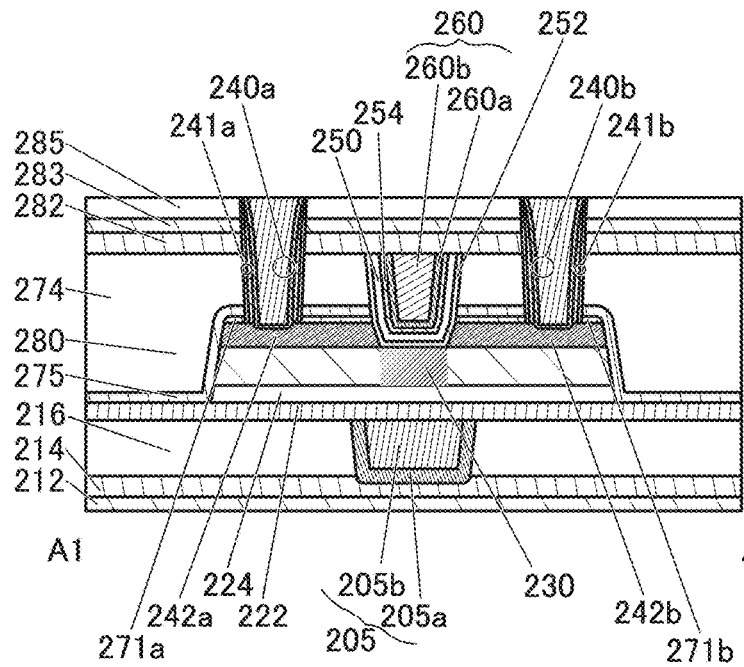
FIGS. 15B to 15D are cross-sectional views illustrating the method for manufacturing a semiconductor device of one embodiment of the present invention.
Figure 15C:
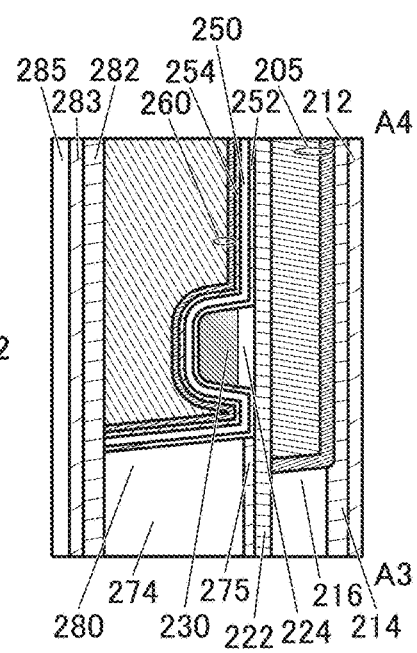
Figure 15D:
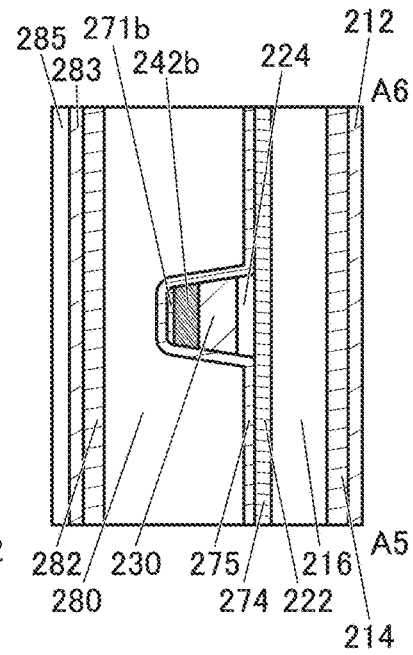

Then, an insulating film to be the insulator 241a and the insulator 241b is formed and subjected to anisotropic etching, so that the insulator 241 is formed (see FIG. 15B). The insulating film can be formed by a sputtering method, a CVD method, an MBE method, a PLD method, an ALD method, or the like. The insulating film preferably has a function of inhibiting the passage of oxygen. For example, it is preferable that an aluminum oxide film be deposited by an ALD method and a silicon nitride film be deposited thereover by a PEALD method. Silicon nitride is particularly preferable because of its high hydrogen blocking property.

As an anisotropic etching for the insulating film to be the insulator 241a and the insulator 241b, a dry etching method may be performed, for example. The insulator 241 is provided on the sidewall of the opening. This inhibits transmission of oxygen from the outside to inhibit oxidation of the conductor 240. Furthermore, diffusion of impurities such as water or hydrogen contained in the insulator 280 or the like into the conductor 240 can be prevented.

Next, a conductive film to be the conductor 240a and the conductor 240b is formed. The conductive film preferably has a stacked-layer structure including a conductor with a function of inhibiting passage of impurities such as water or hydrogen. For example, a stacked-layer structure of tantalum nitride, titanium nitride, or the like and tungsten, molybdenum, copper, or the like can be employed. The conductive film can be formed by a sputtering method, a CVD method, an MBE method, a PLD method, an ALD method, or the like.

Next, the conductive film to be the conductors 240a and 240b is partly removed by CMP treatment to expose the top surface of the insulator 285. As a result, the conductive film remains only in the openings, whereby the conductors 240a and 240b having flat top surfaces can be formed (see FIGS. 15A to 15D). The CMP treatment may remove part of the top surface of the insulator 285.

Next, a conductive film to be the conductor 246a and the conductor 246b is formed. The conductive film can be formed by a sputtering method, a CVD method, an MBE method, a PLD method, an ALD method, or the like.

Next, the conductive film to be the conductor 246a and the conductor 246b is processed by a lithography method to form the conductor 246a in contact with the top surface of the conductor 240a and the conductor 246b in contact with the top surface of the conductor 240b. At this time, part of the insulator 285 in a region not overlapping with the conductors 246a and 246b is sometimes removed.

Through the above process, the semiconductor device including the transistor 200 illustrated in FIGS. 1A to 1D can be manufactured. By the manufacturing method of a semiconductor device which is described in this embodiment and illustrated in FIGS. 7A to 15D, the transistor 200 can be formed.

<Microwave Treatment Apparatus>

A microwave treatment apparatus that can be used for the above method for manufacturing the semiconductor device is described below.

First, a structure of a manufacturing apparatus which allows the entry of few impurities into a film at the time of fabrication of a semiconductor device or the like is described with reference to FIG. 16, FIG. 17, FIG. 18, and FIG. 19.

Figure 16:
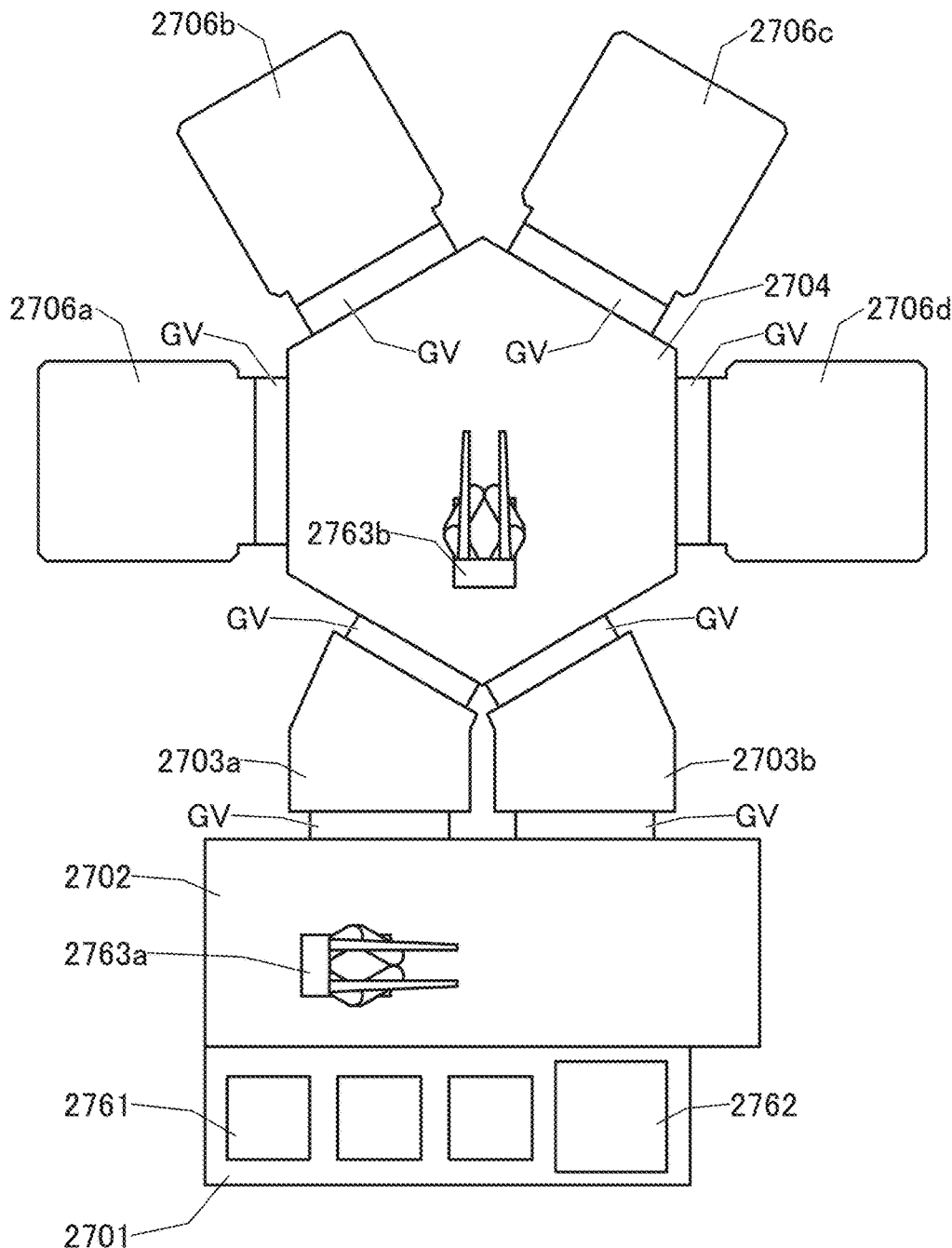
FIG. 16 is a top view illustrating a microwave treatment apparatus of one embodiment of the present invention.

FIG. 16 is a top view schematically illustrating a single wafer multi-chamber manufacturing apparatus 2700. The manufacturing apparatus 2700 includes an atmosphere-side substrate supply chamber 2701 including a cassette port 2761 for holding a substrate and an alignment port 2762 for performing alignment of a substrate, an atmosphere-side substrate transfer chamber 2702 through which a substrate is transferred from the atmosphere-side substrate supply chamber 2701, a load lock chamber 2703a where a substrate is carried and the pressure inside the chamber is switched from atmospheric pressure to reduced pressure or from reduced pressure to atmospheric pressure, an unload lock chamber 2703b where a substrate is carried out and the pressure inside the chamber is switched from reduced pressure to atmospheric pressure or from atmospheric pressure to reduced pressure, a transfer chamber 2704 through which a substrate is transferred in a vacuum, and chambers 2706a, 2706b, 2706c, and 2706d.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chambers 2706a, 2706b, 2706c, and 2706d.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. In addition, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

In the transfer chamber 2704 and each of the chambers, the back pressure (total pressure) is, for example, lower than or equal to $1 \times 10^{-4}$ Pa, preferably lower than or equal to $3 \times 10^{-5}$ Pa, further preferably lower than or equal to $1 \times 10^{-5}$ Pa. In the transfer chamber 2704 and each of the chambers, the partial pressure of a gas molecule (atom) having a mass-to-charge ratio (m/z) of 18 is, for example, lower than or equal to $3 \times 10^{-5}$ Pa, preferably lower than or equal to $1 \times 10^{-5}$ Pa, further preferably lower than or equal to $3 \times 10^{-5}$ Pa. Moreover, in the transfer chamber 2704 and each of the chambers, the partial pressure of a gas molecule (atom) having a mass-to-charge ratio (m/z) of 28 is, for example, lower than or equal to $3 \times 10^{-5}$ Pa, preferably lower than or equal to $1 \times 10^{-5}$ Pa, further preferably lower than or equal to $3 \times 10^{-5}$ Pa. Furthermore, in the transfer chamber 2704 and each of the chambers, the partial pressure of a gas molecule (atom) having a mass-to-charge ratio (m/z) of 44 is, for example, lower than or equal to $3 \times 10^{-5}$ Pa, preferably lower than or equal to $1 \times 10^{-5}$ Pa, further preferably lower than or equal to $3 \times 10^{-6}$ Pa.

Note that the total pressure and the partial pressure in the transfer chamber 2704 and each of the chambers can be measured using an ionization vacuum gauge, a mass analyzer, or the like.

Moreover, the transfer chamber 2704 and each of the chambers preferably have a small amount of external leakage or internal leakage. For example, the leakage rate of the transfer chamber 2704 is less than or equal to $1 \times 10^{0}$ Pa/min., preferably less than or equal to $5 \times 10^{-1}$ Pa/min. In addition, the leakage rate of each chamber is less than or equal to $1 \times 10^{-1}$ Pa/min., preferably lower than or equal to $5 \times 10^{-2}$ Pa/min.

Note that a leakage rate can be derived from the total pressure and partial pressure measured using the ionization vacuum gauge, the mass analyzer, or the like. For example, the leakage rate is preferably derived from the total pressure at the time when 10 minutes have passed from the start of evacuation to a vacuum using a vacuum pump such as a turbo molecular pump and the total pressure at the time when 10 minutes have passed from the operation of closing the valve. Note that the total pressure at the time of 10 minutes passing from the start of evacuation to a vacuum is preferably an average value of total pressures measured a plurality of times.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage so that the leakage rate can be set to be less than or equal to the above-mentioned value.

For example, open/close portions of the transfer chamber 2704 and the chambers can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with use of the metal covered with iron fluoride, aluminum oxide, chromium oxide, or the like, which is in the passive state, the release of gas containing impurities released from the metal gasket is suppressed, so that the internal leakage can be reduced.

For a member of the manufacturing apparatus 2700, aluminum, chromium, titanium, zirconium, nickel, or vanadium, which releases a small amount of gas containing impurities, is used. Alternatively, an alloy containing iron, chromium, nickel, or the like covered with the above material from which releases a small amount of gas containing the impurities may be used. The alloy containing iron, chromium, nickel, or the like is rigid, resistant to heat, and suitable for processing. Here, when surface unevenness of the member is decreased by polishing or the like to reduce the surface area, the release of gas can be reduced.

Alternatively, the above member of the manufacturing apparatus 2700 may be covered with iron fluoride, aluminum oxide, chromium oxide, or the like.

The member of the manufacturing apparatus 2700 is preferably formed using only metal when possible. For example, in the case where a viewing window formed of quartz or the like is provided, it is preferable that the surface of the viewing window be thinly covered with iron fluoride, aluminum oxide, chromium oxide, or the like so as to suppress release of gas.

When an adsorbed substance is present in the transfer chamber 2704 and each of the chambers, although the adsorbed substance does not affect the pressure in the transfer chamber 2704 and each of the chambers because it is adsorbed onto an inner wall or the like, the adsorbed substance causes a release of gas when the insides of the transfer chamber 2704 and each of the chambers is evacuated. Therefore, although there is no correlation between the leakage rate and the exhaust rate, it is important that the adsorbed substance present in the transfer chamber 2704 and each of the chambers be desorbed as much as possible and exhaust be performed in advance with use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking can be performed at a temperature higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a noble gas is preferably used as the inert gas.

Alternatively, treatment for evacuating the insides of the transfer chamber 2704 and each of the chambers is preferably performed a certain period of time after heated oxygen, a heated inert gas such as a heated noble gas, or the like is introduced to increase the pressures in the transfer chamber 2704 and each of the chambers. The introduction of the heated gas can desorb the adsorbed substance in the transfer chamber 2704 and each of the chambers, and the impurities present in the transfer chamber 2704 and each of the chambers can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the transfer chamber 2704 and each of the chambers, so that the pressure therein can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the inside of the transfer chamber 2704 and each of the chambers is evacuated in the time range of 5 minutes to 300 minutes, preferably 10 minutes to 120 minutes.

Figure 17:
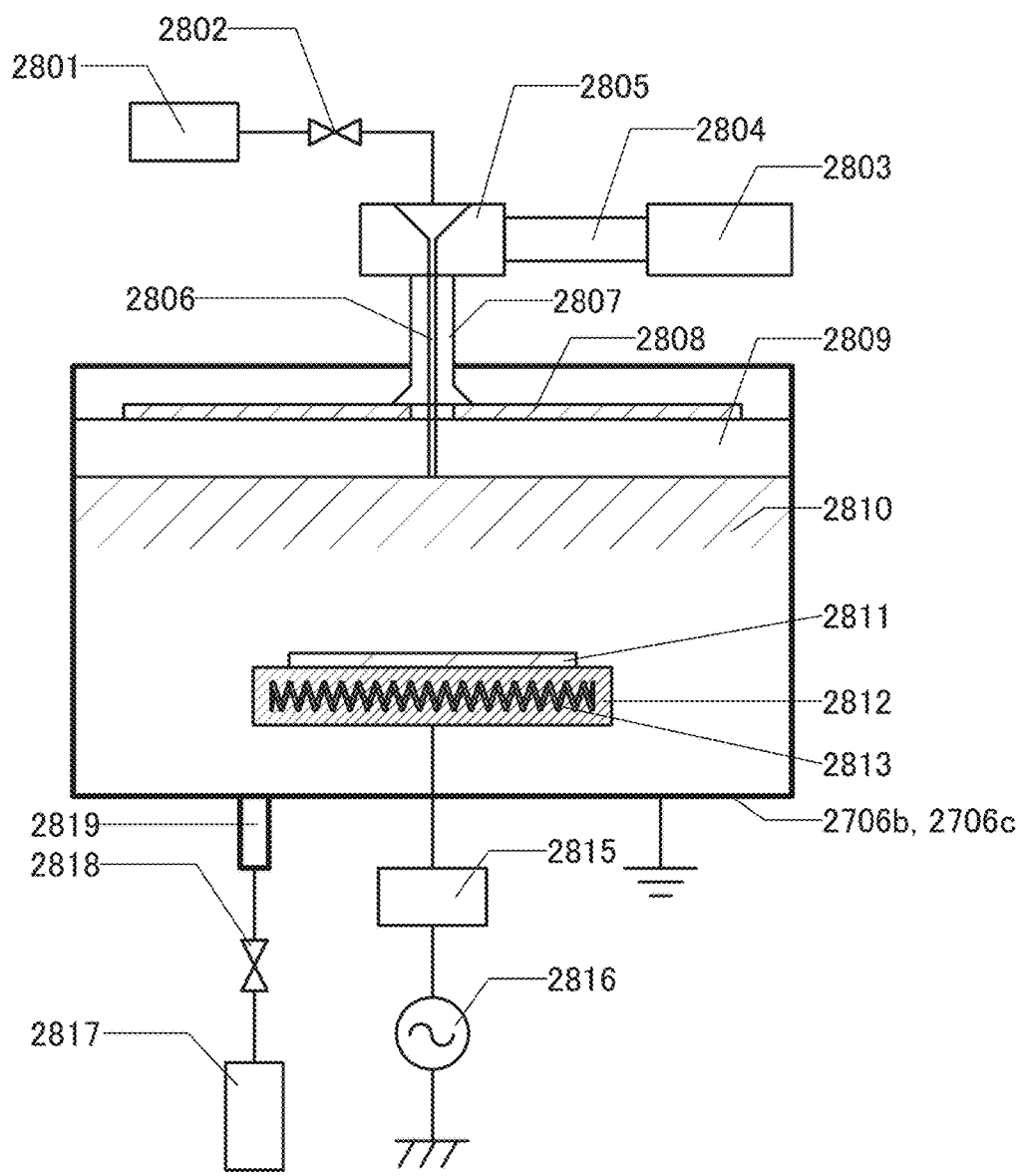
FIG. 17 is a cross-sectional view illustrating a microwave treatment apparatus of one embodiment of the present invention.

Next, the chambers 2706*b* and 2706*c* are described with reference to a schematic cross-sectional view of FIG. 17.

The chambers 2706*b* and 2706*c* are chambers capable of performing microwave treatment on an object, for example. Note that the chamber 2706*b* is different from the chamber 2706*c* only in the atmosphere in which microwave treatment is performed. The other structures are common and thus collectively described below.

The chambers 2706*b* and 2706*c* each include a slot antenna plate 2808, a dielectric plate 2809, a substrate holder 2812, and an exhaust port 2819. A gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chambers 2706*b* and 2706*c*.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Furthermore, the gas supply source 2801 is connected to the mode converter 2805 through the valve 2802. Gas is transferred to the chambers 2706*b* and 2706*c* through the gas pipe 2806 which runs through the mode converter 2805, the waveguide 2807, and the dielectric plate 2809. The vacuum pump 2817 has a function of exhausting gas or the like from the chambers 2706*b* and 2706*c* through the valve 2818 and the exhaust port 2819. The high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. In addition, the substrate holder 2812 has a function of an electrode to which electric power is supplied from the high-frequency power source

2816. The substrate holder 2812 includes a heating mechanism 2813 therein and thus has a function of heating the substrate 2811.

As the vacuum pump 2817, a dry pump, a mechanical booster pump, an ion pump, a titanium sublimation pump, a cryopump, a turbomolecular pump, or the like can be used, for example. In addition to the vacuum pump 2817, a cryotrap may be used as well. The combinational use of the cryopump and the cryotrap allows water to be efficiently exhausted and is particularly preferable.

For example, the heating mechanism 2813 may be a heating mechanism which uses a resistance heater or the like for heating. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. In the GRTA apparatus, heat treatment is performed using a high-temperature gas. An inert gas is used as a gas.

The gas supply source 2801 may be connected to a purifier through a mass flow controller. As the gas, a gas whose dew point is −80° C. or lower, preferably −100° C. or lower is preferably used. For example, an oxygen gas, a nitrogen gas, or a noble gas (e.g., an argon gas) may be used.

As the dielectric plate 2809, silicon oxide (quartz), aluminum oxide (alumina), yttrium oxide (yttria), or the like may be used, for example. A protective layer may be further formed on a surface of the dielectric plate 2809. As the protective layer, magnesium oxide, titanium oxide, chromium oxide, zirconium oxide, hafnium oxide, tantalum oxide, silicon oxide, aluminum oxide, yttrium oxide, or the like may be used. The dielectric plate 2809 is exposed to an especially high density region of high-density plasma 2810 that is to be described later. Therefore, the protective layer can reduce the damage and consequently prevent an increase of particles or the like during the treatment.

The high-frequency generator 2803 has a function of generating a microwave with a frequency of, for example, greater than or equal to 0.3 GHz and less than or equal to 3.0 GHz, greater than or equal to 0.7 GHz and less than or equal to 1.1 GHz, or greater than or equal to 2.2 GHz and less than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave propagates through the slot holes and the dielectric plate 2809. Then, an electric field is generated below the dielectric plate 2809, and the high-density plasma 2810 can be generated. The high-density plasma 2810 includes ions and radicals depending on the gas species supplied from the gas supply source 2801. For example, oxygen radicals or the like are included.

At this time, the quality of a film or the like over the substrate 2811 can be modified by the ions and radicals generated in the high-density plasma 2810. Note that it is preferable in some cases to apply a bias to the substrate 2811 using the high-frequency power source 2816. As the high-frequency power source 2816, a radio frequency (RF) power source with a frequency of 13.56 MHz, 27.12 MHz, or the like may be used, for example. The application of a bias to the substrate allows ions in the high-density plasma 2810 to efficiently reach a deep portion of an opening of the film or the like over the substrate 2811.

For example, in the chamber 2706*b* or the chamber 2706*c*, oxygen radical treatment using the high-density plasma 2810 can be performed by introducing oxygen from the gas supply source 2801.

Figure 18:
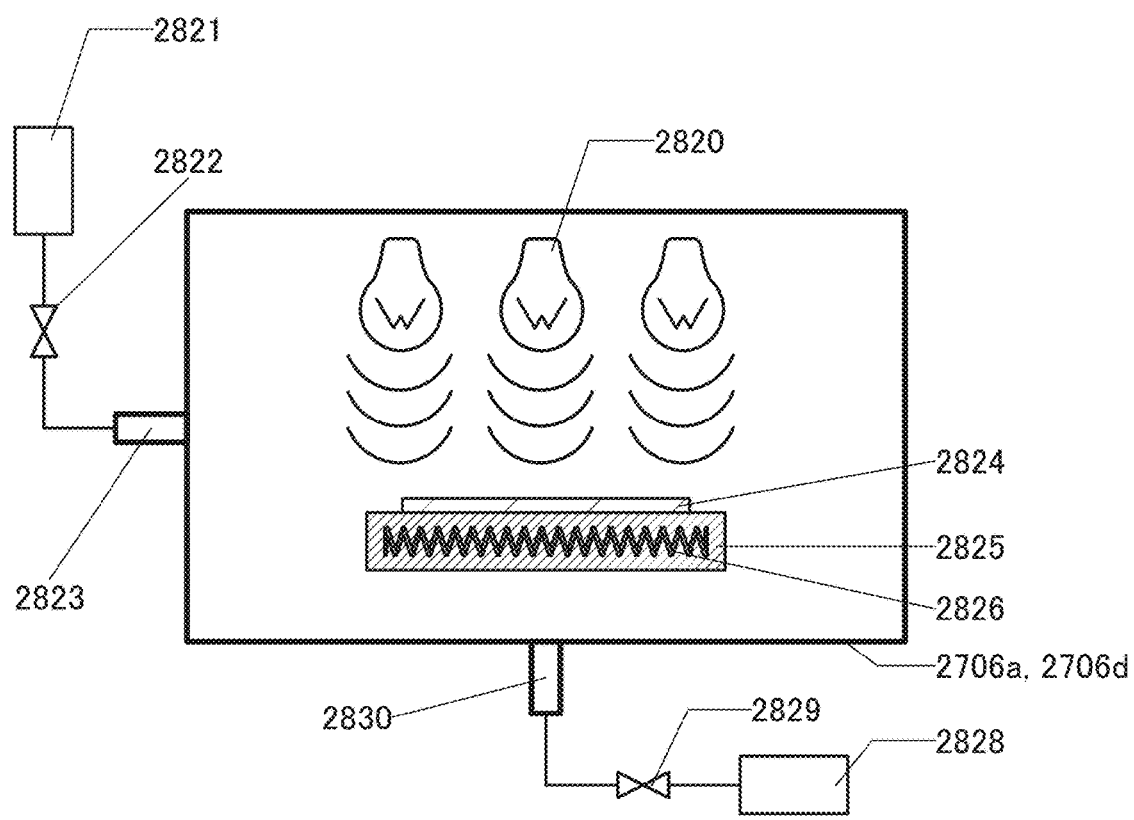
FIG. 18 is a cross-sectional view illustrating a microwave treatment apparatus of one embodiment of the present invention.
Figure 19:
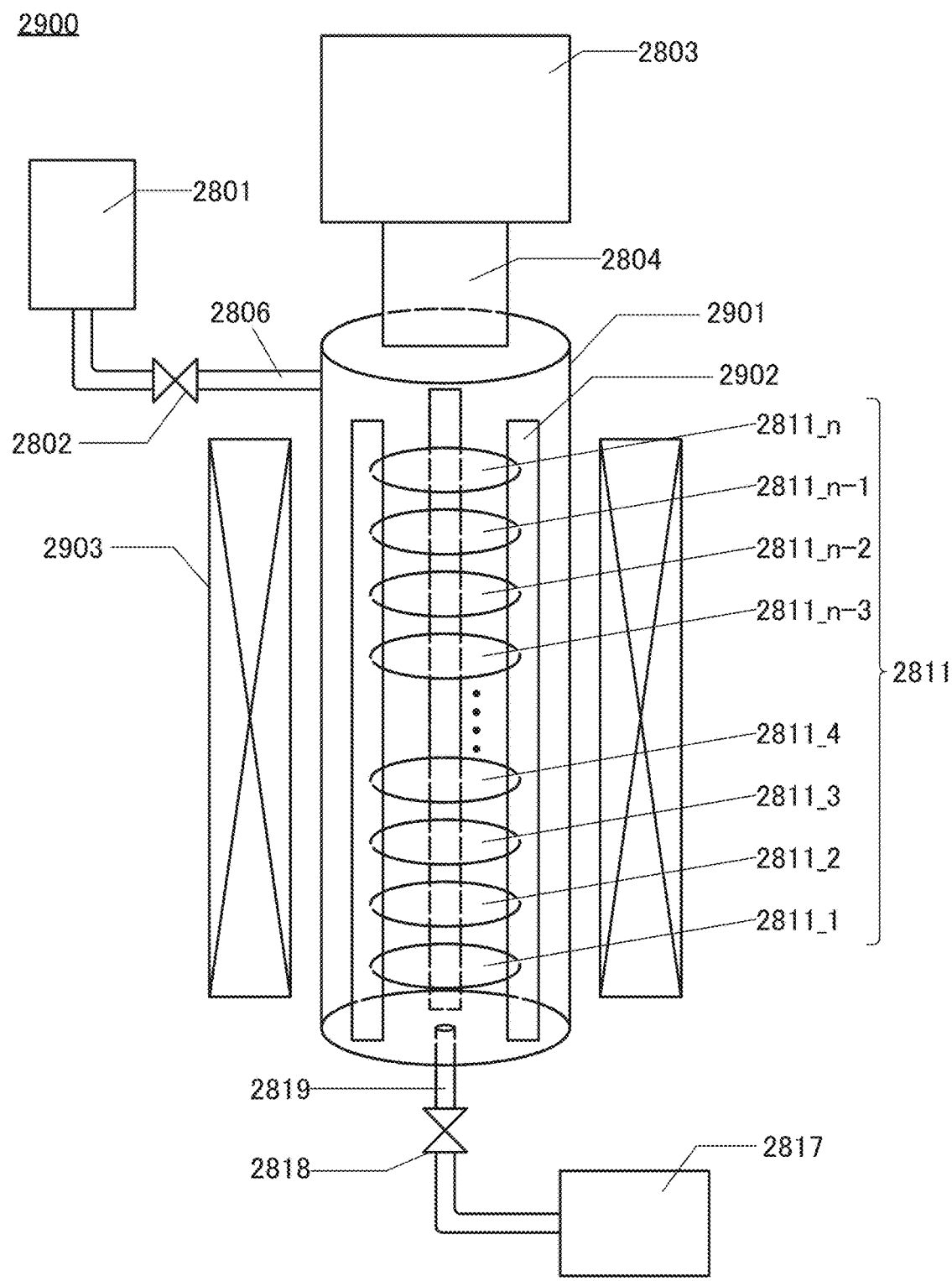
FIG. 19 is a cross-sectional view illustrating a microwave treatment apparatus of one embodiment of the present invention.

Next, the chambers 2706*a* and 2706*d* are described with reference to a schematic cross-sectional view of FIG. 18.

The chambers 2706*a* and 2706*d* are chambers capable of irradiating an object with an electromagnetic wave, for example. Note that the chamber 2706*a* is different from the chamber 2706*d* only in the kind of the electromagnetic wave. The other structures have many common portions and thus are collectively described below.

The chambers 2706*a* and 2706*d* each include one or more lamps 2820, a substrate holder 2825, a gas inlet 2823, and an exhaust port 2830. A gas supply source 2821, a valve 2822, a vacuum pump 2828, and a valve 2829 are provided outside the chambers 2706*a* and 2706*d*.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. The substrate holder 2825 includes a heating mechanism 2826 therein and thus has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak in a wavelength region longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp may be used, for example.

For example, part of or the whole electromagnetic wave emitted from the lamp 2820 is absorbed by the substrate 2824, so that the quality of a film or the like over the substrate 2824 can be modified. For example, defects can be generated or reduced or impurities can be removed. When the substrate 2824 absorbs the electromagnetic wave while being heated, generation or reduction of defects or removal of impurities can be efficiently performed.

Alternatively, for example, the electromagnetic wave emitted from the lamp 2820 may cause heat generation in the substrate holder 2825, by which the substrate 2824 may be heated. In this case, the heating mechanism 2826 inside the substrate holder 2825 may be omitted.

For the vacuum pump 2828, the description of the vacuum pump 2817 is referred to. For the heating mechanism 2826, the description of the heating mechanism 2813 is referred to. For the gas supply source 2821, the description of the gas supply source 2801 is referred to.

A microwave treatment apparatus that can be used in this embodiment is not limited to the above. It is possible to use a microwave treatment apparatus 2900 shown in FIG. 19. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes a substrate holder 2902 that holds a plurality of substrates 2811 (2811_1 to 2811_*n*, n is an integer greater than or equal to 2) in the quartz tube

2901. The microwave treatment apparatus 2900 may further include a heating means 2903 outside the quartz tube 2901.

The substrate placed in the quartz tube 2901 is irradiated with the microwave generated by the high-frequency generator 2803 and passing through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_$n$ may be substrates to be treated where a semiconductor device or a memory device is to be formed, or some of the substrates may be dummy substrates. For example, the substrate 2811_1 and the substrate 2811_$n$ may be dummy substrates and the substrate 2811_2 to the substrate 2811_$n-1$ may be substrates to be treated. Alternatively, the substrate 2811_1, the substrate 2811_2, the substrate 2811_$n-1$, and the substrate 2811_$n$ may be dummy substrates and the substrate 2811_3 to the substrate 2811_$n-2$ may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to a microwave.

With the above-described manufacturing apparatus, the quality of a film can be modified while the entry of impurities into an object suppressed.

<Variation of Semiconductor Device>

An example of the semiconductor device that is one embodiment of the present invention will be described below with reference to FIG. 20A to FIG. 20D.

Figure 20A:
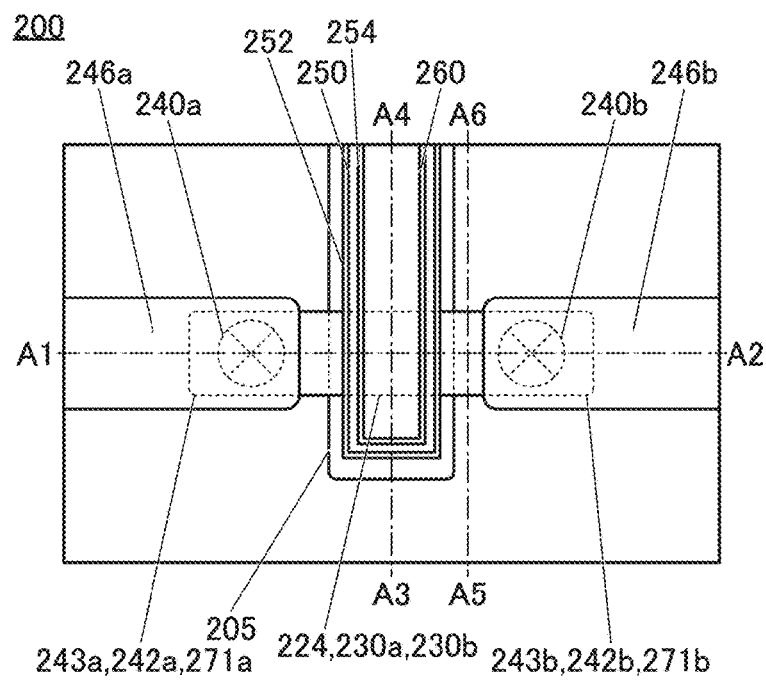
FIG. 20A is a top view of a semiconductor device of one embodiment of the present invention.
Figure 20C:
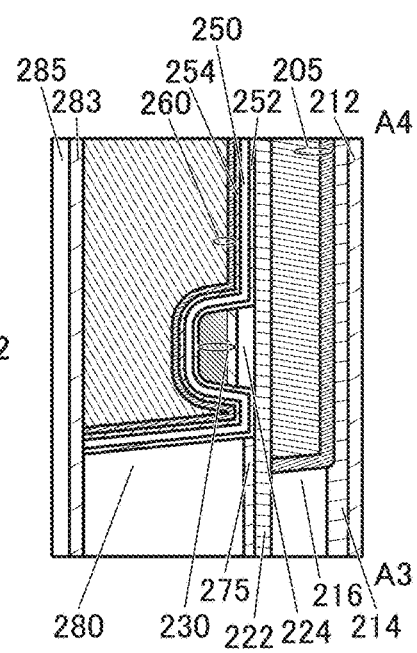
FIGS. 20B to 20D are cross-sectional view of the semiconductor device of one embodiment of the present invention.
Figure 20B:
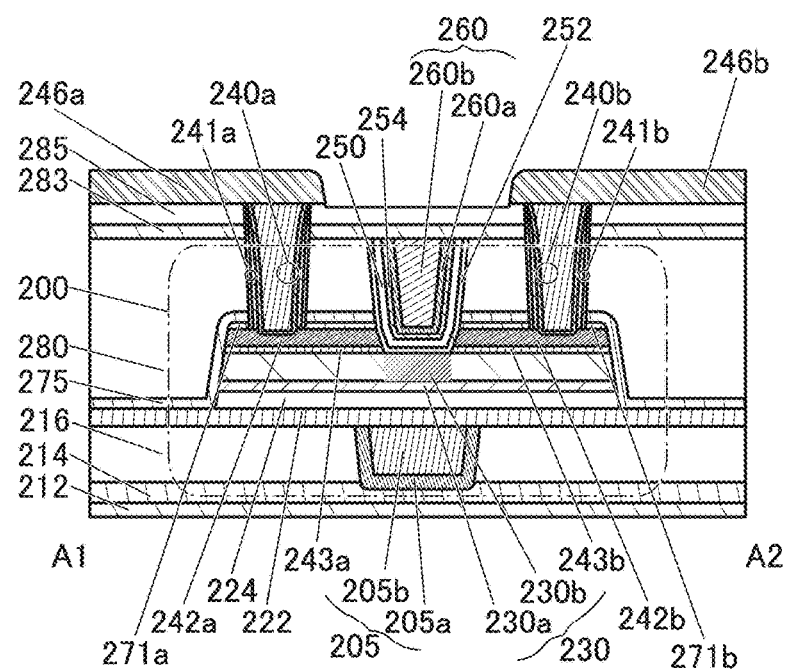
Figure 20D:
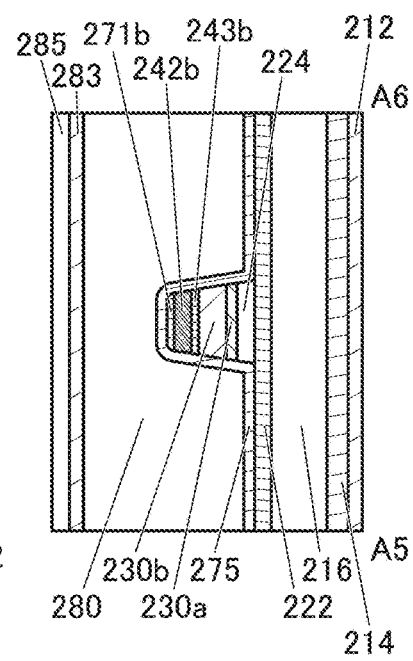

FIG. 20A is a top view of the semiconductor device. FIG. 20B is a cross-sectional view corresponding to a portion taken along dashed-dotted line A1-A2 in FIG. 20A. FIG. 20C is a cross-sectional view corresponding to a portion taken along dashed-dotted line A3-A4 in FIG. 20A. FIG. 20D is a cross-sectional view corresponding to a portion taken along the dashed-dotted line A5-A6 in FIG. 20A. Note that for simplification, some components are not illustrated in the top view in FIG. 20A.

Note that in the semiconductor device illustrated in FIGS. 20A to 20C, components having the same functions as the components in the semiconductor device described in <Structure example of semiconductor device> are denoted by the same reference numerals. Note that also in this section, the materials described in detail in <Structure example of semiconductor device> can be used as materials of the semiconductor device.

The semiconductor device illustrated in FIG. 20A to FIG. 20D is a variation example of the semiconductor device illustrated in FIG. 1A to FIG. 1D. The semiconductor device in FIG. 20A to FIG. 20D is different from the semiconductor device in FIG. 1A to FIG. 1D in that the insulator 282 is not included. Thus, in the semiconductor device illustrated in FIGS. 20A to 20D, the insulator 283 is in contact with the top surface of the conductor 260, the top surface of the insulator 280, the uppermost portions of the insulators 254, 250, and 252.

For example, in the case where oxygen can be supplied sufficiently to the oxide 230 by the microwave treatment or the like as illustrated in FIGS. 12A to 12D, the region 230*bc* can be substantially i-type without the insulator 282 for adding oxygen to the insulator 280. In such a case, the structure without the insulator 282 as illustrated in FIGS. 20A to 20D enables the simplification of the manufacturing process and productivity of the semiconductor device.

The semiconductor device illustrated in FIGS. 20A to 20D is different from the semiconductor device illustrated in FIGS. 1A to 1D in that the oxide 230 has a stacked structure of an oxide 230*a* and an oxide 230*b*. The oxide 230 includes the oxide 230*a* provided over the insulator 224 and the oxide 230*b* provided over the oxide 230*a*.

Here, the conduction band minimum is gradually varied at a junction portion of the oxide 230*a* and the oxide 230*b*. In other words, the conduction band minimum at the junction portion of the oxide 230*a* and the oxide 230*b* is continuously varied or continuously connected. To vary the conduction band minimum gradually, the density of defect states in a mixed layer formed at the interface between the oxides 230*a* and 230*b* is decreased. By a reduction in the density of defect states in the mixed layer, the influence of interface scattering on carrier conduction is reduced, and the transistor 200 can have a high on-state current and high frequency characteristics.

For example, when the oxide 230*a* and the oxide 230*b* contain the same element as a main component in addition to oxygen, a mixed layer with a low density of defect states can be formed. For example, in the case where the oxide 230*b* is an In-M-Zn oxide, an In-M-Zn oxide, a M-Zn oxide, an oxide of the element M, an In—Zn oxide, or indium oxide may be used as the oxide 230*a*.

The atomic ratio of In to the element M in the metal oxide used as the oxide 230*b* is preferably higher than that in the metal oxide used as the oxide 230*a*, for example. The oxide 230*a* under the oxide 230*b* inhibits diffusion of impurities into the oxide 230*b* from the components formed below the oxide 230*a*.

The oxide 230*a* preferably has crystallinity, for example. In particular, the CAAC-OS is preferably used as the oxide 230*a*. For example, it is preferable to use a metal oxide in which the atomic ratio of zinc to a metal element that is a main component is high. With this structure, the crystallinity of the oxide 230*b* over the oxide 230*a* can be further enhanced. Thus, as described above, the transistor 200 can exhibit stability with respect to thermal budget.

Specifically, as the oxide 230*a*, it is preferable to use a metal oxide with an atomic ratio where Ga:Zn=2:1 or a composition in the neighborhood thereof, a metal oxide with an atomic ratio where Ga:Zn=2:5 or a composition in the neighborhood thereof, a metal oxide with an atomic ratio where In:M:Zn=1:1:2 or a composition in the neighborhood thereof, or a metal oxide with an atomic ratio where In:M:Zn=4:2:3 or a composition in the neighborhood thereof. As the oxide 230*b*, it is preferable to use a metal oxide with an atomic ratio where In:M:Zn=2:6:5 or a composition in the neighborhood thereof, a metal oxide with an atomic ratio where In:M:Zn=1:3:4 or a composition in the neighborhood thereof, a metal oxide with an atomic ratio where In:M:Zn=1:1:1 or a composition in the neighborhood thereof, or a metal oxide with an atomic ratio where In:M:Zn=1:4:5 or a composition in the neighborhood thereof. Note that the neighborhood of the atomic ratio includes ±30% of an intended atomic ratio. Gallium is preferably used as the element M.

Note that FIGS. 20B and 20C illustrate an example in which the region 230ba, the region 230bb, and the region 230bc are formed in the oxide 230b; however, the present invention is not limited to this. For example, the above regions may be formed not only in the oxide 230b but also in the oxide 230a.

In the semiconductor devices illustrated in FIGS. 1A to 1D and in FIGS. 20A to 20D, the oxide 230 in the transistor 200 has a single-layer structure or a stacked-layer structure of two layers; however, one embodiment of the present invention is not limited to this. For example, the oxide 230 may have a stacked-layer structure of three or more layers, or the oxide 230b may have a stacked-layer structure.

The semiconductor device illustrated in FIGS. 20A to 20D is different from that in FIGS. 1A to 1D in that an oxide 243a and an oxide 243b are included. The oxide 243a is provided between the oxide 230b and the conductor 242a, and the oxide 243b is provided between the oxide 230b and the conductor 242b. The oxide 243a is preferably in contact with the top surface of the oxide 230b and the bottom surface of the conductor 242a. The oxide 243b is preferably in contact with the top surface of the oxide 230b and the bottom surface of the conductor 242b.

The oxide 243a and the oxide 243b preferably have a function of inhibiting oxygen transmission. It is preferable that the oxide 243a (oxide 243b) having a function of inhibiting oxygen transmission be provided between the oxide 230 and the conductor 242a (conductor 242b) functioning as the source electrode or the drain electrode, in which case the electrical resistance between the oxide 230 and the conductor 242a (conductor 242b) is reduced. Such a structure improves the electrical characteristics, field-effect mobility, and reliability of the transistor 200.

A metal oxide containing the element M may be used as the oxide 243a and the oxide 243b. In particular, aluminum, gallium, yttrium, or tin is preferably used as the element M. The concentration of the element M in the oxides 243a and 243b is preferably higher than that in the oxide 230b. Alternatively, gallium oxide may be used as the oxides 243a and 243b. A metal oxide such as an In-M-Zn oxide may be used as the oxides 243a and 243b. Specifically, the atomic ratio of the element M to In in the metal oxide used as the oxides 243a and 243b is preferably higher than that in the metal oxide used as the oxide 230b. The thickness of each of the oxides 243a and 243b preferably ranges from 0.5 nm to 5 nm, further preferably from 1 nm to 3 nm, and still further preferably from 1 nm to 2 nm. The oxides 243a and 243b preferably have crystallinity. The oxides 243a and 243b with crystallinity efficiently inhibits release of oxygen from the oxide 230. When the oxides 243a and 243b have a hexagonal crystal structure, for example, release of oxygen from the oxide 230 can sometimes be inhibited.

Application Example of Semiconductor Device

An example of the semiconductor device that is one embodiment of the present invention will be described below with reference to FIG. 21A to FIG. 21C.

Figure 21A:
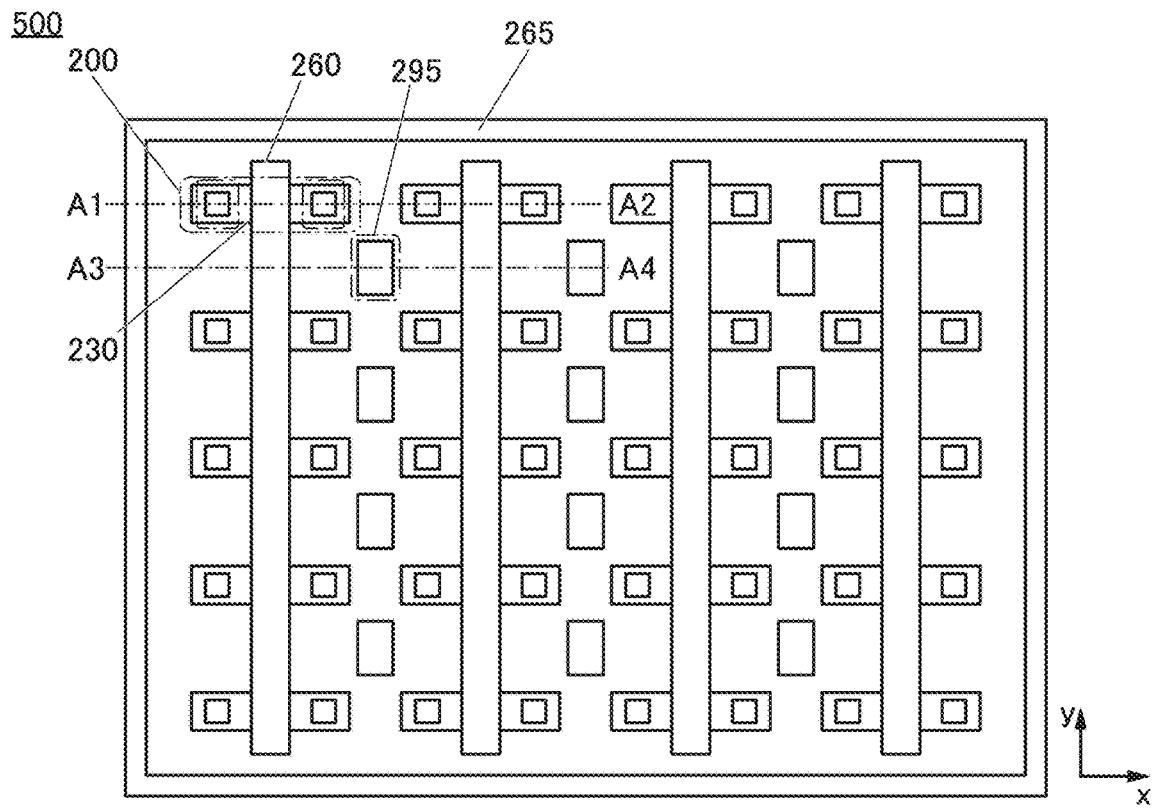
FIG. 21A is a plan view of a semiconductor device of one embodiment of the present invention.

FIG. 21A is a top view of a semiconductor device 500. In FIG. 21A, the x-axis is parallel to the channel length direction of the transistor 200, and the y-axis is perpendicular to the x-axis. FIG. 21B is a cross-sectional view taken along the dashed-dotted line A1-A2 in FIG. 21A, which corresponds to a cross-sectional view in the channel length direction of the transistor 200. FIG. 21C is a cross-sectional view taken along the dashed-dotted line A3-A4 in FIG. 21A, which corresponds to a cross-sectional view of an opening region 295 and its vicinity thereof. Note that for simplification, some components are not illustrated in the top view in FIG. 21A.

Figure 21B:
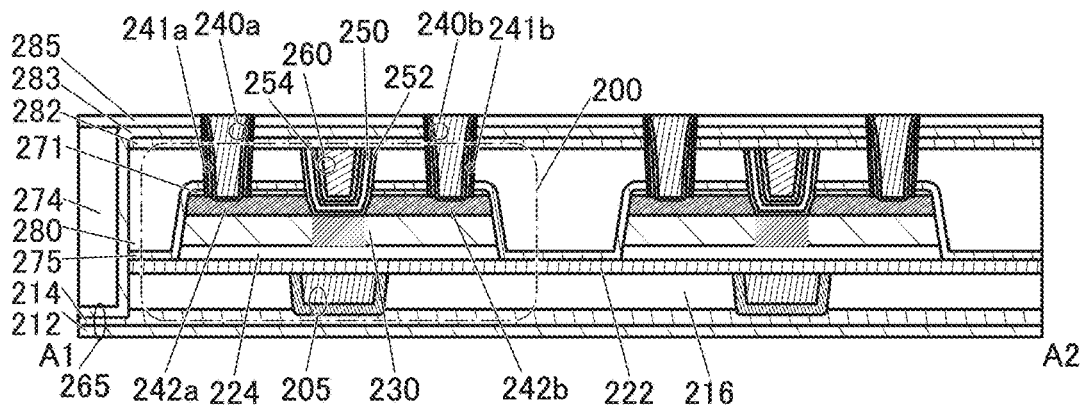
FIGS. 21B and 21C are cross-sectional views of the semiconductor device of one embodiment of the present invention.
Figure 21C:
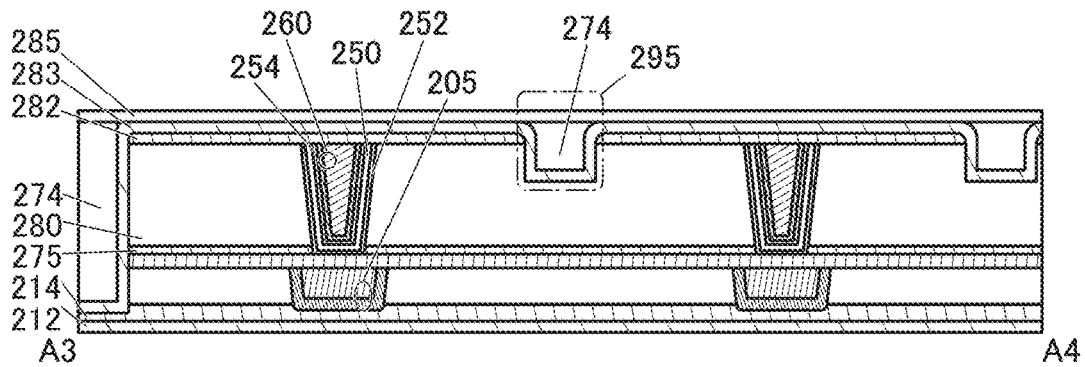

Note that in the semiconductor device illustrated in FIGS. 21A to 21C, components having the same functions as the components in the semiconductor device described in <Structure example of semiconductor device> are denoted by the same reference numerals. Note that also in this section, the materials described in detail in <Structure example of semiconductor device> can be used as materials of the semiconductor device.

The semiconductor device 500 illustrated in FIG. 21A to FIG. 21C is a variation example of the semiconductor device illustrated in FIG. 1A to FIG. 1D. The semiconductor device 500 illustrated in FIGS. 21A to 21C is different from the semiconductor device in FIGS. 1A to 1D in that a sealing portion 265 is formed. In addition, the opening region 295 is formed in the insulators 282 and 280, which is a different point from the semiconductor device illustrated in FIGS. 1A to 1D. Moreover, the sealing portion 265 is formed to surround a plurality of transistors 200, which is a different point from the semiconductor device illustrated in FIGS. 1A to 1D.

The semiconductor device 500 includes a plurality of transistors 200 and a plurality of opening regions 295 arranged in a matrix. In addition, the plurality of conductors 260 functioning as gate electrode of the transistors 200 are provided to extend in the y-axis direction. The opening regions 295 are provided in regions not overlapping with the oxide 230 or the conductor 260. The sealing portion 265 is formed so as to surround the plurality of transistors 200, the plurality of conductors 260, and the plurality of opening regions 295. Note that the number, the position, and the size of the transistors 200, the conductors 260, and the opening regions 295 are not limited to those illustrated in FIG. 21A and may be set as appropriate in accordance with the design of the semiconductor device 500.

As illustrated in FIGS. 21B and 21C, the sealing portion 265 is provided to surround the plurality of transistors 200 and the insulators 216, 222, 275, 280, and 282. In other words, the insulator 283 is provided to cover the insulators 216, 222, 275, 280, and 282. In the sealing portion 265, the insulator 283 is in contact with a top surface of the insulator 214. In the sealing portion 265, an insulator 274 is provided between the insulator 283 and the insulator 285. The top surface of the insulator 274 is substantially level with the uppermost surface of the insulator 283. The insulator 274 can be formed using the same material as that used for the insulator 280.

Such a structure enables the plurality of transistors 200 to be surrounded by the insulators 283, 214, and 212. One or more of the insulators 283, 214, and 212 preferably function as an insulating film having a barrier property against hydrogen. Accordingly, entry of hydrogen contained in the region outside the sealing portion 265 into a region in the sealing portion 265 can be inhibited.

As illustrated in FIG. 21C, the insulator 282 in the opening region 295 has an opening. In the opening region 295, the insulator 280 may have a groove to overlap with the opening in the insulator 282. The depth of the groove of the insulator 280 is preferably adjusted so that the top surface of the insulator 275 is exposed at the deepest portion. For example, the depth of the groove may be approximately greater than or equal to ¼ and less than or equal to ½ of the maximum thickness of the insulator 280.

As illustrated in FIG. 21C, the insulator 283 in the opening region 295 is in contact with the side surface of the insulator 282 and the side and top surfaces of the insulator 280. Part of the insulator 274 is formed in the opening region 295 to fill the depression portion formed in the insulator 283, in some cases. At this time, the top surface of the insulator 274 formed in the opening region 295 is substantially aligned with the uppermost surface of the insulator 283, in some cases.

When heat treatment is performed in such a state that the opening region 295 is formed and the insulator 280 is exposed in the opening of the insulator 282, part of oxygen contained in the insulator 280 can be made to diffuse outwardly from the opening region 295 while oxygen is supplied to the oxide 230. This heat treatment enables oxygen released from the insulator 280 to be sufficiently supplied into a region serving as a channel formation region in the oxide semiconductor layer and its vicinity and also prevents an excess amount of oxygen from being supplied thereto.

At this time, hydrogen in the insulator 280 can be bonded to oxygen and released to the outside through the opening region 295. The hydrogen bonded to oxygen is released as water. Through the treatment, the amount of hydrogen in the insulator 280 can be reduced, and the hydrogen in the insulator 280 can be prevented from entering the oxide 230.

In FIG. 21A, the shape of the opening region 295 in the top view is substantially rectangular; however, the present invention is not limited to this structure. For example, the shape of the opening region 295 in the top view can be a rectangular shape, an elliptical shape, a circular shape, a rhombus shape, or a shape obtained by combining any of the above shapes. The area and arrangement interval of the opening regions 295 can be set as appropriate in accordance with the design of the semiconductor device including the transistor 200. For example, in the region where the density of the transistors 200 is low, the area of the opening region 295 may be increased or the arrangement interval of the opening regions 295 may be narrowed. For example, in the region where the density of the transistors 200 is high, the area of the opening region 295 may be decreased, or the arrangement interval of the opening regions 295 may be increased.

Note that the insulator 283 may be partly in contact with the top surface of the insulator 212. In this structure, the transistor 200 is located in a region sealed with the insulators 283 and 212. Thus, entry of hydrogen contained in the outside of the sealed region into the sealed region can be inhibited.

Although the transistor 200 having a structure in which the insulators 212 and 283 each have a single-layer structure is illustrated in FIG. 21A to FIG. 21C, the present invention is not limited thereto. For example, each of the insulators 212 and 283 may have a stacked-layer structure of two or more layers.

According to one embodiment of the present invention, a novel transistor can be provided. According to one embodiment of the present invention, a transistor whose characteristic degradation due to stray light is small and a manufacturing method thereof can be provided. According to one embodiment of the present invention, a display device in which degradation in transistor characteristics due to stray light is small and a manufacturing method thereof can be provided. According to one embodiment of the present invention, a display device with stable pixel operation can be provided.

According to one embodiment of the present invention, a semiconductor device in which a variation in transistor characteristics is small and a manufacturing method thereof can be provided. According to one embodiment of the present invention, a semiconductor device with favorable electrical characteristics and a manufacturing method thereof can be provided. According to one embodiment of the present invention, a highly reliable semiconductor device and a manufacturing method thereof can be provided. According to one embodiment of the present invention, a miniaturized or highly integrated semiconductor device and a manufacturing method thereof can be provided. According to one embodiment of the present invention, a semiconductor device with low power consumption and a manufacturing method thereof can be provided.

At least part of the structure, method, and the like described in this embodiment can be implemented in appropriate combination with any of those in the other embodiments described in this specification.

Embodiment 2

In this embodiment, a structure example of a display device of one embodiment of the present invention will be described.

The display device in this embodiment can be a high-resolution display device. Thus, the display device in this embodiment can be used for display portions of information terminals (wearable devices) such as watch-type or bracelet-type information terminals and display portions of wearable devices capable of being worn on a head, such as a VR device such as a head mounted display and a glasses-type AR device.

[Display Module]

Figure 22A:
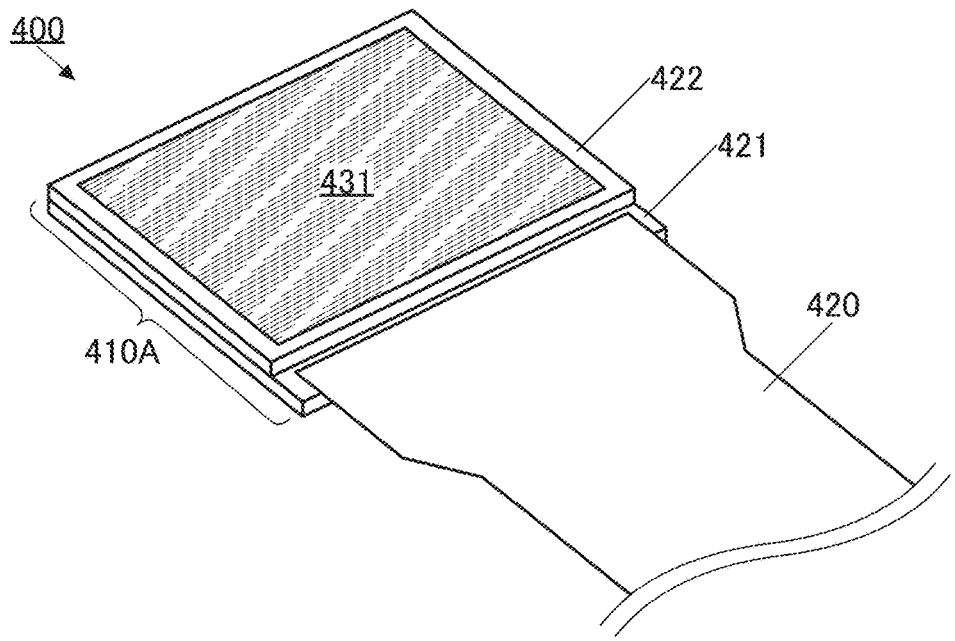
FIGS. 22A and 22B are perspective views illustrating an example of a display module.

FIG. 22A is a perspective view of a display module 400. The display module 400 includes a display device 410A and an FPC 420. Note that the display device included in the display module 400 is not limited to the display device 410A and may be a display device 410B described later.

The display module 400 includes a substrate 421 and a substrate 422. The display module 400 includes a display portion 431. The display portion 431 is a region of the display module 400 where an image is displayed and is a region where light emitted from pixels provided in a pixel portion 434 described later can be seen.

Figure 22B:
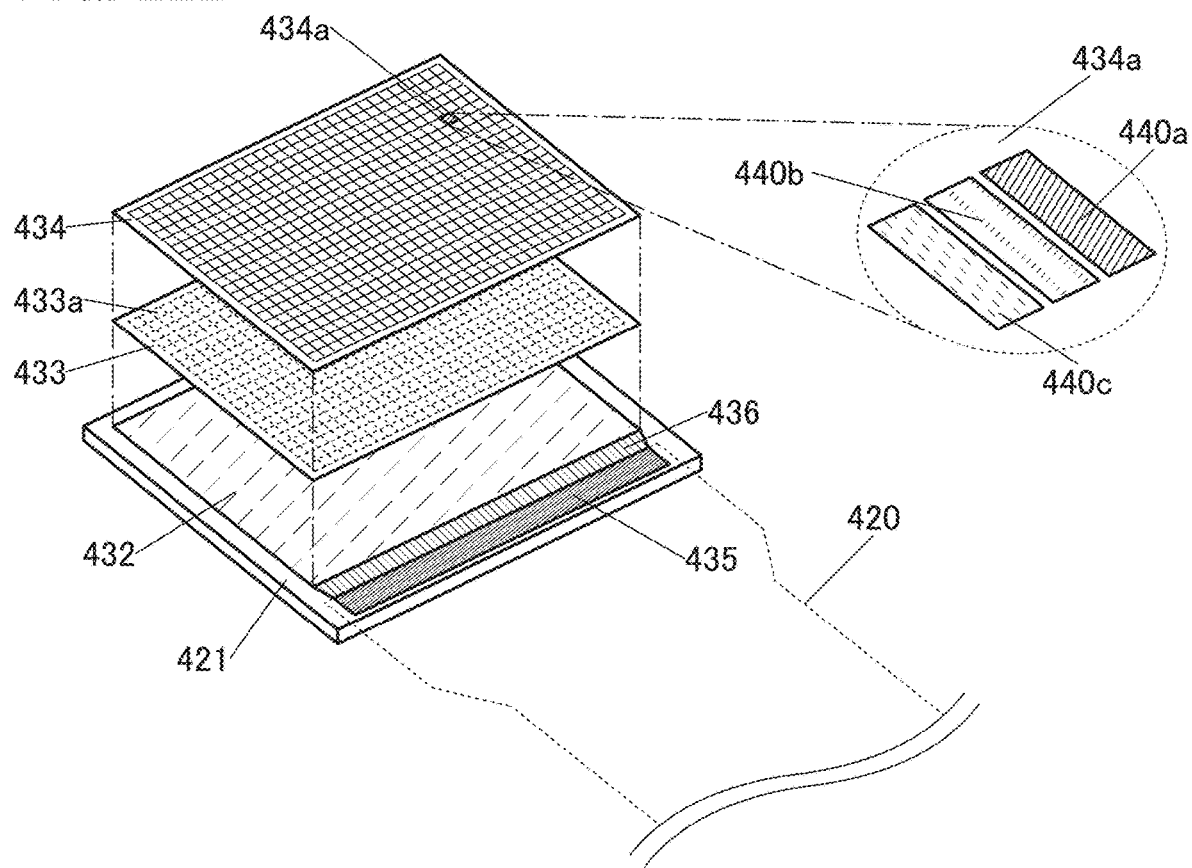

FIG. 22B is a perspective view schematically illustrating a structure on the substrate 421 side. Over the substrate 421, a circuit portion 432, a pixel circuit portion 433 over the circuit portion 432, and the pixel portion 434 over the pixel circuit portion 433 are stacked. In addition, a terminal portion 435 for connection to the FPC 420 is included in a portion not overlapping with the pixel portion 434 over the substrate 421. The terminal portion 435 and the circuit portion 432 are electrically connected to each other through a wiring portion 436 formed of a plurality of wirings.

The pixel portion 434 includes a plurality of pixels 434a arranged periodically. An enlarged view of one pixel 434a is illustrated on the right side in FIG. 22B. The pixel 434a includes light-emitting elements 440a, 440b, and 440c whose emission colors are different from each other. The plurality of light-emitting elements are preferably arranged in a stripe pattern as illustrated in FIG. 22B. With the stripe pattern that enables high-density arrangement of pixel circuits, a high-resolution display device can be provided.

Alternatively, a variety of kinds of patterns such as a delta pattern or a pentile pattern can be employed.

The pixel circuit portion 433 includes a plurality of pixel circuits 433a arranged periodically.

One pixel circuit 433a is a circuit that controls light emission from three light-emitting elements included in one pixel 434a. One pixel circuit 433a may be provided with three circuits each of which controls light emission of one light-emitting element. For example, the pixel circuit 433a can include at least one selection transistor, one current control transistor (driving transistor), and a capacitor for one light-emitting element. A gate signal is input to a gate of the selection transistor, and a source signal is input to one of a source and a drain of the selection transistor. With such a structure, an active-matrix display device is achieved.

The circuit portion 432 includes a circuit for driving the pixel circuits 433a in the pixel circuit portion 433. For example, one or both of a gate line driver circuit and a source line driver circuit are preferably included. In addition, at least one of an arithmetic circuit, a memory circuit, a power supply circuit, and the like may be included.

The FPC 420 serves as a wiring for supplying a video signal or a power supply potential to the circuit portion 432 from the outside. An IC may be mounted on the FPC 420.

The display module 400 can have a structure in which one or both of the pixel circuit portion 433 and the circuit portion 432 are stacked below the pixel portion 434; thus, the aperture ratio (the effective display area ratio) of the display portion 431 can be significantly high. For example, the aperture ratio of the display portion 431 can be greater than or equal to 40% and less than 100%, preferably greater than or equal to 50% and less than or equal to 95%, and further preferably greater than or equal to 60% and less than or equal to 95%. Furthermore, the pixels 434a can be arranged extremely densely and thus the display portion 431 can have greatly high resolution. For example, the pixels 434a are preferably arranged in the display portion 431 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 400 has extremely high resolution, and thus can be suitably used for a device for VR such as a head-mounted display or a glasses-type device for AR. For example, even in the case of a structure in which the display portion of the display module 400 is seen through a lens, pixels of the extremely-high-resolution display portion 431 included in the display module 400 are prevented from being seen when the display portion is enlarged by the lens, so that display providing a high sense of immersion can be performed. Without being limited thereto, the display module 400 can be suitably used for electronic devices including a relatively small display portion. For example, the display module 400 can be favorably used in a display portion of a wearable electronic device, such as a wrist watch.

[Display Device 410A]

Figure 23:
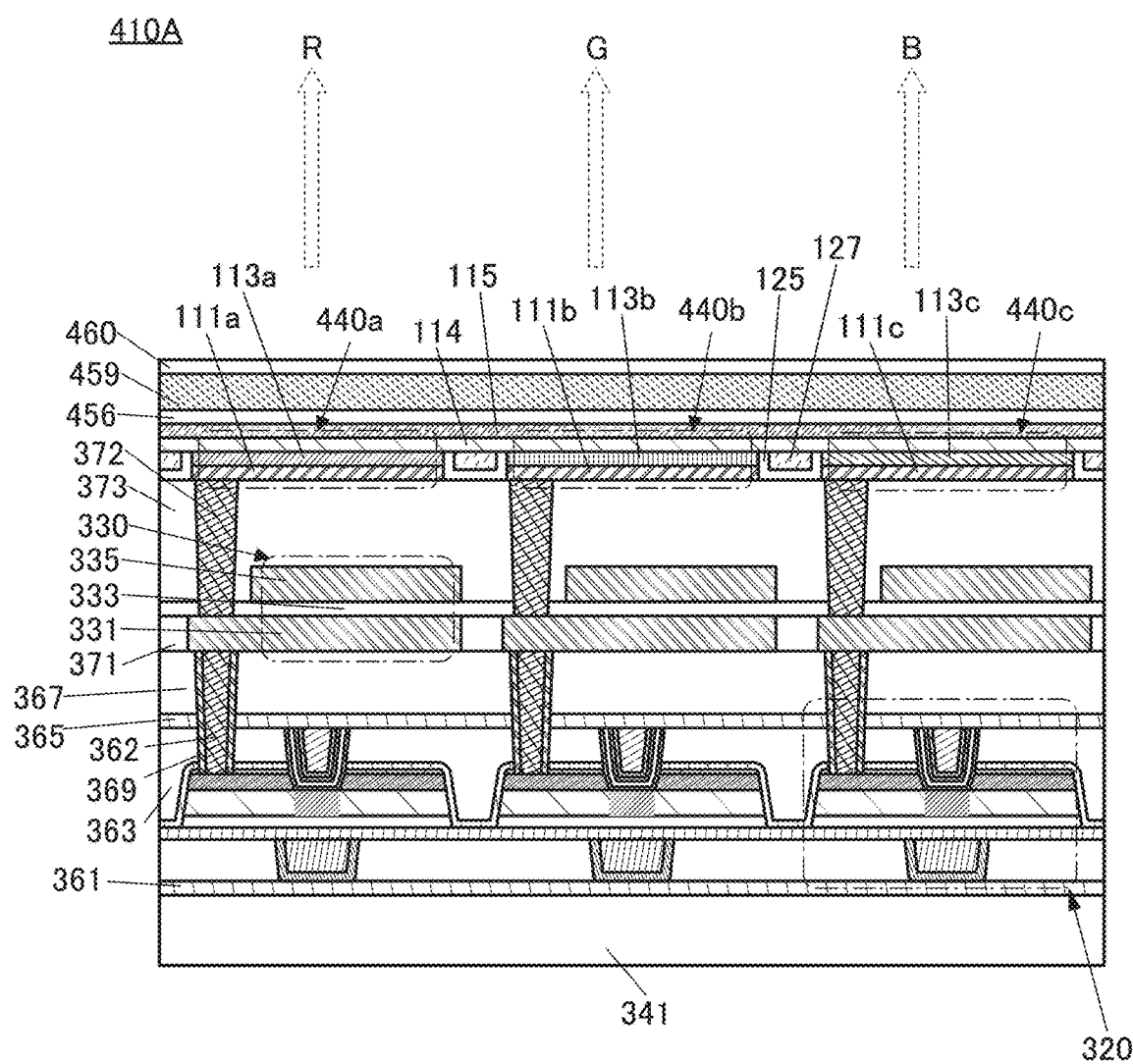
FIG. 23 is a cross-sectional view illustrating an example of a display device.

A display device 410A illustrated in FIG. 23 includes a substrate 341, the light-emitting elements 440a, 440b, and 440c, a capacitor 330, and a transistor 320.

The transistor 320 contains a metal oxide (also referred to as an oxide semiconductor) in a semiconductor layer where a channel is formed. The transistor 200 described in Embodiment 1 can be used as the transistor 320. For the structures and the effect of the transistor 320, the structure example of the transistor 200 illustrated in FIGS. 1A to 1D and the like can be referred to.

The substrate 341 corresponds to the substrate 421 in FIGS. 22A and 22B. As the substrate 341, an insulating substrate or a semiconductor substrate can be used.

An insulating layer 361 is provided over a substrate 341. The insulating layer 361 functions as a barrier layer that prevents diffusion of impurities such as water or hydrogen from the substrate 341 side into the transistor 320 and release of oxygen from the metal oxide in the transistor 320 to the insulating layer 361 side. As the insulating layer 361, for example, a film in which hydrogen or oxygen is less likely to diffuse than in a silicon oxide film can be used. Examples of such a film include an aluminum oxide film, a hafnium oxide film, and a silicon nitride film.

An insulating layer 365 and an insulating layer 367 are provided to cover the transistor 320 and an insulating layer 363. The insulating layer 363 corresponds to the insulator 280 described in Embodiment 1.

The insulating layers 363 and 367 each function as an interlayer insulating layer. The insulating layer 365 functions as a barrier layer that prevents diffusion of impurities such as water or hydrogen from the insulating layer 367 or the like to the transistor 320. As the insulating layer 365, an insulating film similar to the insulating layer 361 can be used.

A plug 362 electrically connected to one of a source and a drain of the transistor 320 is provided to be embedded in the insulating layer 367, the insulating layer 365, and the insulating layer 363. The plug 362 is formed using a single conductive layer or a stacked structure of two or more conductive layers. In the case where the plug 362 is formed using two conductive layers that are stacked, a conductive material through which hydrogen and oxygen are less likely to diffuse is preferably used as a conductive layer that covers a side surface of an opening in the insulating layers 367, 365, and 363, and the like, and part of the top surface of the source or the drain of the transistor 320. Such a structure can inhibit entry of impurities such as water or hydrogen from insulating layer 363 and the like into the metal oxide in the transistor 320 through the plug 362. Furthermore, the structure inhibits oxygen contained in the insulating layer 363 from being absorbed by the plug 362.

An insulating layer 369 is provided in contact with the side surface of the plug 362. That is, the insulating layer 369 may be provided in contact with the inner wall of the opening in the insulating layers 367, 365, 363, and the like, and the plug 362 may be provided in contact with the side surface of the insulating layer 369 and part of the top surface of the source or the drain of the transistor 320. Note that the insulating layer 369 is not necessarily provided.

The transistor 320 can be used as a transistor included in the pixel circuit. The transistor 320 can also be used as transistors included in a variety of circuits such as an arithmetic circuit and a memory circuit.

The insulating layer 367 is provided to cover the transistor 320, and the capacitor 330 is provided over the insulating layer 367. The capacitor 330 and the transistor 320 are electrically connected to each other through the plug 362.

The capacitor 330 includes a conductive layer 331, a conductive layer 335, and an insulating layer 333 therebetween. The conductive layer 331 functions as one electrode of the capacitor 330, the conductive layer 335 functions as the other electrode of the capacitor 330, and the insulating layer 333 functions as a dielectric of the capacitor 330.

The conductive layer 331 is provided over the insulating layer 367 and is embedded in an insulating layer 371. The conductive layer 331 is electrically connected to one of the source and the drain of the transistor 320 through a plug 362 embedded in the insulating layer 367 and the like. The insulating layer 333 is provided to cover the conductive layer 331. The conductive layer 335 is provided in a region overlapping with the conductive layer 331 with the insulating layer 333 therebetween.

An insulating layer 373 is provided to cover the capacitor 330, and the light-emitting elements 440a, 440b, and 440c are provided over the insulating layer 373. A protective layer 456 is provided over the light-emitting elements 440a, 440b, and 440c, and a substrate 460 is bonded to a top surface of the protective layer 456 with a resin layer 459. An insulator is provided in a region between adjacent light-emitting elements. In FIG. 23, an insulating layer 125 and an insulating layer 127 over the insulating layer 125 are provided in the region. The substrate 460 corresponds to the substrate 422 in FIGS. 22A and 22B.

The embodiment shows an example of a top-emission display device in which light is emitted to the side opposite to the substrate where the light-emitting device is formed. Note that the display device may have a bottom-emission structure in which light is emitted to the substrate side where the light-emitting device is formed or a dual-emission structure in which light is emitted to the both sides.

The light-emitting elements 440a, 440b, and 440c are preferably organic electroluminescence elements (organic EL elements). For example, the light-emitting element 440a emits red light (R), the light-emitting element 440b emits green light (G), and the light-emitting element 440c emits blue light (B). The display device 410A includes three kinds of light-emitting elements emitting red (R), green (G), and blue (B) colors, thereby achieving full-color display. Note that FIG. 23 illustrates an example in which the display device 410A includes light-emitting elements of three colors; however, the present invention is not limited thereto, and the display device may include light-emitting element(s) of a single color, two colors or four or more colors.

The light-emitting element includes an EL layer between a pair of electrodes. In this specification and the like, one of the pair of electrodes is referred to as a pixel electrode, and the other electrode is referred to as a common electrode in some cases. One of the pair of electrodes in the light-emitting device serves as an anode, and the other electrode serves as a cathode. Hereinafter, the case where the pixel electrode serves as an anode and the common electrode serves as a cathode is described as an example.

The light-emitting element 440a includes a pixel electrode 111a over the insulating layer 373, a first layer 113a in an island shape over the pixel electrode 111a, a fourth layer 114 over the first layer 113a in an island shape, and a common electrode 115 over the fourth layer 114. In the light-emitting element 440a, the first layer 113a and the fourth layer 114 can be collectively referred to as an EL layer.

The light-emitting element 440b includes a pixel electrode 111b, a second layer 113b, a fourth layer 114, and the common electrode 115. The light-emitting element 440c includes the pixel electrode 111c, a third layer 113c, the fourth layer 114, and the common electrode 115.

In the cross-sectional observation, a region where the side surface of the lower electrode (pixel electrode) and the side surface of the light-emitting layer are aligned or substantially aligned is included. In the top view, the top-surface shape of the lower electrode can be regarded as being aligned or substantially aligned with the top-surface shape of the light-emitting layer.

Note that in this specification and the like, the expression "side surfaces are substantially aligned with each other" or "the top-surface shapes are substantially aligned with each other" means that at least part of outlines overlap with each other between the upper layer and the lower layer in the top view. For example, the case of patterning or partly patterning the upper layer and the lower layer with use of the same mask pattern is included in the expression. The expression "the side surfaces are substantially aligned with each other" or "the top-surface shapes are substantially aligned with each other" also includes the case where the outlines do not completely overlap with each other; for instance, the edge of the upper layer may be positioned on the inner side or the outer side of the edge of the lower layer.

The same film is shared by the light-emitting elements of three colors as the common electrode. The common electrode 115 shared by the light-emitting elements is electrically connected to a wiring provided below the plug 372 through the plug 372 (not illustrated). Thus, the same potential is supplied to the common electrodes of the light-emitting elements of three colors.

The pixel electrode of the light-emitting element is electrically connected to one of the source and the drain of the transistor 320 through the plug 372 embedded in the insulating layer 373, the conductive layer 331 embedded in the insulating layer 371, and the plug 362 embedded in the insulating layer 367, and the like. The tops surface of the insulating layer 373 and the top surface of the plug 372 are level or substantially level with each other. Any of a variety of conductive materials can be used for the plug.

Note that the details the light-emitting element will be described in Embodiment 3.

As a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film, accordingly, it is difficult to achieve high resolution and high aperture ratio of the display device. Thus, a measure has been taken for pseudo improvement in resolution (also referred to pixel density). As a specific measure, a unique pixel arrangement such as a PenTile pattern has been employed.

For example, fine patterning of an EL layer is performed without a shadow mask such as a metal mask. With the patterning, a high-resolution display device with a high aperture ratio, which had been difficult to achieve, can be fabricated. Moreover, EL layers can be formed separately, which enables extremely clear images; thus, a display device with a high contrast and high display quality can be fabricated.

Here, a description is made on a case where EL layers in light-emitting elements of two colors are separately formed, for simplicity. First, a stack of a first EL film and a first sacrificial film is formed to cover two pixel electrodes. Next, a resist mask is formed over the first sacrifice film and in a position overlapping with the one pixel electrode (a first pixel electrode). Then, the resist mask, the part of the first sacrificial film, and part of the first EL film are etched. At this time, the etching is stopped when the other pixel electrodes (a second pixel electrode) are exposed. Thus, part of the first EL film processed into a belt-like or island shape (also referred to as a first EL layer) can be formed over the first pixel electrode, and part of the sacrificial film (also referred to as a first sacrificial layer) can be formed thereover. Note that the sacrificial film may be called a mask film.

Next, a stack of a second EL film and a second sacrificial film is formed. Then, resist masks are formed in a position overlapping with the first pixel electrode and in a position overlapping with the second pixel electrode. Then, the resist masks, part of the second sacrificial film, and part of the second EL film are partly etched in a manner similar to the above. As a result, the first EL layer and the first sacrificial layer are provided over the first pixel electrode, and a second EL layer and a second sacrificial layer are provided over the second pixel electrode. In this manner, the first EL layer and the second EL layer can be formed separately. Finally, the first and second sacrificial layers are removed to expose the first and second EL layers, and then the common electrode is formed, so that the light-emitting elements of two colors can be formed separately. Note that the sacrificial layer may be called a mask layer.

Furthermore, by repeating the above-described steps, EL layers in light-emitting elements of three or more colors can be separately formed. Accordingly, a display device including light-emitting elements of three or more colors can be achieved.

Note that an electrode (also referred to as a first electrode, a connection electrode, or the like), which is to supply a potential to the common electrode, can be formed on the same plane as the pixel electrode to be electrically connected to the common electrode. The connection electrode is located outside the display portion including the pixels. In order to prevent a top surface of the connection electrode from being exposed in etching of the first EL film, it is preferable that the first sacrificial layer be also provided over the connection electrode. Also in etching of the second EL film, the second sacrificial layer is preferably provided over the connection electrode. The first and sacrificial layers provided over the connection electrode can be removed by etching concurrently with the first and second sacrificial layers over the first and second EL layers.

In the case where EL layers for different colors are adjacent to each other, it is difficult to set the distance between the EL layers adjacent to each other to be less than 10 μm with a formation method using a metal mask, for example. In contrast, with use of the above method, the distance can be decreased to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region exiting between two light-emitting elements can be significantly reduced, and the aperture ratio can be close to 100%. For example, the aperture ratio may be higher than or equal to 50%, higher than or equal to 60%, higher than or equal to 70%, higher than or equal to 80%, or higher than or equal to 90%; that is, the aperture ratio lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the whole pattern area. In contrast, in the manufacturing method, a pattern is formed by processing a film deposited to have a uniform thickness, which enables a uniform thickness in the pattern. Thus, even in the fine pattern, almost the whole area can be used as a light-emitting region. Therefore, the above method makes it possible to obtain a high resolution display device with a high aperture ratio.

As described above, with the above manufacturing method, a display device in which minute light-emitting elements are integrated can be achieved, and it is not necessary to conduct a pseudo improvement in resolution with a unique pixel arrangement such as a PenTile pattern. Thus, with what is called a stripe pattern where R, G, and B are arranged in one direction, a high-resolution display device, greater than or equal to 500 ppi, greater than or equal to 1000 ppi, greater than or equal to 2000 ppi, greater than or equal to 3000 ppi, or greater than or equal to 5000 ppi, can be achieved.

Side surfaces of the pixel electrodes 111a, 111b, and 111c, the first layer 113a, the second layer 113b, and the third layer 113c are covered with the insulating layer 125 and the insulating layer 127. A fourth layer 114 is provided over the first layer 113a, the second layer 113b, the third layer 113c, the insulating layer 125, and the insulating layer 127, and the common electrode 115 is provided over the fourth layer 114.

With the above structure, the fourth layer 114 (or the common electrode 115) can be prevented from being in contact with any of the side surfaces of the pixel electrodes 111a, 111b, and 111c, the first layer 113a, the second layer 113b, and the third layer 113c, so that the light-emitting elements can be prevented from being short-circuited.

The insulating layer 125 preferably covers at least the side surfaces of the pixel electrodes 111a, 111b, and 111c. Furthermore, the insulating layer 125 preferably covers the side surfaces of the first layer 113a, the second layer 113b, and the third layer 113c. The insulating layer 125 can be in contact with side surfaces of the pixel electrodes 111a, 111b, and 111c, the first layer 113a, the second layer 113b, and the third layer 113c.

The insulating layer 127 is provided over the insulating layer 125 to fill a depressed portion formed in the insulating layer 125. The insulating layer 127 can overlap with the side surfaces of the pixel electrodes 111a, 111b, and 111c, the first layer 113a, the second layer 113b, and the third layer 113c with the insulating layer 125 provided therebetween.

Note that either the insulating layer 125 or the insulating layer 127 is not necessarily provided. In the case where the insulating layer 125 is not provided, the insulating layer 127 can be in contact with side surfaces of the first layer 113a, the second layer 113b, and the third layer 113c. In addition, the display device may include an insulating layer covering an end portion of the pixel electrode. In this case, one or both of the insulating layer 125 and the insulating layer 127 may be provided over the insulating layer.

The fourth layer 114 and the common electrode 115 are provided over the first layer 113a, the second layer 113b, the third layer 113c, the insulating layer 125, and the insulating layer 127. Before the insulating layer 125 and the insulating layer 127 are provided, a step is generated due to a difference between a region where the pixel electrode and the EL layer are provided and a region where neither the pixel electrode nor the EL layer is provided (region between the light-emitting elements). In the display device of one embodiment of the present invention, the step can be planarized with the insulating layer 125 and the insulating layer 127, and the coverage with the fourth layer 114 and the common electrode 115 can be improved. Thus, connection defects caused by disconnection can be inhibited. Alternatively, an increase in electrical resistance, which is caused by a reduction in thickness locally of the common electrode 115 due to the step, can be prevented.

To improve the planarity of a surface over which the fourth layer 114 and the common electrode 115 are formed, the levels of the top surfaces of the insulating layers 125 and 127 are preferably aligned or substantially aligned with at least one of levels of the top surfaces of the first layer 113a, the second layer 113b, and the third layer 113c. Although the top surface of the insulating layer 127 preferably has a flat surface, a projection or depression portion may be provided.

The insulating layer 125 includes regions in contact with the side surfaces of the first layer 113a, the second layer 113b, and the third layer 113c, and functions as a protective insulating layer of the first layer 113a, the second layer 113b, and the third layer 113c. With the insulating layer 125, entry of impurities such as oxygen or moisture from the side surfaces of the first, second, and third layers 113a, 113b, and 113c into their insides can be prevented, and thus a highly reliable display device can be obtained.

When the widths (thicknesses) of the insulating layer 125 in the regions in contact with the side surfaces of the first, second, and third layers 113a, 113b, and 113c are large in the cross-sectional view, the distance between the first, second, and third layers 113a, 113b, and 113c is large, which results in a reduction in aperture ratio in some cases. When the widths (thicknesses) of the insulating layer 125 in the regions in contact with the side surfaces of the first, second, and third layers 113a, 113b, and 113c are small in the cross-sectional view, the effect of preventing the entry of the impurities from the side surfaces of the first, second, and third layers 113a, 113b, and 113c into their insides is lowered in some cases. In the cross-sectional view, the widths (thicknesses) of the insulating layer 125 in the regions in contact with the side surfaces of the first, second, and third layers 113a, 113b, and 113c are preferably greater than or equal to 3 nm and less than or equal to 200 nm, further preferably greater than or equal to 3 nm and less than or equal to 150 nm, still further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet still further preferably greater than or equal to 10 nm and less than or equal to 50 nm. When the width (thickness) of the insulating layer 125 is within the above range, a highly reliable display device with high aperture ratio can be obtained.

The insulating layer 125 can be formed using an inorganic material. For the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the nitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 is formed in a later step. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

The insulating layer 125 can be deposited by a sputtering method, a CVD method, a PLD method, an ALD method, or the like. The insulating layer 125 is preferably formed by an ALD method achieving good coverage.

The insulating layer 127 over the insulating layer 125 has a function of reducing the depression portion in the insulating layer 125 formed between adjacent light-emitting devices. In other words, the insulating layer 127 brings an effect of improving the planarity of a surface where the common electrode 115 is formed. As the insulating layer 127, an insulating layer containing an organic material can be favorably used. Examples of materials used for the insulating layer 127 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Examples of an organic materials used for the insulating layer 127 include polyvinyl alcohol (PVA), polyvinylbutyral, polyvinylpyrrolidone, polyethylene glycol, polyglycerin, pullulan, water-soluble cellulose, and an alcohol-soluble polyamide resin. Alternatively, a photosensitive resin (also referred to as an organic resin) can be used as the insulating layer 127. A photoresist may be used for the photosensitive resin. As the photosensitive resin, a positive photosensitive material or a negative photosensitive material can be used.

The level difference between the top surface of the insulating layer 127 and the top surface of any of the first, second, or third layer 113a, 113b, or 113c is, preferably, for example, less than or equal to 0.5 times the thickness of the insulating layer 127, further preferably less than or equal to 0.3 times the thickness of the insulating layer 127. The insulating layer 127 may be provided so that the level of the top surface of any of the first, second, or third layer 113a, 113b, or 113c is higher than the level of the top surface of the insulating layer 127, for example. Further alternatively, the insulating layer 127 may be provided so that the level of the top surface of insulating layer 127 is higher than the level of the top surface of the light-emitting layer included in the first, second, or third layer 113a, 113b, or 113c.

[Display Device 410B]

Figure 24:
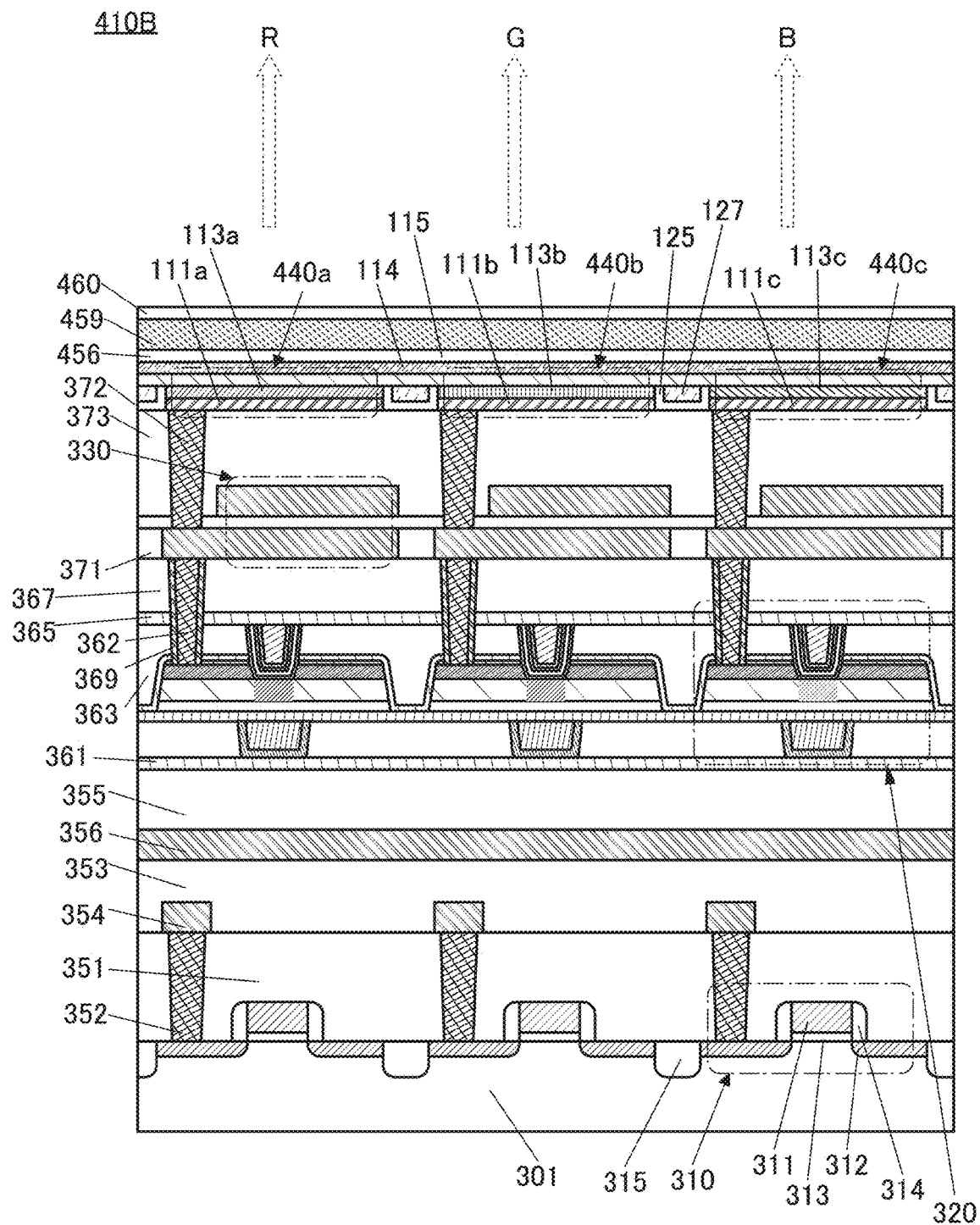
FIG. 24 is a cross-sectional view illustrating an example of a display device.

A display device 410B illustrated in FIG. 24 is different from the display device 410A mainly in a structure of the transistor. Note that portions similar to those in the display device 410A are not be described in some cases.

A substrate 301 corresponds to the substrate 421 illustrated in FIGS. 22A and 22B.

The transistor 310 includes a channel formation region in the substrate 301. As the substrate 301, a semiconductor substrate such as a single crystal silicon substrate can be used, for example. The transistor 310 includes part of the substrate 301, a conductive layer 311, a pair of low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The pair of low-resistance regions 312 are regions where the substrate 301 is doped with an impurity, and function as a source and a drain. The insulating layer 314 is provided so as to cover a side surface of the conductive layer 311 and functions as an insulating layer.

An element isolation layer 315 is provided between two adjacent transistors 310 to be embedded in the substrate 301.

An insulating layer 351 is provided to cover the transistor 310, and a conductive layer 354 is provided over the insulating layer 351. The conductive layer 354 is electrically connected to one of the source and the drain of the transistor 310 through a plug 352 embedded in the insulating layer 351. An insulating layer 353 is provided to cover the conductive layer 354, and a conductive layer 356 is provided over the insulating layer 353. The conductive layer 354 and the conductive layer 356 each function as a wiring. An insulating layer 355 and the insulating layer 361 are provided to cover the conductive layer 356, and the transistor 320 is provided over the insulating layer 361.

The transistor 310 can be used as a transistor included in the pixel circuit or a transistor included in a driver circuit (one or both of a gate driver and a source driver) for driving the pixel circuit. The transistor 310 can also be used as transistors included in a variety of circuits such as an arithmetic circuit and a memory circuit.

With such a structure, not only the pixel circuit but also the driver circuit or the like can be formed directly under the light-emitting element; thus, the display device can be downsized as compared with the case where the driver circuit is provided around a display portion.

Example of Structure of Pixel Circuit

A structural example of a pixel circuit applicable to the display device of one embodiment of the present invention is described below.

Figure 25A:
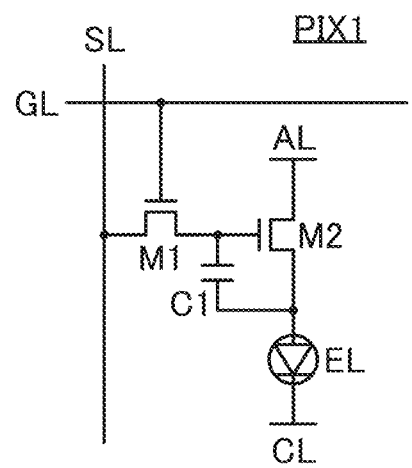
FIGS. 25A to 25D are circuit diagrams each showing a structure example of a display device.

A pixel circuit PIX1 illustrated in FIG. 25A includes a transistor M1, a transistor M2, a capacitor C1, and a light-emitting element EL. Wirings SL, GL, AL, and CL are electrically connected to the pixel circuit PIX1.

A gate of the transistor M1 is electrically connected to the wiring GL, one of a source and a drain of the transistor M1 is electrically connected to the wiring SL, and the other of the source and the drain of the transistor M1 is electrically connected to a gate of the transistor M2 and one electrode of the capacitor C1. One of a source and a drain of the transistor M2 is electrically connected to the wiring AL and the other of the source and the drain of the transistor M2 is electrically connected to an anode of the light-emitting element EL. The other electrode of the capacitor C1 is electrically connected to the anode of the light-emitting element EL. A cathode of the light-emitting element EL is electrically connected to the wiring CL.

The transistor M1 can be referred to as a selection transistor and functions as a switch for controlling selection/non-selection of the pixel. The transistor M2 can be referred to as a driver transistor and has a function of controlling a current flowing to the light-emitting element EL. The capacitor C1 functions as a storage capacitor and has a function of retaining a gate potential of the transistor M2. A capacitor such as a MIM capacitor may be used as the capacitor C1; alternatively, capacitance between wirings, a gate capacitance of the transistor, or the like may be used as the capacitor C1.

The wiring SL is supplied with a source signal. The wiring GL is supplied with a gate signal. The wirings AL and CL are each supplied with a constant potential. In the light-emitting element EL, the anode side can have a high potential and the cathode side can have a lower potential than the anode side.

Figure 25B:
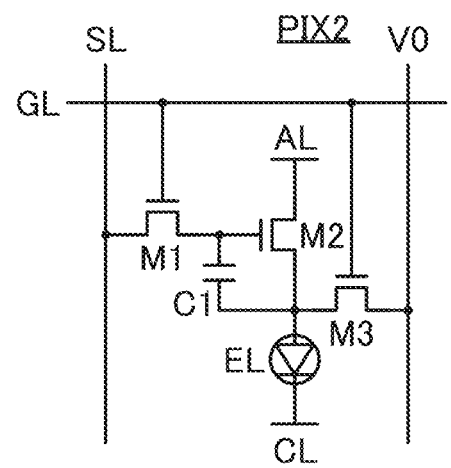

A pixel circuit PIX2 illustrated in FIG. 25B has a structure in which a transistor M3 is added to the pixel circuit PIX1. In addition, a wiring V0 is electrically connected to the pixel circuit PIX2.

A gate of the transistor M3 is electrically connected to the wiring GL, one of a source and a drain of the transistor M3 is electrically connected to the anode of the light-emitting element EL, and the other of the source and the drain of the transistor M3 is electrically connected to the wiring V0.

The wiring V0 is supplied with a constant potential when data is written to the pixel circuit PIX2. Thus, a variation in the gate-source voltage of the transistor M2 can be inhibited.

Figure 25C:
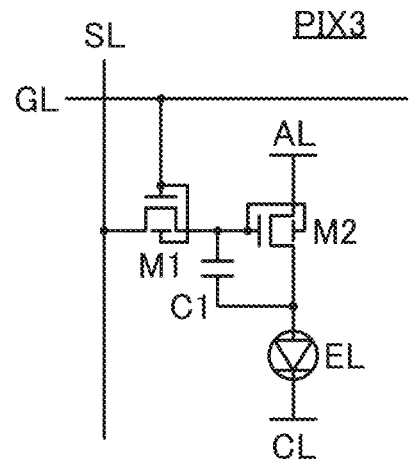
Figure 25D:
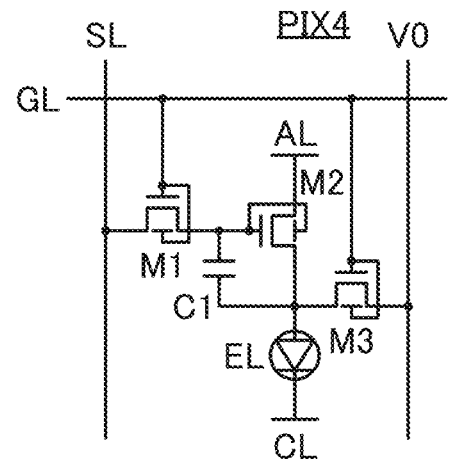

A pixel circuit PIX3 illustrated in FIG. 25C is an example in the case where a transistor in which a pair of gates are electrically connected to each other is used as each of the transistors M1 and M2 of the pixel circuit PIX1. A pixel circuit PIX4 illustrated in FIG. 25D is an example in the case where such transistors are used in the pixel circuit PIX2. With these structures, a current that can flow through the transistors can be increased. Although the transistor in which the pair of gates are connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 26A:
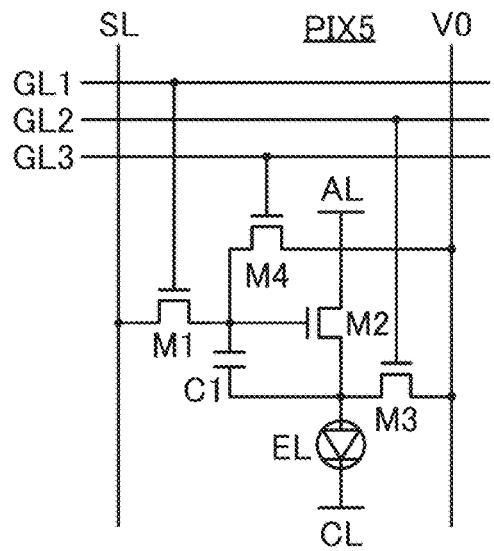
FIGS. 26A to 26D are circuit diagrams each showing a structure example of a display device.

A pixel circuit PIX5 illustrated in FIG. 26A has a structure in which a transistor M4 is added to the pixel circuit PIX2. Three wirings (wirings GL1, GL2, and GL3) functioning as gate lines are electrically connected to the pixel circuit PIX5.

A gate of the transistor M4 is electrically connected to the wiring GL3, one of a source and a drain of the transistor M4 is electrically connected to the gate of the transistor M2, and the other of the source and the drain of the transistor M4 is electrically connected to the wiring V0. The gate of the transistor M1 is electrically connected to the wiring GL1, and the gate of the transistor M3 is electrically connected to the wiring GL2.

When the transistors M3 and M4 are turned on at the same time, the source and the gate of the transistor M2 have the same potential, so that the transistor M2 can be turned off. Thus, a current flowing to the light-emitting element EL can be blocked forcibly. Such a pixel circuit is suitable for the case of using a display method in which a display period and an off period are alternately provided.

Figure 26B:
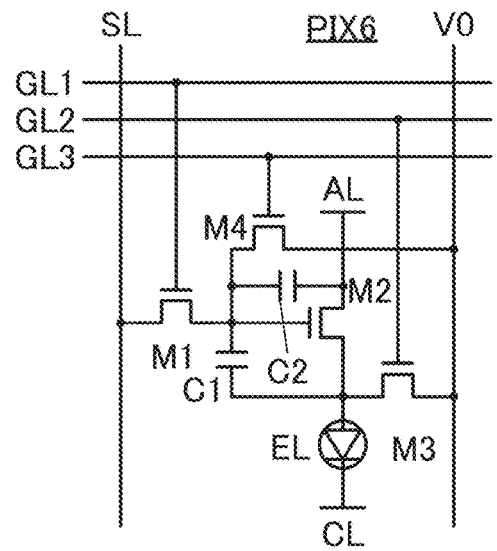

A pixel circuit PIX6 illustrated in FIG. 26B is an example in the case where a capacitor C2 is added to the pixel circuit PIX5. One electrode of the capacitor C2 is electrically connected to the gate of the transistor M2, and the other electrode is electrically connected to the wiring AL. The capacitor C2 functions as a storage capacitor.

Figure 26C:
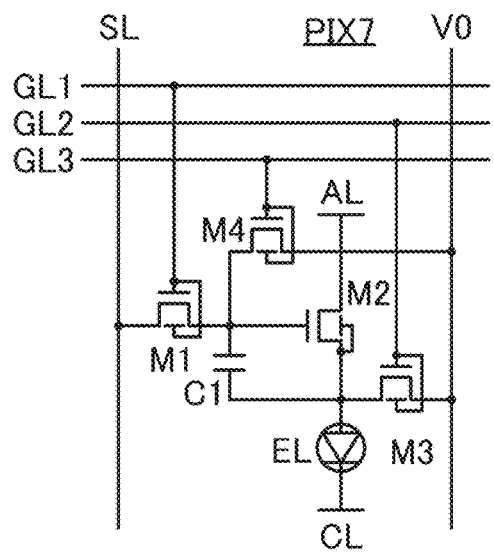
Figure 26D:
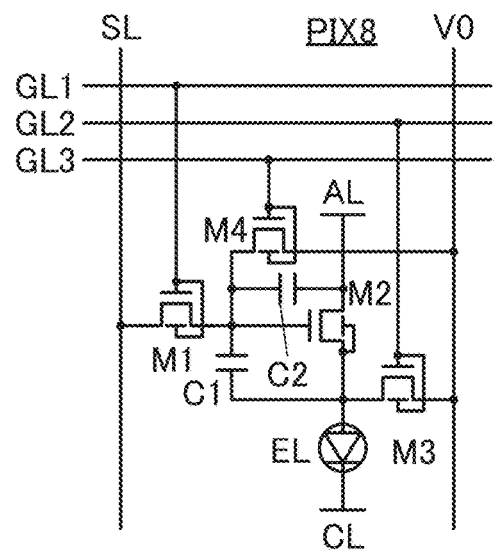

A pixel circuit PIX7 illustrated in FIG. 26C is an example in the case where transistors including a pair of gates are employed in the pixel circuit PIX5. A pixel circuit PIX8 illustrated in FIG. 26D is an example in the case where transistors including a pair of gates are employed in the pixel circuit PIX6. A transistor in which a pair of gates are electrically connected to each other is used as each of the transistors M1, M3, and M4, and a transistor in which one of gates is electrically connected to a source is used as the transistor M2.

[$V_{sh}$ Degradation Tolerance Amount]

Each transistor M1 illustrated in FIGS. 25A to 25D and FIGS. 26A to 26D need to maintain charges accumulated in the capacitor C1 and/or the capacitor C2 for a long time. In other words, the transistor M1 is required to have normally-off characteristics. $V_{sh}$ degradation tolerance amount of the transistor M1, with which the pixel operation is normally performed, is described below.

Here, the $V_{sh}$ degradation tolerance amount of the transistor M1 in of the pixel circuit PIX8 illustrated in FIG. 26D is calculated.

First, a calculation method of $I^{off}$ of the transistor M1, which is crucial to maintain charges accumulated in the capacitors C1 and C2, is described.

The basic formula of a capacitor is shown below as Formula (1)

[Formula 7]

$$Q = CV = I_{off} \times t \quad (1)$$

In Formula (1), Q represents charges retained in the capacitors C1 and C2, C represents combined capacitance of the capacitors C1 and C2, V represents a variation in voltage, and t represents a retention time. Here, assuming that $I_{off}$ has no time dependence, Formula (1) can be regarded as Formula (2).

[Formula 8]

$$I_{off} = \frac{CV}{t} \quad (2)$$

Note that assuming that the variation V in voltage is equivalent to the full grayscale range GR of the source line, V is calculated from Formula (3).

[Formula 9]

$$V = \frac{Vgs2 - Vgs1}{GR} \quad (3)$$

In Formula (3), $V_{gs}1$ represents a gate-source voltage under the condition of full-white display, and $V_{gs}2$ represents a gate-source voltage under the condition of full-black display. Using Formula (2) and the variation V calculated from Formula (3), $I_{off}$ of the transistor M1, which is crucial to maintain charges accumulated in the capacitor C1, can be calculated.

Next, a calculation method of $V_{sh}$ crucial to the transistor M1 under the full-black display condition is described. Hereinafter, $V_{sh}$ crucial to the transistor M1 under the full-black display condition is denoted by $V_{sh}1$.

The transistor M1 under the full-black display condition is regarded as in the subthreshold region. At this time, the subthreshold leakage is presumably a domination term of $I_{off}$. The subthreshold leakage is calculated by Formula (4).

[Formula 10]

$$I_{off} = 1 \times 10^{-12} \times 10^{\frac{-Vsh1 + Vdd}{SS}} \quad (4)$$

In Formula (4), $V_{sh}1$ represents a gate-source voltage $V_{gs}$ when the drain current $I_d$ is 1 pA, $V_{dd}$ represents a gate-source voltage $V_{gs}2$ under the full-black display condition, and SS represents a subthreshold slope. Note that Formula (4) can be replaced with Formula (5).

[Formula 11]

$$Vsh1 = Vdd - SS \times \{\log_{10}(I_{off}) + 12\} \quad (5)$$

With Formula (5), $V_{sh}1$ can be calculated.

Table 4 shows an example of specifications of the pixel circuit PIX8.

TABLE 4

| | |
|---|---|
| Drive frequency | 90 Hz |
| Duty | 20% |
| Retention time t | 2.22 ms |
| Gate-source voltage under full-black display condition Vgs2 | −0.5 V |
| Drain-source voltage under full-black display condition Vds2 | 0 V |
| Gate-source voltage under full-white display condition Vgs1 | −3.75 V |
| Drain-source voltage under full-white display condition Vds1 | 0 V |
| Full grayscale range GR of source line | 256 gray levels (=8 bits) |
| Combined capacitance C of capacitor C1 and capacitor C2 | 20.4 fF |
| Subthreshold slope SS of transistor M1 | 100 mV/dec. |

By the calculation using the specifications of the pixel circuit PIX8 shown in Table 4 and Formula (3), the variation in voltage V is found to be 0.0127 V. In addition, off of the transistor M1, which is crucial to maintain charges accumulated in the capacitors C1 and C2, is found to be $1.17 \times 10^{-13}$ A from the calculation with use of the calculated variation in V and Formula (2). On the basis of the calculated $I_{off}$ of the transistor M1, which is crucial to maintain charges accumulated in the capacitors C1 and C2, and Formula (5), $V_{sh}1$ is estimated to be −0.407 V.

The full-black display condition is the minimum requirements to maintain charges accumulated in the capacitors C1 and C2. When $V_{sh}$ of the transistor M1 is higher than or equal to $V_{sh}1$, normal pixel operation is presumably performed in the pixel circuit PIX8. Thus, $V_{sh}$ of the transistor M1 is preferably higher than or equal to −0.4 V.

Note that $V_{sh}1$ depends on the subthreshold slope SS. The subthreshold slope SS increases, in some cases, depending on the temperature condition in the NBTIS test, the thickness of the gate insulator, or the like. When the subthreshold slope SS is 200 mV/dec., $V_{sh}1$ is estimated to be −0.313 V. Therefore, $V_{sh}$ of the transistor M1 is further preferably higher than or equal to −0.3 V.

As described above, a transistor whose $V_{sh}$ is higher than or equal to −0.4 V, preferably higher than or equal to −0.3 V is used as the transistor M1, whereby the pixel operation in the pixel circuit can be normally performed. Thus, a display device in which degradation in transistor characteristics due to stray is small can be provided. Furthermore, a display device with stable pixel operation can be provided.

Note that the transistor 200 described in Embodiment 1 can be used as the transistor M1 included in the pixel circuit PIX8 illustrated in FIG. 26D. In other words, it can be said that the pixel operation in the pixel circuit is normally performed when $V_{sh}$ of the transistor 200 described in Embodiment 1 is higher than or equal to −0.4 V, preferably higher than or equal to −0.3 V. Thus, $V_{sh}$ of the transistor 200 described in Embodiment 1 is preferably higher than or equal to −0.4 V, further preferably higher than or equal to −0.3 V, in some cases.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Embodiment 3

In this embodiment, a light-emitting element (also referred to as light-emitting device) that can be used in the display device of one embodiment of the present invention will be described.

Structure Example of Light-Emitting Element

Figure 27A:
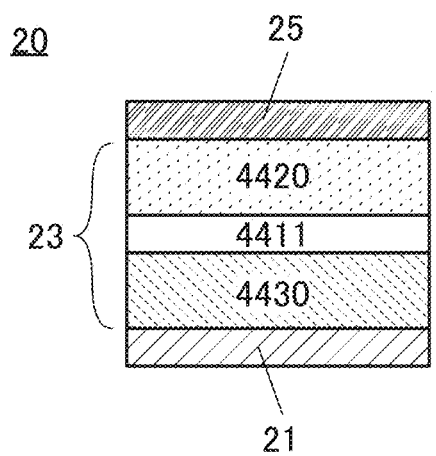
FIGS. 27A to 27D each illustrate a structure example of a light-emitting element.

As illustrated in FIG. 27A, the light-emitting element includes an EL layer 23 between a pair of electrodes (a lower electrode 21 and an upper electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 27A is referred to as a single structure in this specification.

Figure 27B:
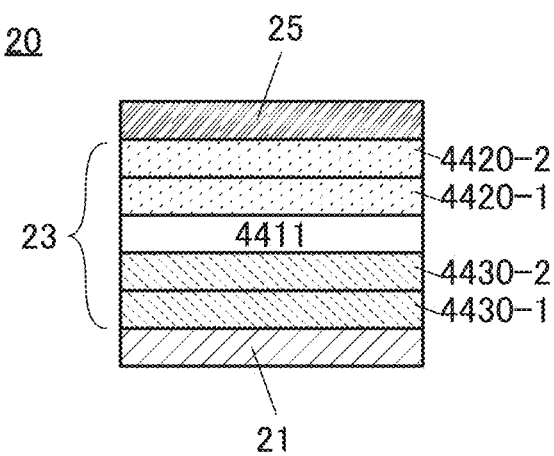

FIG. 27B is a modification example of the EL layer 23 included in the light-emitting element 20 illustrated in FIG. 27A. Specifically, the light-emitting element 20 illustrated in FIG. 27B includes a layer 4430-1 over the lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layered structure, carriers can be efficiently injected to the light-emitting layer 4411, and the efficiency of the recombination of carriers in the light-emitting layer 4411 can be enhanced.

Figure 27C:
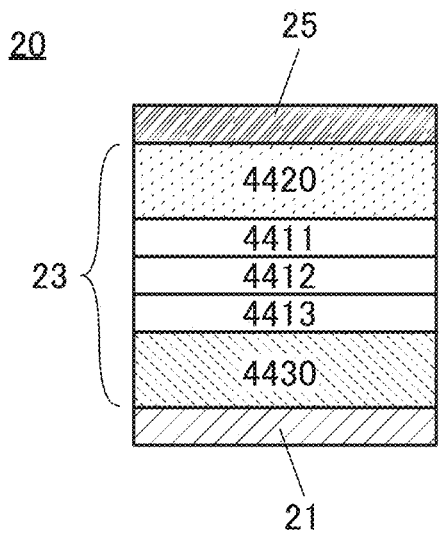

The structure in which a plurality of light-emitting layers (light-emitting layers 4411, 4412, and 4413) is provided between the layer 4420 and the layer 4430 as illustrated in FIG. 27C is another variation of the single structure.

Figure 27D:
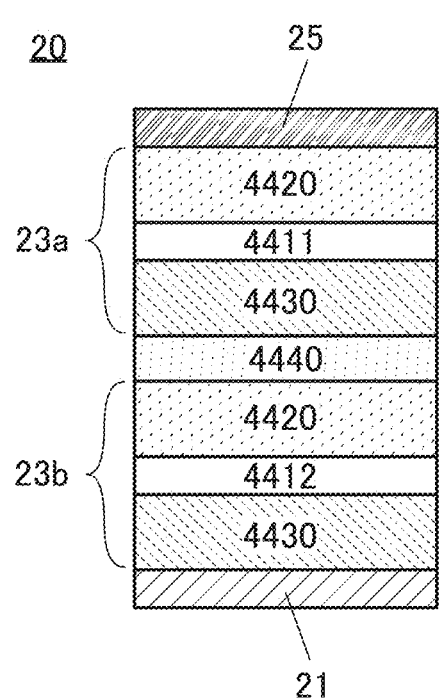

The structure in which a plurality of light-emitting units (EL layers 23a and 23b) is connected in series with an intermediate layer 4440 therebetween as illustrated in FIG. 27D is referred to as a tandem structure in this specification. The intermediate layer 4440 is sometimes referred to as a charge-generation layer. In this specification and the like, the structure illustrated in FIG. 27D is referred to as a tandem structure; however, without being limited to this, a tandem structure may be referred to as a stack structure, for example. The tandem structure enables a light-emitting device capable of high luminance light emission.

Also in the structures illustrated in FIGS. 27C and 27D, the layers 4420 and 4430 may each have a stacked-layer structure of two or more layers as illustrated in FIG. 27B.

The emission color of the light-emitting element can be changed to red, green, blue, cyan, magenta, yellow, white, or the like depending on the material of the EL layer 23. When the light-emitting elements have a microcavity structure, the color purity can be further increased.

A light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

Here, a specific structure example of a light-emitting element will be described.

The light-emitting element includes at least a light-emitting layer. In addition to the light-emitting layer, the light-emitting element may further include a layer containing any of a substance with a high hole-injection property, a substance with a high hole-transport property, a hole-blocking material, a substance with a high electron-transport property, an electron-blocking material, a substance with a high electron-injection property, a substance with a bipolar property (a substance with a high electron- and hole-transport property), and the like.

For the light-emitting element, either a low-molecular compound or a high-molecular compound can be used, and an inorganic compound may also be used. Each of the layers included in the light-emitting element can be formed by any of the following methods: an evaporation method (including a vacuum evaporation method), a transfer method, a printing method, an inkjet method, a coating method, and the like.

For example, the light-emitting element can include one or more of the hole-injection layer, the hole-transport layer, the hole-blocking layer, an electron-blocking layer, an electron-transport layer, and an electron-injection layer.

The hole-injection layer injects holes from an anode to the hole-transport layer and contains a material with a high hole-injection property. As the material with a high hole-injection property, an aromatic amine compound, a composite material containing a hole-transport material and an acceptor material (electron-accepting material), or the like can be used.

The hole-transport layer transports holes injected from the anode by the hole-injection layer, to the light-emitting layer. The hole-transport layer contains a hole-transport material. The hole-transport material preferably has a hole mobility of $1 \times 10^{-6}$ cm$^2$/Vs or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility of $1 \times 10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolato lithium (abbreviation: LiPPP), lithium oxide (LiO$_x$), or cesium carbonate.

Alternatively, an electron-transport material may be used for the electron-injection layer. For example, a compound having an unshared electron pair and an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound including an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound including an unshared electron pair. Note that NBPhen has a higher glass transition temperature (Tg) than BPhen and thus has high heat resistance.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one kind or two or more kinds of organic compounds, one or both of the hole-transport material and the electron-transport material can be used. Alternatively, as one kind or two or kinds of organic compounds, a bipolar material or a TADF material may be used.

The light-emitting layer preferably includes a combination of a hole-transport material and an electron-transport material that easily forms an exciplex and a phosphorescent material, for example. With such a structure, light emission can be efficiently obtained by exciplex-triplet energy transfer (ExTET), which is energy transfer from an exciplex to a light-emitting substance (phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

A conductive film that can be used for the anode and the cathode and transmits visible light can be formed using, for example, indium oxide, indium tin oxide, indium tin oxide containing silicon oxide (ITSO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layers. For example, a stacked film of an alloy of silver and magnesium and indium tin oxide or indium tin oxide containing silicon is preferably used because the conductivity can be increased. Still alternatively, graphene or the like may be used.

The cathode or the anode is preferably formed using a conductive film that reflects visible light. For the conductive film, for example, a metal material such as aluminum, gold, platinum, silver, nickel, tungsten, chromium, molybdenum, iron, cobalt, copper, or palladium, or an alloy containing any of these metal materials can be used. Silver is preferably used because of high resistivity of visible light. In addition, aluminum is preferably used because an electrode using aluminum is easily etched, processing of the electrode is easy, and the aluminum electrode has high resistivity of visible light and near-infrared light. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance.

The cathode or the anode may have a structure in which a conductive metal film or a metal oxide film is stacked over the conductive film reflecting visible light. Such a structure can avoid the conductive film reflecting visible light from being oxidized or corroded. For example, when a metal film or a metal oxide film is stacked in contact with an aluminum film or an aluminum alloy film, oxidation can be suppressed. Examples of a material for the metal film or the metal oxide film include titanium or titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used. Furthermore, the above metal film or the above metal oxide film may be provided under the conductive film that reflects visible light.

When aluminum is used as the anode or the anode, the thickness of aluminum is preferably greater than or equal to 40 nm, further preferably greater than or equal to 70 nm, in which case the reflectivity of visible light or the like can be sufficiently increased. When silver is used as the cathode or the anode, the thickness of silver is preferably greater than or equal to 70 nm, further preferably greater than or equal to 100 nm, in which case the reflectivity of visible light or the like can be sufficiently increased.

As the conductive film having light transmitting and reflecting properties that can be used for the cathode or the anode, the conductive film reflecting visible light formed to be thin enough to transmit visible light can be used. In addition, with the stacked-layer structure of the conductive film and the conductive film transmitting visible light, the conductivity or the mechanical strength can be increased.

The conductive film having light transmitting and reflecting properties has a reflectance with respect to visible light (e.g., the reflectance with respect to light having a specific wavelength within the range of 400 nm to 700 nm) of higher than or equal to 20% and lower than or equal to 80%, preferably higher than or equal to 40% and lower than or equal to 70%. The conductive film having reflectivity preferably has a reflectance with respect to visible light higher than or equal to 40% and lower than or equal to 100%, further preferably higher than or equal to 70% and lower than or equal to 100%. The conductive film having light-transmitting property preferably has a reflectance with respect to visible light higher than or equal to 0% and lower than or equal to 40%, further preferably higher than or equal to 0% and lower than or equal to 30%.

Each of the electrodes included in the light-emitting element can be formed by an evaporation method, a sputtering method or the like. Alternatively, a discharging method such as an inkjet method, a printing method such as a screen printing method, or a plating method may be used.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Embodiment 4

In this embodiment, electronic devices of one embodiment of the present invention will be described with reference to FIGS. 28A and 28B, FIGS. 29A to 29D, FIGS. 30A to 30F, and FIGS. 31A to 31F.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for substitution reality (SR) and a device for mixed reality (MR).

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 28A:
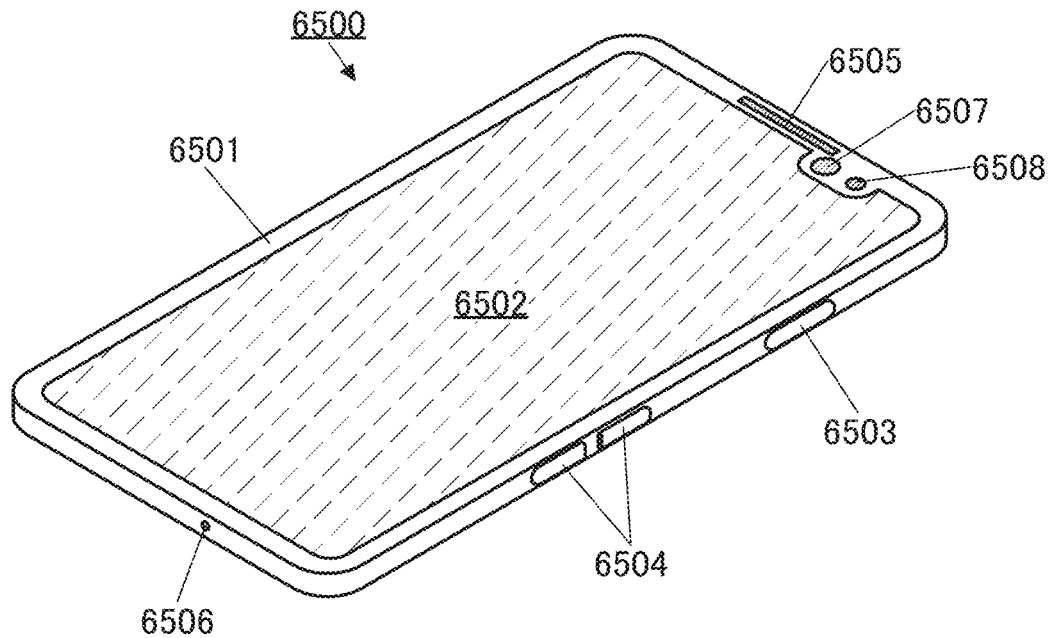
FIGS. 28A and 28B illustrate an example of an electronic device.

An electronic device 6500 in FIG. 28A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 28B:
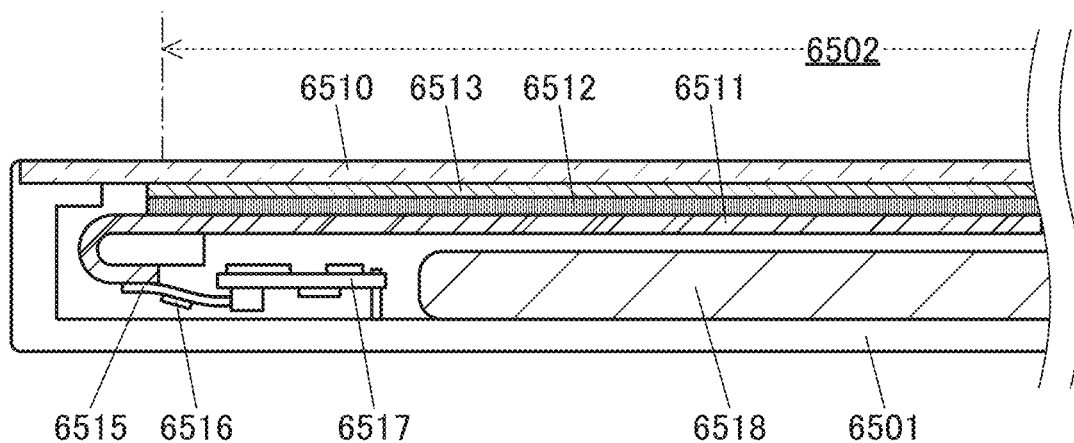

FIG. 28B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, a part of the display panel 6511 is folded back so that a connection portion with the FPC 6515 is provided on the back side of the pixel portion, whereby an electronic device with a narrow bezel can be achieved.

Figure 29A:
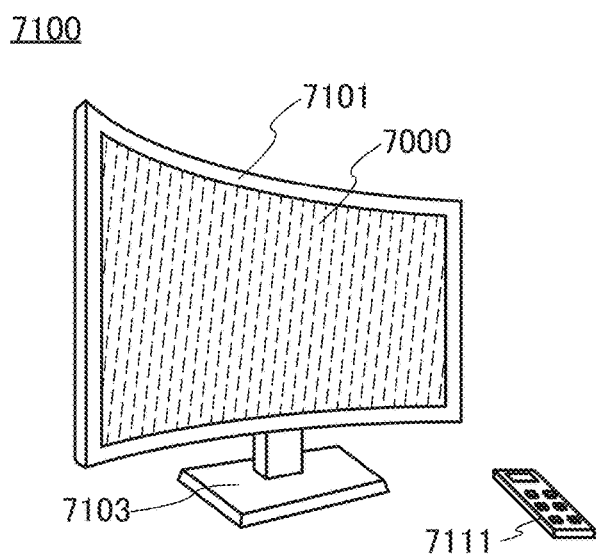
FIGS. 29A to 29D illustrate examples of electronic devices.

FIG. 29A illustrates an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 29A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 29B:
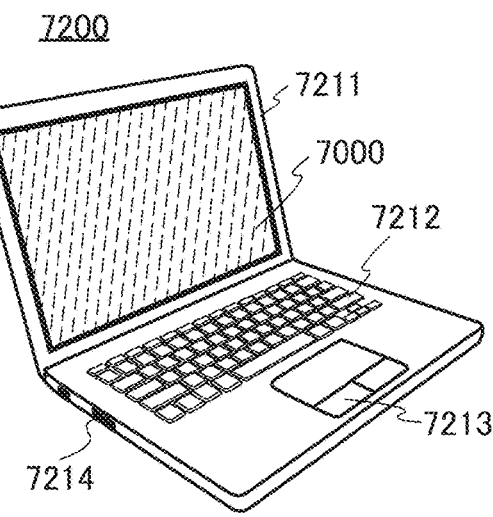

FIG. 29B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 29C:
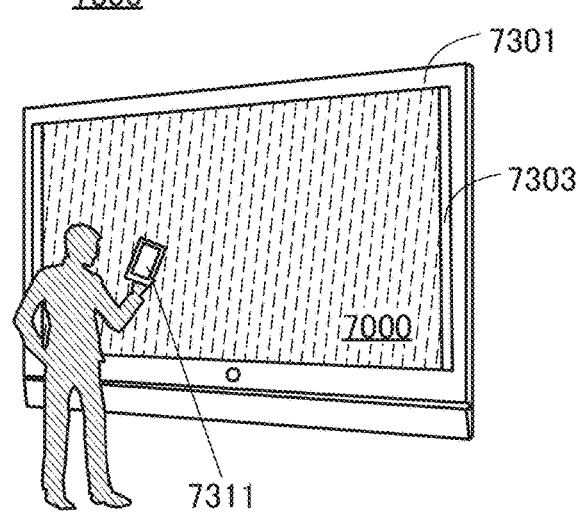
Figure 29D:
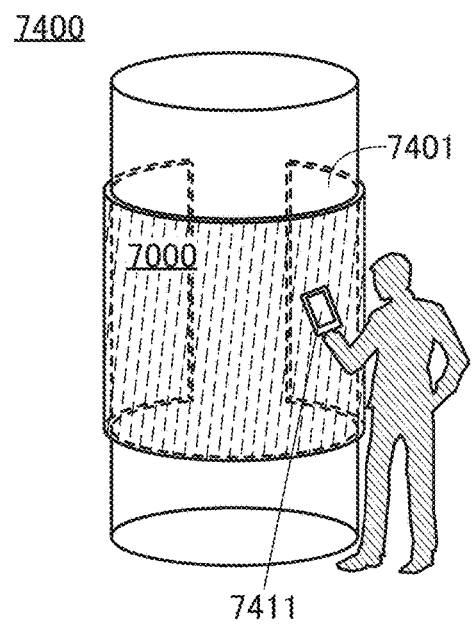

FIGS. 29C and 29D illustrate examples of digital signage.

A digital signage 7300 illustrated in FIG. 29C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 29D illustrates a digital signage 7400 mounted on a cylindrical pillar 7401. The digital signage 7400 includes the display portion 7000 provided along a curved surface of the pillar 7401.

The display device of one embodiment of the present invention can be used in the display portion 7000 illustrated in each of FIGS. 29C and 29D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 29C and 29D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 30A:
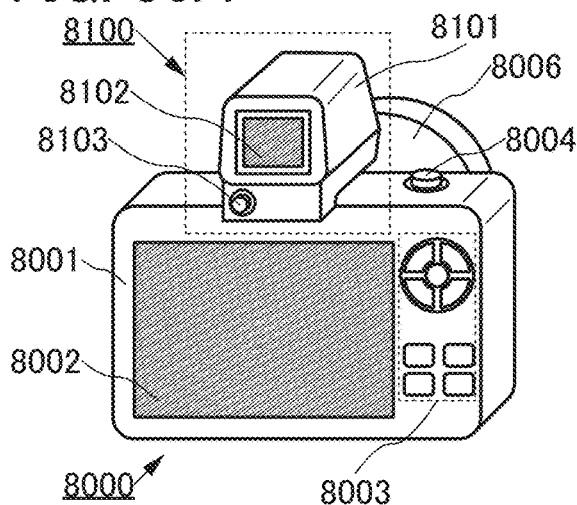
FIGS. 30A to 30F illustrate examples of electronic devices.

FIG. 30A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 30B:
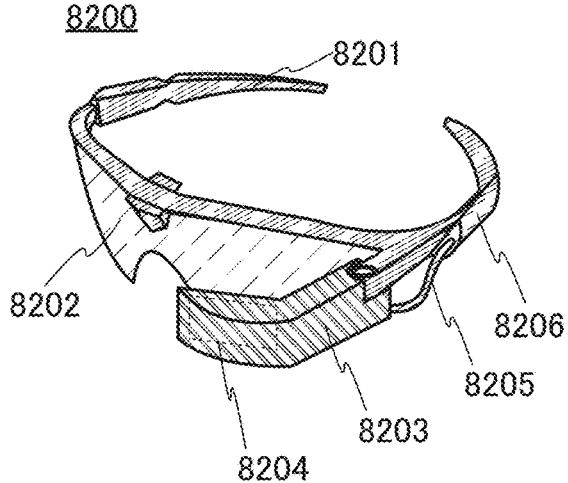

FIG. 30B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

Figure 30C:
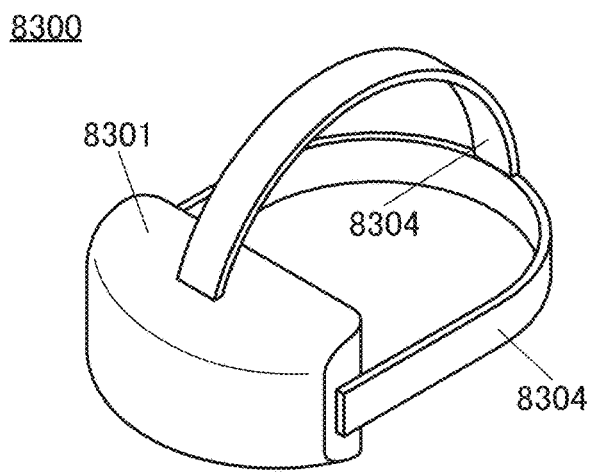
Figure 30D:
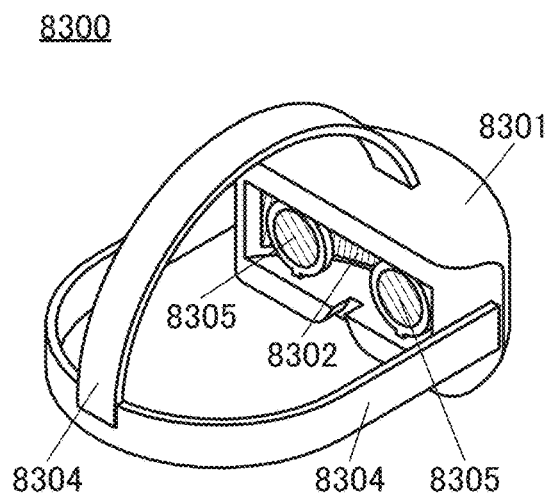
Figure 30E:
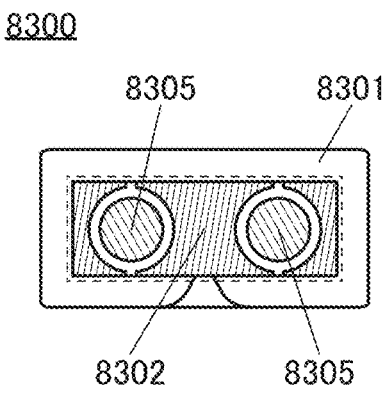

FIGS. 30C to 30E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 30E. In other words, a video with a strong sense of reality can be seen by the user with use of the display portion 8302.

Figure 30F:
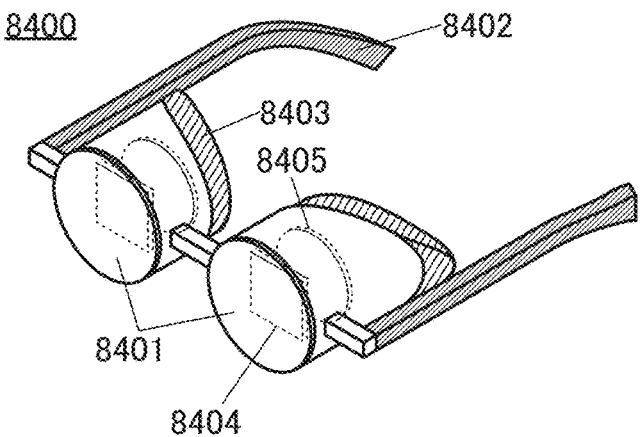

FIG. 30F is an external view of a google-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIGS. 31A to 31F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 31A to 31F have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices illustrated in FIGS. 31A to 31F will be described in detail below.

Figure 31A:
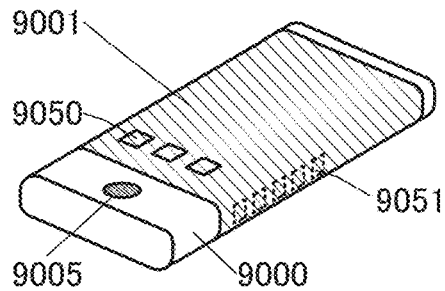
FIGS. 31A to 31F illustrate examples of electronic devices.

FIG. 31A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 31A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 31B:
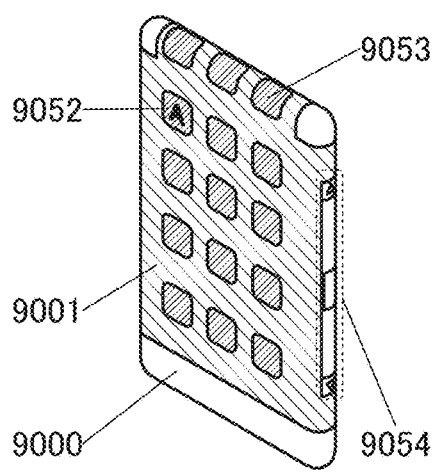

FIG. 31B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 31C:
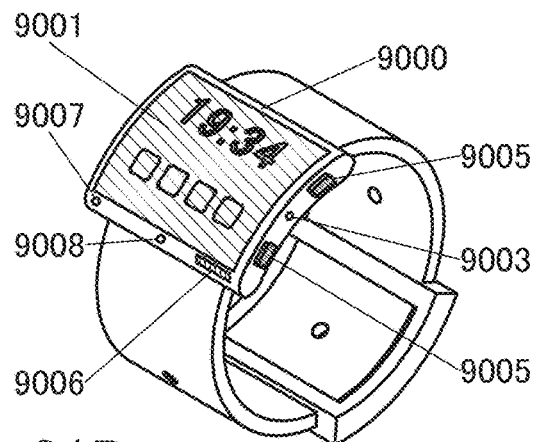

FIG. 31C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 31D:
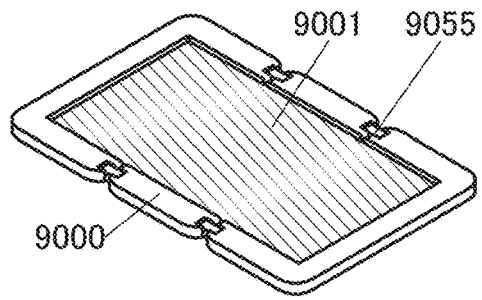
Figure 31E:
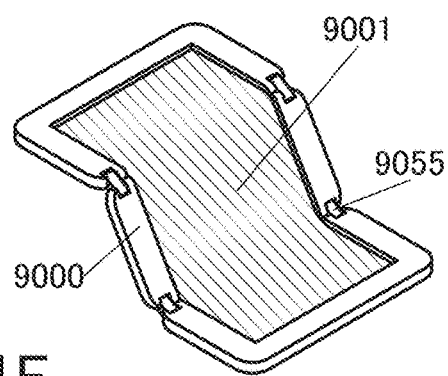
Figure 31F:
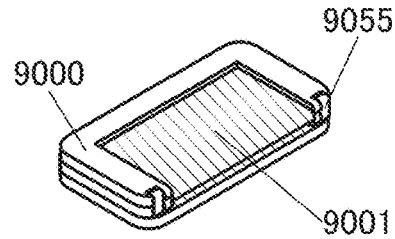

FIGS. 31D to 31F are perspective views illustrating a foldable portable information terminal 9201. FIG. 31D is a perspective view of an opened state of the portable information terminal 9201, FIG. 31F is a perspective view of a folded state thereof, and FIG. 31E is a perspective view of a state in the middle of change from one of FIG. 31D and FIG. 31F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Embodiment 5

The application of the transistor 200 described in Embodiment 1 is not limited to display devices, electronic devices including the display device, and the like. In this embodiment, a memory device including a transistor in which an oxide is used for a semiconductor (hereinafter sometimes referred to as an OS transistor) of one embodiment of the present invention will be described with reference to FIGS. 32A and 32B and FIGS. 33A to 33H. The OS memory device includes at least a capacitor and an OS transistor that controls the charging and discharging of the capacitor. Since the OS transistor has an extremely low off-state current, the OS memory device has excellent retention characteristics and can function as a nonvolatile memory.

Structure Example of Memory Device

Figure 32A:
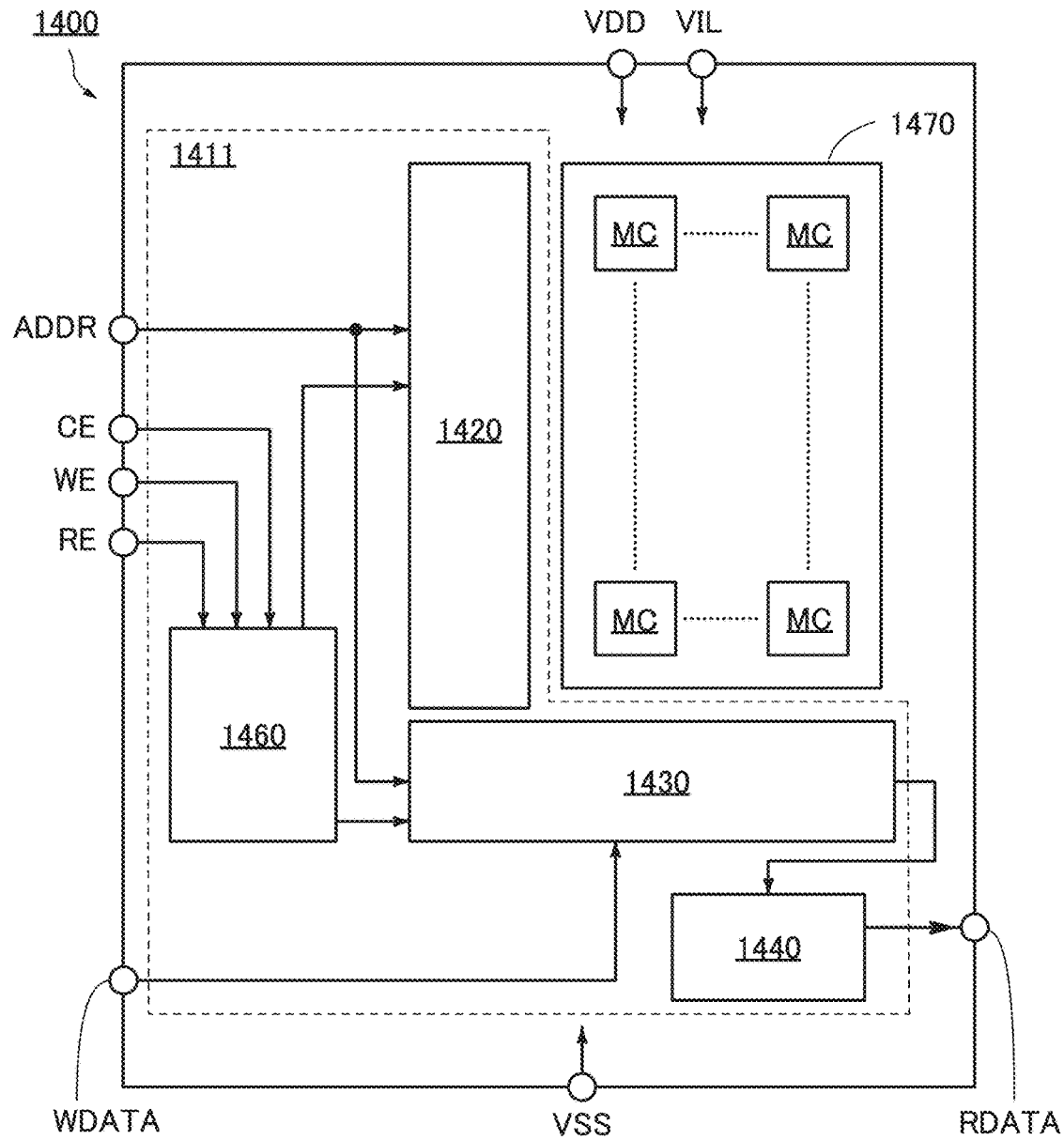
FIG. 32A is a block diagram illustrating a structure example of a memory device of one embodiment of the present invention.

FIG. 32A shows a structure example of an OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes a column decoder, a precharge circuit, a sense amplifier, and a write circuit, for example. The precharge circuit has a function of precharging wirings. The sense amplifier has a function of amplifying a data signal read from a memory cell. The wirings mentioned above are connected to memory cells included in the memory cell array 1470, which will be described later in detail. The amplified data signal is output as a data signal RDATA to the outside of the memory device 1400 through the output circuit 1440. The row circuit 1420 includes a row decoder and a word line driver circuit, for example, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto and other control signals may be input as necessary.

The memory cell array 1470 includes a plurality of memory cells MC arranged in a matrix and a plurality of wirings. The number of wirings that connect the memory cell array 1470 and the row circuit 1420 depends on the configuration of the memory cell MC, the number of memory cells MC in one column, and the like. The number of wirings that connect the memory cell array 1470 and the column circuit 1430 depends on the configuration of the memory cell MC, the number of memory cells MC in one row, and the like.

Figure 32B:
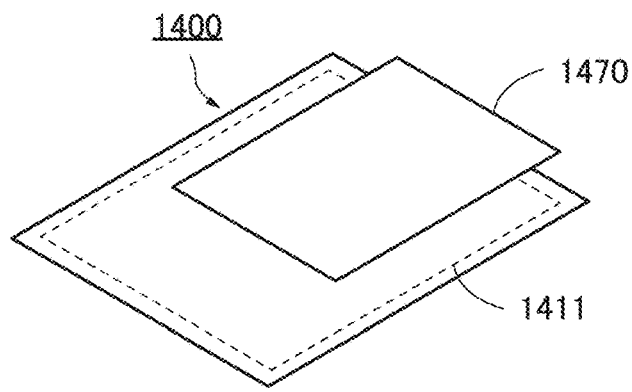
FIG. 32B is a perspective view illustrating a structure example of the memory device of one embodiment of the present invention.

FIG. 32A shows an example in which the peripheral circuit 1411 and the memory cell array 1470 are formed on the same plane; however, this embodiment is not limited thereto. For example, as illustrated in FIG. 32B, the memory cell array 1470 may be provided to partly overlap the peripheral circuit 1411. For example, the sense amplifier may be provided below the memory cell array 1470 so that they overlap each other.

FIGS. 33A to 33H illustrate configuration examples of memory cells that can be used as the memory cell MC.

[DOSRAM]

Figure 33A:
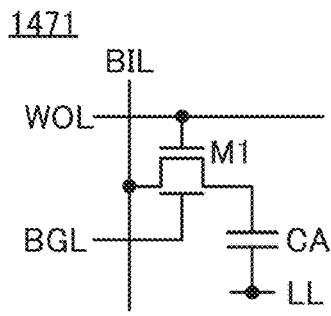
FIGS. 33A to 33H are circuit diagrams each illustrating a structure example of a memory device of one embodiment of the present invention.
Figure 33B:
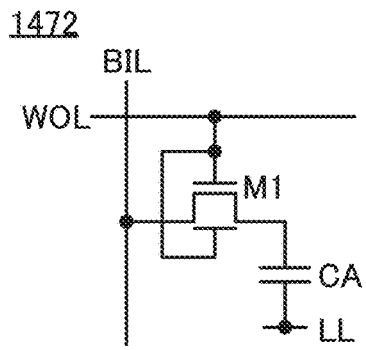
Figure 33C:
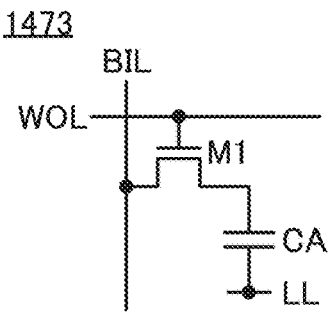
Figure 33D:
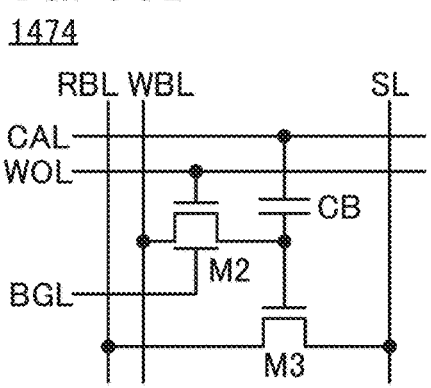
Figure 33E:
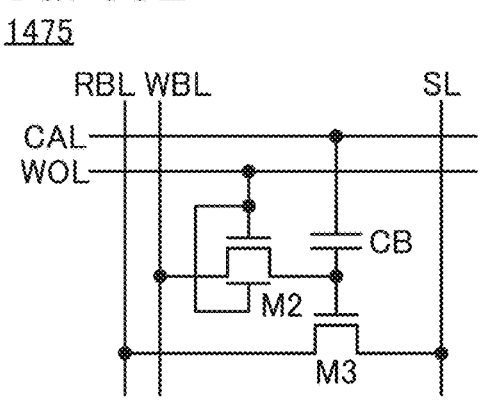
Figure 33F:
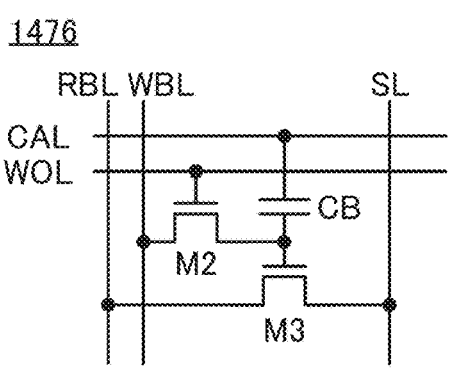
Figure 33G:
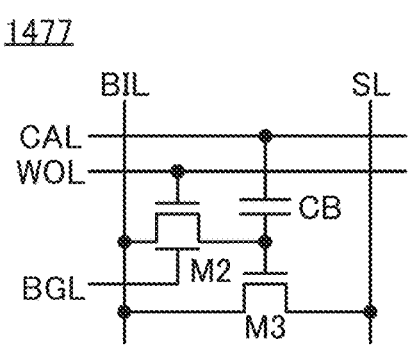

FIGS. 33A to 33C illustrate a circuit configuration example of a memory cell of a DRAM. In this specification and the like, a DRAM using a memory cell including one OS transistor and one capacitor is sometimes referred to as a dynamic oxide semiconductor random access memory (DOSRAM). A memory cell 1471 shown in FIG. 33A includes a transistor M1 and a capacitor CA. The transistor M1 includes a gate (also sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. In data writing and data reading, the wiring LL may be set to a ground potential or a low-level potential. The wiring BGL functions as a wiring for applying a potential to the back gate of the transistor M1. The threshold voltage of the transistor M1 can be increased or decreased by supplying a given potential to the wiring BGL.

The memory cell MC is not limited to the memory cell 1471 and can have a different circuit configuration. For example, in the memory cell MC, the back gate of the transistor M1 may be connected to the wiring WOL instead of the wiring BGL as in a memory cell 1472 illustrated in FIG. 33B. As another example of the memory cell MC, the transistor M1 may be a single-gate transistor, that is, a transistor without a back gate as in a memory cell 1473 illustrated in FIG. 33C.

When the semiconductor device shown in the above embodiment is used in the memory cell 1471 and the like, the transistor 200 can be used as the transistor M1. When an OS transistor is used as the transistor M1, the leakage current of the transistor M1 can be extremely low. That is, with use of the transistor M1, written data can be retained for a long time, and thus the frequency of refresh operation for the memory cell can be decreased. Alternatively, refresh operation for the memory cell can be omitted. In addition, since the transistor M1 has an extremely low leakage current, multi-level data or analog data can be retained in the memory cells 1471, 1472, and 1473.

In the DOSRAM, when the sense amplifier is provided below the memory cell array 1470 so that they overlap each other as described above, the bit line can be shortened. This reduces bit line capacity, which reduces the storage capacity of the memory cell.

[NOSRAM]

FIGS. 33D to 33G each illustrate a circuit configuration example of a gain-cell memory cell including two transistors and one capacitor. A memory cell 1474 illustrated in FIG. 33D includes a transistor M2, a transistor M3, and a capacitor CB. The transistor M2 includes a top gate (simply referred to as a gate in some cases) and a back gate. In this specification and the like, a memory device including a gain-cell memory cell using an OS transistor as the transistor M2 is referred to as a nonvolatile oxide semiconductor RAM (NOSRAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. A high-level potential is preferably applied to the wiring CAL at the time of data writing and data reading. In the data retention, the low-level potential is preferably applied to the wiring CAL. The wiring BGL functions as a wiring for applying a predetermined potential to the back gate of the transistor M2. The threshold voltage of the transistor M2 can be increased or decreased by supplying a given potential to the wiring BGL.

The circuit configuration of the memory cell MC is not limited to that of the memory cell 1474, and the circuit configuration can be changed as appropriate. For example, as in a memory cell 1475 illustrated in FIG. 33E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 33F. For example, the memory cell MC may have a structure in which the wirings WBL and RBL are combined into one wiring BIL as in a memory cell 1477 illustrated in FIG. 33G.

When the semiconductor device shown in the above embodiment is used in the memory cell 1474 and the like, the transistor 200 can be used as the transistor M2. When an OS transistor is used as the transistor M2, the leakage current of the transistor M2 can be extremely low. That is, with use of the transistor M2, written data can be retained for a long time, and thus the frequency of the refresh operation for the memory cell can be decreased. Alternatively, refresh operation for the memory cell can be omitted. In addition, since the transistor M2 has an extremely low leakage current, multi-level data and analog data can be retained in the memory cell 1474. The same applies to the memory cells 1475 to 1477.

Note that the transistor M3 may be a transistor containing silicon in a channel formation region (hereinafter, also referred to as a Si transistor in some cases). The Si transistor may be either an n-channel transistor or a p-channel transistor. The Si transistor has higher field-effect mobility than the OS transistor in some cases. Therefore, a Si transistor may be used as the transistor M3 functioning as a reading transistor. Furthermore, the transistor M2 can be formed over the transistor M3 when a Si transistor is used as the transistor M3, in which case the area of the memory cell can be reduced, leading to high integration of the memory device.

Alternatively, the transistor M3 may be an OS transistor. When an OS transistor is used as each of the transistors M2 and M3, the memory cell array 1470 can be formed using only n-channel transistors.

Figure 33H:
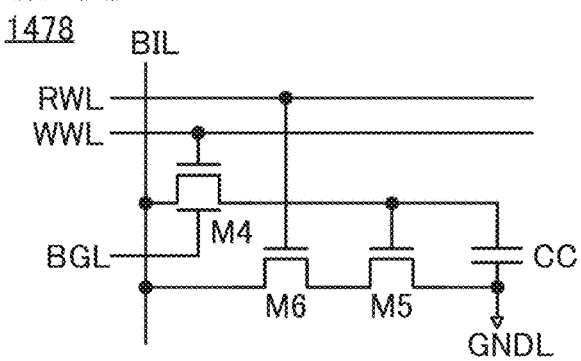

FIG. 33H illustrates an example of a gain-cell memory cell including three transistors and one capacitor. A memory cell 1478 illustrated in FIG. 33H includes transistors M4 to M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistor M4 to the transistor M6 may be OS transistors. In that case, the circuit of the memory cell array 1470 can be formed using only n-channel transistors.

When the semiconductor device shown in the above embodiment is used in the memory cell 1478 and the like, the transistor 200 can be used as the transistor M4. When an OS transistor is used as the transistor M4, the leakage current of the transistor M4 can be extremely low.

Note that the configurations of the peripheral circuit 1411, the memory cell array 1470, and the like shown in this embodiment are not limited to those described above. The arrangement and functions of these circuits and the wirings, circuit components, and the like connected to the circuits can be changed, removed, or added as needed.

The structures, methods, and the like described in this embodiment can be combined as appropriate with any of the other structures, methods, and the like described in this embodiment or any of the structures, methods, and the like described in the other embodiments.

Embodiment 6

In this embodiment, a memory device, a chip, and an electronic device in which a semiconductor device of the present invention is mounted will be described.

<Memory Device>

In this embodiment, application examples of a memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, computers refer not only to tablet computers, laptop computers, and desktop computers, but also to large computers such as server systems. The semiconductor device described in the above embodiment is applied to removable memory devices such as memory cards (e.g., SD cards), USB memories, and solid state drives (SSD).

<Chip>

A plurality of circuits (systems) are mounted on the chip. The technique for integrating a plurality of circuits (systems) on one chip is referred to as system on chip (SoC) in some cases.

The chip includes a CPU, a GPU, at least one analog arithmetic unit, at least one memory controller, at least one interface, at least one network circuit, and the like.

A bump (not illustrated) is provided on the chip, and the chip is connected to a first surface of a printed circuit board (PCB). A plurality of bumps are provided on the rear side of the first surface of the PCB, and the PCB is connected to a motherboard.

A memory device such as a DRAM or a flash memory may be provided over the motherboard. For example, the DOSRAM described in the above embodiment can be used as the DRAM. For example, the NOSRAM described in the above embodiment can be used as the flash memory.

The CPU preferably includes a plurality of CPU cores. The GPU preferably includes a plurality of GPU cores. The CPU and the GPU may each include a memory for storing data temporarily. Alternatively, a common memory for the CPU and the GPU may be provided in the chip. The NOSRAM or the DOSRAM described above can be used as the common memory. The GPU is suitable for parallel computation of a number of data and thus can be used for image processing and product-sum operation. When an image processing circuit and a product-sum operation circuit including an oxide semiconductor of the present invention is provided in the GPU, image processing and product-sum operation can be performed with low power consumption.

The analog arithmetic unit includes one or both of an analog/digital (A/D) converter circuit and a digital/analog (D/A) converter circuit. Furthermore, the analog arithmetic unit may include the above-described product-sum operation circuit.

The memory controller includes a circuit functioning as a controller of the DRAM and a circuit functioning as the interface of the flash memory.

The interface includes an interface circuit for connection with an external connection device such as a display device, a speaker, a microphone, a camera, or a controller.

The network circuit includes a circuit for a network such as a local-area network (LAN). Furthermore, the network circuit may include a circuit for network security.

The motherboard provided with the PCB on which the chip including the GPU is mounted, the DRAM, and the flash memory can be referred to as a GPU module.

The GPU module includes the chip formed using the SoC technology, and thus can have a small size. Furthermore, the GPU module is excellent in image processing, and thus is suitably used in a portable electronic device such as a smartphone, a tablet terminal, a laptop PC, or a portable (mobile) game console. Furthermore, the product-sum operation circuit using the GPU can implement techniques such as a deep neural network (DNN), a convolutional neural network (CNN), a recurrent neural network (RNN), an autoencoder, a deep Boltzmann machine (DBM), or a deep belief network (DBN); hence, the chip can be used as an AI chip or the GPU module can be used as an AI system module.

<Electronic Device>

The above-described chip can be mounted on a variety of electronic devices. Examples of electronic devices include electronic devices with relatively large screens (e.g., television devices, monitors for desktop or laptop information terminals and the like, digital signage, and large game machines such as pachinko machines), cameras such as digital cameras and digital video cameras, digital photo frames, e-book readers, mobile phones (smartphones), portable game machines, portable information terminals, and audio reproducing devices. Other examples of moving vehicles include an automobile, a train, a monorail train, a ship, and a flying object (a helicopter, an unmanned aircraft (a drone), an airplane, and a rocket). Examples of household appliances include an electric refrigerator-freezer, a vacuum, a microwave oven, an electric oven, a rice cooker, a water heater, an IH cooker, a water server, a heating-cooling combination appliance such as an air conditioner, a washing machine, a drying machine, and an audio visual appliance. When the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

The electronic device and its functions, an application example of the artificial intelligence and its effects, and the like described in this embodiment can be combined as appropriate with the description of another electronic device.

This embodiment can be implemented in an appropriate combination with any of the structures described in the other embodiments.

Example

In this example, results relating to negative-bias stress temperature photodegradation will be described. Specifically, this example shows results of negative-bias stress temperature photodegradation measurement, evaluation of density of deep defect states, and SIMS measurement, which were performed on transistors. In this example, the deep defect states of an oxide semiconductor film were evaluated by a constant photocurrent method (CPM).

<Sample>

In this section, samples fabricated in this example are described. In this example, three samples (Samples 800A, 800B, and 800C) were fabricated. A transistor included in each sample has a dual gate structure including a top gate and a bottom gate (also referred to as a back gate). The transistor includes an oxide semiconductor film in a channel formation region.

Figure 34:
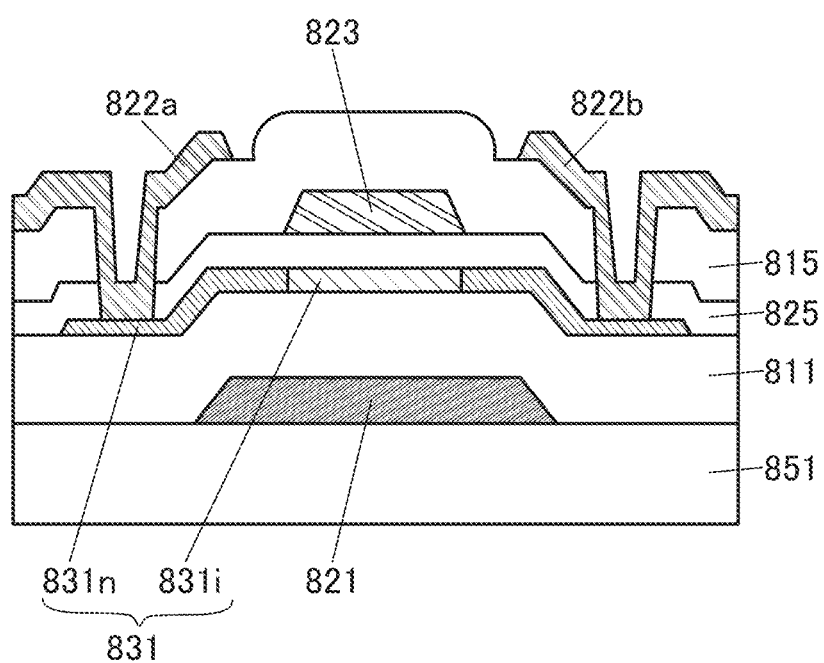
FIG. 34 is a cross-sectional schematic view illustrating a structure of a transistor in Example.

FIG. 34 is a schematic cross-sectional view of the transistor included in each sample. The transistor illustrated in FIG. 34 includes, over a substrate 851, a conductive layer 821, an insulating layer 811 over the conductive layer 821, a semiconductor layer 831 over the insulating layer 811, an insulating layer 825 over the semiconductor layer 831 and the insulating layer 811, a conductive layer 823 over the insulating layer 825, an insulating layer 815 over the conductive layer 823 and the insulating layer 825, and a conductive layer 822a and a conductive layer 822b over the insulating layer 815. The semiconductor layer 831 includes a channel formation region 831i and a pair of low-resistance regions 831n.

The conductive layer 823 functions as a top gate, the insulating layer 825 functions as a top gate insulating layer, the conductive layer 821 functions as a bottom gate, and the insulating layer 811 functions as a bottom gate insulating layer. The conductive layer 822a and the conductive layer 822b are connected to the corresponding low-resistance regions 831n through openings provided in the insulating layer 825 and the insulating layer 815. One of the conductive layer 822a and the conductive layer 822b serves as a source, and the other serves as a drain.

In the transistor, the channel length L was 3 μm and the channel width W was 50 μm.

In addition to the transistor, a TEG for CPM evaluation and a TEG for SIMS measurement were included in each of fabricated Samples 800A to 800C.

As the semiconductor layer 831, a 25-nm-thick oxide semiconductor film deposited by a sputtering method was used. Deposition of the oxide semiconductor film was performed under the following conditions. An oxide target with an atomic ratio where In:Ga:Zn=1:1:1 was used; the substrate temperature during the deposition was set to room temperature; the deposition gas contained an oxygen gas (10% as the flow rate) and an argon gas (90% as the flow rate); the pressure was 0.6 PA; and the alternating-current (AC) power source was set to 2.5 kW.

As the insulating layer 825, a 100-nm-thick silicon oxynitride film deposited by a PECVD method was used. The deposition condition (the substrate temperature) of the silicon oxynitride film used as the insulating layer 825 differs between Samples 800A to 800C. Specifically, the substrate temperatures during the deposition were 300° C. in Sample 800A, 350° C. in Sample 800B, and 400° C. in Sample 800C. The other deposition conditions (such as the deposition gas species, the pressure, and the power) of the silicon oxynitride film used as the insulating layer 825 were common between Samples 800A to 800C.

The TEG for CPM evaluation includes the semiconductor layer 831, the insulating layer 825, and a pair of electrodes electrically connected to the semiconductor layer 831. The TEG for SIMS measurement includes the semiconductor layer 831 and the insulating layer 825.

<Measurement of Negative-Bias Stress Temperature Photodegradation>

In this section, the measurement results of negative-bias stress temperature photodegradation are described. Specifically, obtained results through the following process are described. Stress was applied to the samples including the transistors in such a manner that a negative voltage was applied to the top gates and the bottom gates while the samples were irradiated with light, and threshold voltages $V_{th}$ of the transistors, which changed depending on the time period of applying the stress, were evaluated.

Stress was applied to fabricated Samples 800A to 800C by application of a negative voltage to the gates under light irradiation. Then, $I_d$-$V_g$ characteristics of the transistors in the samples were measured, whereby the amount of change in threshold voltages before and after the stress application was evaluated.

In applying the stress, the temperature was set to 105° C., the gate voltage was −20V, the drain voltage was 0 V, the source voltage was 0 V, the illuminance of irradiation light was 10000 lx, and the time for stress application was an hour. The $I_d$-$V_g$ characteristics of the transistors to which the above stress had been applied were measured. In measuring the $I_d$-$V_g$ characteristics, the drain voltage was set to +10 V, the gate voltage was swept in the range of from −15 V to +2 V in 0.1 V steps, and the other conditions were similar to those in applying stress.

Figure 35:
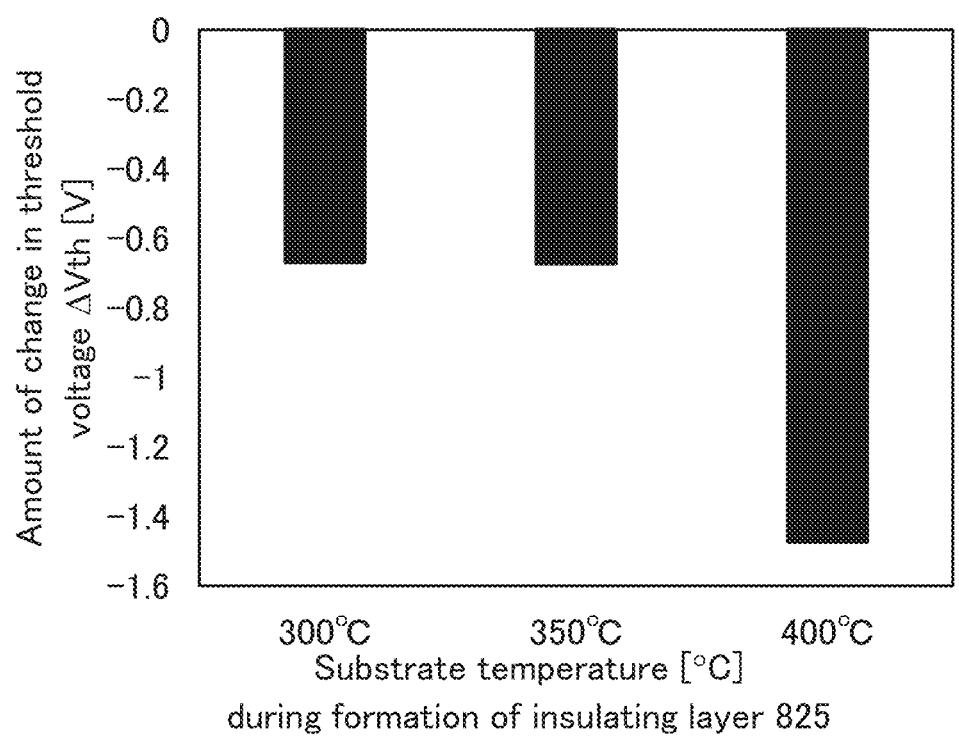
FIG. 35 is a graph showing measurement results of negative-bias stress temperature photodegradation in Example.

FIG. 35 shows measurement results of the negative-bias stress temperature photodegradation in the transistors in the samples. Specifically, FIG. 35 is a graph showing the amount of change in threshold voltages $\Delta V_{th}$ of the transistors in the samples. In FIG. 35, the vertical axis represents the amount of change in threshold voltages $\Delta V_{th}$ [V], and the horizontal axis represents the substrate temperature [° C.] during the formation of the insulating layer 825.

As shown in FIG. 35, the absolute value of the amount of change in the threshold voltage $\Delta V_{th}$ of the transistor included in Sample 800A is almost the same that of the transistor included in Sample 800B. The absolute value of the amount of change in the threshold voltage $\Delta V_{th}$ of the transistor included in Sample 800C is larger than that of the transistor included in Sample 800B. In other words, the above results indicate that, even when the substrate temperature during the formation of the insulating layer 825 is increased from 300° C. to 350° C., there is almost no difference in the amount of changes in threshold voltages. However, when the substrate temperature during the formation of the insulating layer 825 is increased from 350° C. to 400° C., the amount of change in threshold voltages is increased.

<Evaluation of Density of Deep Defect States>

With use of the TEGs for CPM evaluation included in fabricated Samples 800A to 800C, deep defects states (levels) of oxide semiconductor films were evaluated.

In CPM measurement, the amount of light with which a surface of a sample between terminals is irradiated is adjusted in the state where voltage is applied between two electrodes included in the sample so that a photocurrent value is kept constant, and then an absorption coefficient is derived from the amount of the irradiation light with each wavelength. In the CPM measurement, when the sample has a defect, the absorption coefficient of energy which corresponds to a level attributed to the defect (calculated from a wavelength) is increased. The increase in the absorption coefficient is multiplied by a constant, whereby the density of deep defect states (also referred to as dDOS) of the sample can be obtained.

A part of the absorption coefficient which is referred to as an urbach tail due to the band tail is removed from a curve of the absorption coefficient obtained by the CPM measurement, whereby the absorption α due to the defect levels can be calculated from the following formula. Here, E represents energy, $\alpha_{CPM}$ represents an absorption coefficient obtained through CPM measurement, and au represents an absorption coefficient in the urbach tail.

$$\alpha = \int \frac{\alpha_{CPM} - \alpha_U}{E} dE \qquad \text{[Formula 12]}$$

Figure 36:
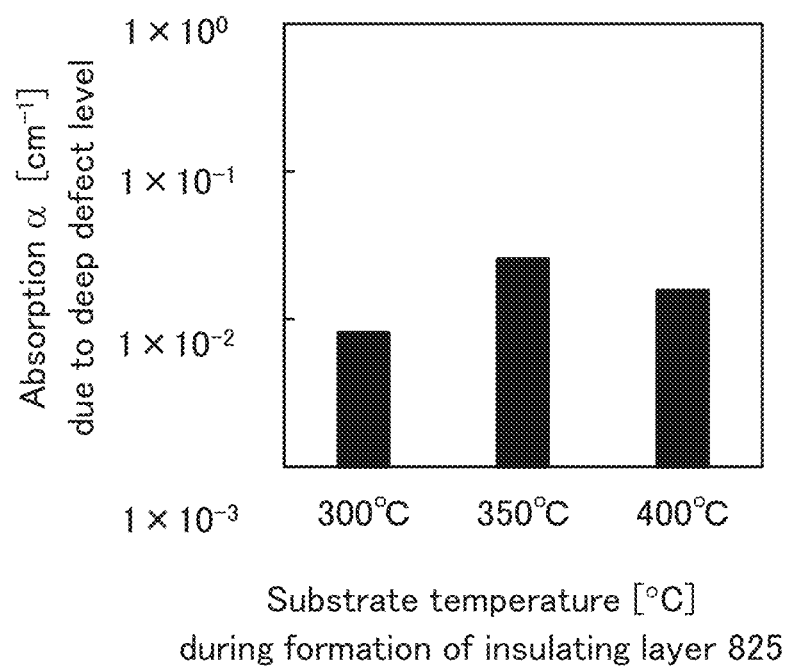
FIG. 36 is a graph showing results of CPM measurement in Example.

FIG. 36 shows CPM measurement results of Samples 800A to 800C. In FIG. 36, the vertical axis represents absorption α [cm$^{-1}$] due to the deep defect level, and the horizontal axis represents the substrate temperature [° C.] during the formation of the insulating layer 825.

As shown in the results in FIG. 36, the absorption α due to the deep defect level changes depending on the substrate temperature during the formation of the insulating layer 825. Specifically, the absorption α due to the deep defect level in the oxide semiconductor film included in Sample 800B is higher than that in the oxide semiconductor film in Sample 800A. The absorption α due to the deep defect level in the oxide semiconductor film included in Sample 800C is lower than that in the oxide semiconductor film in Sample 800B. In other words, the results indicate that the density of deep defect states is decreased when the substrate temperature during the formation of the insulating layer 825 is increased from 350° C. to 400° C.

<SIMS Measurement>

SIMS analysis was performed on the TEGs for SIMS evaluation included in fabricated Samples 800A to 800C. The direction in which the SIMS analysis proceeded was a direction from the insulating layer 825 toward the semiconductor layer 831. In this SIMS analysis, a PHI ADEPT-1010 quadrupole SIMS instrument manufactured by ULVAC-PHI, Inc was used. From the SIMS analysis, profiles of indium, gallium, and zinc concentrations in the TEGs for SIMS evaluation in the samples were obtained.

Figure 37A:
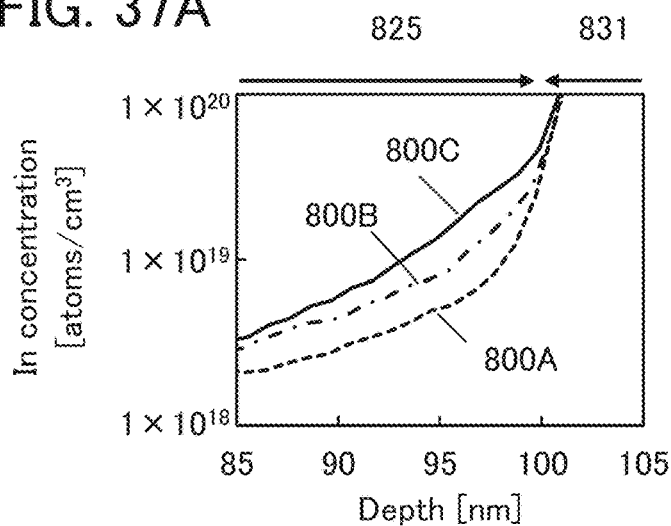
FIGS. 37A to 37C are graphs showing results of SIMS analysis in Example.
Figure 37B:
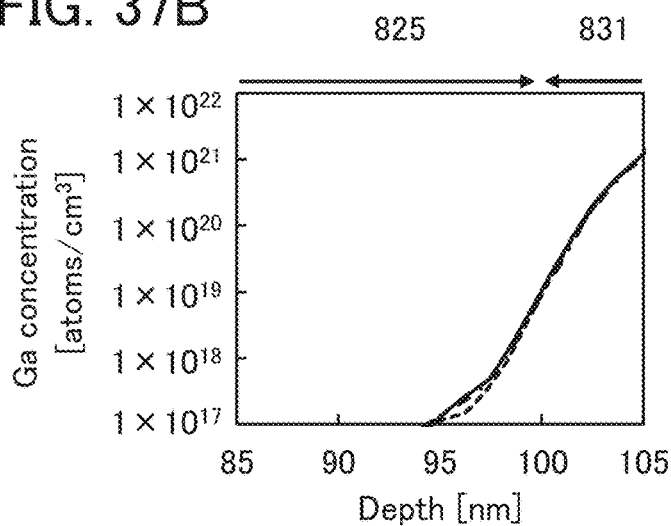
Figure 37C:
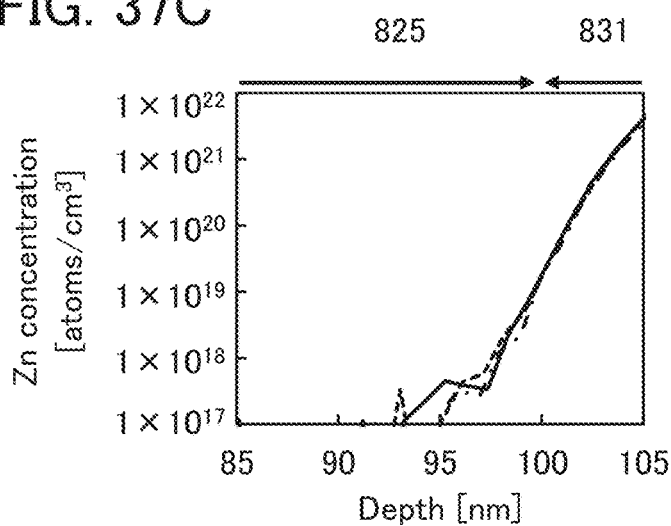

FIGS. 37A to 37C show results of SIMS analysis on the TEGs for SIMS evaluation. Specifically, FIGS. 37A to 37C show profile results of indium, gallium, and zinc concentrations, respectively, at the interface between the insulating layer 825 and the semiconductor layer 831 and in its vicinity in the TEGs for SIMS evaluation. In each of FIGS. 37A to 37C, the horizontal axis represents the depth in the film thickness direction (Depth) [nm]. Note that the position at a depth of 0 nm in the film thickness direction corresponds to the top surface (the surface on the side not in contact with the semiconductor layer 831) of the insulating layer 825, and the position at a depth approximately 100 nm in the film thickness direction corresponds to the interface between the insulating layer 825 and the semiconductor layer 831.

In FIGS. 37A to 37C, areas corresponding to the insulating layer 825 and the semiconductor layer 831 are denoted by arrows. Note that FIGS. 37A to 37C each seem to provide a space between two adjacent arrows. This is because it is difficult to strictly specify the interface between two films in SIMS analysis. For example, when the position where the depth in the film thickness direction is 0 nm is set to the top surface (the surface on the side not in contact with the semiconductor layer 831) of the insulating layer 825, the position where the depth in the film thickness direction is equal to the thickness of the insulating layer 825 is defined as the interface between the insulating layer 825 and the semiconductor layer 831. In this example, since the thickness of the insulating layer 825 is 100 nm, the interface between the insulating layer 825 and the semiconductor layer 831 is positioned at a depth of 100 nm in the film thickness direction.

The vertical axis in FIG. 37A represents the indium concentration (In concentration) per unit volume [atoms/cm$^3$]; that in FIG. 37B, the gallium concentration (Ga concentration) per unit volume [atoms/cm$^3$]; and that in FIG. 37C, the zinc concentration (Zn concentration) per unit volume [atoms/cm$^3$].

In each of FIGS. 37A to 37C, the dotted line indicates a profile of a metal (In, Ga, or Zn) contained in the TEG for SIMS evaluation in Sample 800A, the dashed-dotted line indicates a profile of a metal contained in the TEG for SIMS evaluation in Sample 800B, and the solid line indicates a profile of a metal contained in the TEG for SIMS evaluation in Sample 800C.

According to FIG. 37A, Sample 800C exhibits the largest amount of indium diffusing from the semiconductor layer 831 into the insulating layer 825, Sample 800B exhibits the second largest amount, and Sample 800A exhibits the smallest amount. The results indicate that indium diffuses into the insulating layer 825 as the temperature during the formation of the insulating layer 825 rises. In addition, according to FIG. 37A, the insulating layer 825 in Sample 800A has a region where the indium concentration is lower than or equal to $1 \times 10^{19}$ atoms/cm$^3$, within 5 nm from the interface between the insulating layer 825 and the semiconductor layer 831. Moreover, the insulating layer 825 in Sample 800A has a region where the indium concentration is lower than or equal to $5 \times 10^{18}$ atoms/cm$^3$, within 10 nm from the interface between the insulating layer 825 and the semiconductor layer 831.

According to FIG. 37B, all Samples 800A to 800C exhibit almost the same amount of gallium diffusing from the semiconductor layer 831 into the insulating layer 825. According to FIG. 37C, all Samples 800A to 800C exhibit almost the same amount of zinc diffusing from the semiconductor layer 831 into the insulating layer 825. In other words, dependence on the temperature during the formation of the insulating layer 825 was not observed in diffusion of gallium and zinc into the insulating layer 825.

The results described in this example and the calculation results described in the aforementioned embodiments suggest the following possibility. In a transistor using an oxide containing indium (typically IGZO) for a channel formation region, the negative-bias stress temperature photodegradation is accelerated when indium diffuses into a gate insulator to form In$_{Si}$ in the gate insulator.

The structure described above in this example can be combined with any of the structures described in the other embodiments as appropriate.

This application is based on Japanese Patent Application Serial No. 2021-035525 filed with Japan Patent Office on Mar. 5, 2021, Japanese Patent Application Serial No. 2021-080946 filed with Japan Patent Office on May 12, 2021, and Japanese Patent Application Serial No. 2021-161151 filed with Japan Patent Office on Sep. 30, 2021, the entire contents of which are hereby incorporated by reference.

What is claimed is:

1. A display device comprising:
a first to a fourth wiring;
a light-emitting element;
a first capacitor;
a second capacitor; and
a first to a fourth transistor,
wherein one of a source and a drain of the first transistor is electrically connected to the first wiring,
wherein the other of the source and the drain of the first transistor is electrically connected to one electrode of the first capacitor,
wherein a gate of the first transistor is electrically connected to the second wiring,
wherein one of a source and a drain of the second transistor is electrically connected to an anode of the light-emitting element,
wherein the other of the source and the drain of the second transistor is electrically connected to the third wiring,
wherein a gate of the second transistor is electrically connected to the one electrode of the first capacitor,
wherein one of a source and a drain of the third transistor is electrically connected to the fourth wiring,
wherein the other of the source and the drain of the second transistor is electrically connected to the anode of the light-emitting element,
wherein one of a source and a drain of the fourth transistor is electrically connected to the fourth wiring,
wherein the other of the source and the drain of the fourth transistor is electrically connected to the one electrode of the first capacitor,
wherein the other electrode of the first capacitor is electrically connected to the anode of the light-emitting element,
wherein one electrode of the second capacitor is electrically connected to the one electrode of the first capacitor,
wherein the other electrode of the second capacitor is electrically connected to the third wiring,
wherein the first transistor comprises a metal oxide in a channel formation region, and
wherein $V_{sh}$ in the first transistor is greater than or equal to $-0.3$ V.

2. The display device according to claim 1,
wherein the metal oxide comprises In, Ga, and Zn, and
wherein an atomic ratio of In to Ga and Zn (In:Ga:Zn) is 2:6:5 or a vicinity thereof.

3. A transistor comprising a metal oxide in a channel formation region, comprising:
a first insulator;
a second insulator over the first insulator;
the metal oxide over the second insulator;
a first conductor and a second conductor over the metal oxide;
a third insulator over the first insulator, the second insulator, the metal oxide, the first conductor, and the second conductor,
a fourth insulator over the metal oxide;
a fifth insulator over the fourth insulator; and
a third conductor over the fifth insulator,
wherein the third insulator comprises an opening to overlap with a region between the first conductor and the second conductor,
wherein the fourth insulator, the fifth insulator, and the third conductor are positioned in the opening,
wherein a bandgap of the metal oxide is greater than or equal to 3.3 eV, and wherein $V_{sh}$ in the first transistor is greater than or equal to −0.3 V.

4. The transistor according to claim 3,
wherein the metal oxide comprises In, Ga, and Zn, and
wherein an atomic ratio of In to Ga and Zn (In:Ga:Zn) is 2:6:5 or a vicinity thereof.

5. A display device comprising:
the transistor according to claim 4; and
a light-emitting element electrically connected to the transistor,
wherein the light-emitting element comprises a lower electrode, an upper electrode, and a light-emitting layer between the lower electrode and the upper electrode, and
wherein a side surface of the lower electrode and a side surface of the light-emitting layer are aligned or substantially aligned with each other in a cross-sectional observation of the light-emitting element.

6. The transistor according to claim 3,
wherein the fifth insulator comprises silicon and oxygen, and
wherein the fifth insulator comprises a region in which a nitrogen concentration obtained by SIMS is lower than or equal to $5\times10^{19}$ atoms/cm$^3$.

7. A display device comprising:
the transistor according to claim 6; and
a light-emitting element electrically connected to the transistor,
wherein the light-emitting element comprises a lower electrode, an upper electrode, and a light-emitting layer between the lower electrode and the upper electrode, and
wherein a side surface of the lower electrode and a side surface of the light-emitting layer are aligned or substantially aligned with each other in a cross-sectional observation of the light-emitting element.

8. A display device comprising:
the transistor according to claim 3; and
a light-emitting element electrically connected to the transistor,
wherein the light-emitting element comprises a lower electrode, an upper electrode, and a light-emitting layer between the lower electrode and the upper electrode, and
wherein a side surface of the lower electrode and a side surface of the light-emitting layer are aligned or substantially aligned with each other in a cross-sectional observation of the light-emitting element.

9. The display device according to claim 8, further comprising an insulator between the light-emitting element and an adjacent light-emitting element,
wherein the insulator comprises at least one of an inorganic material and an organic material.

* * * * *